(12) United States Patent
Ninomiya et al.

(10) Patent No.: US 9,223,809 B2
(45) Date of Patent: Dec. 29, 2015

(54) CODE PROCESSING TECHNIQUE

(71) Applicant: FUJITSU LIMITED, Kawasaki-shi, Kanagawa (JP)

(72) Inventors: Daisuke Ninomiya, Kobe (JP); Masahiro Higuchi, Akashi (JP); Yutaka Koyama, Akashi (JP); Masaki Nishigaki, Kobe (JP); Ryo Matsumura, Numazu (JP); Toshirou Ono, Nishinomiya (JP); Takaki Ozawa, Numazu (JP); Junji Kawai, Kakogawa (JP)

(73) Assignee: FUJITSU LIMITED, Kawasaki-shi (JP)

( * ) Notice: Subject to any disclaimer, the term of this patent is extended or adjusted under 35 U.S.C. 154(b) by 235 days.

(21) Appl. No.: 13/899,878

(22) Filed: May 22, 2013

(65) Prior Publication Data

US 2014/0006457 A1 Jan. 2, 2014

(30) Foreign Application Priority Data

Jun. 28, 2012 (JP) .................................. 2012-145224

(51) Int. Cl.
*G06F 17/30* (2006.01)
*H03M 7/40* (2006.01)

(52) U.S. Cl.
CPC ....... *G06F 17/30292* (2013.01); *H03M 7/4031* (2013.01)

(58) Field of Classification Search
None
See application file for complete search history.

(56) References Cited

U.S. PATENT DOCUMENTS

| 5,254,990 A | * | 10/1993 | Yoshida et al. | ................. 341/51 |
| 5,748,953 A | * | 5/1998 | Mizutani et al. | |
| 7,330,854 B2 | * | 2/2008 | Heuer et al. | |
| 2007/0096953 A1 | * | 5/2007 | Odagiri | ........................... 341/50 |
| 2011/0205091 A1 | * | 8/2011 | Sasaki | ............................. 341/51 |

FOREIGN PATENT DOCUMENTS

| JP | H03-262331 A | 11/1991 |
| JP | 2006-515450 | 5/2006 |
| JP | 2011-221845 | 11/2011 |

OTHER PUBLICATIONS

Extended European Search Report issued Dec. 4, 2014 in Patent Application No. 13171211.9.
Gergely Korodi, et al., "Lossless Data Compression Using Optimal Tree Machines", Proceedings of the Data Compression Conference (DCC'05), IEEE, Computer Society, (Mar. 29, 2005), XP 010782786, pp. 348-357.
Japanese Office Action issued Oct. 6, 2015 in JP2012-145224 (English translation provided).
Office Action issued in EP13171211.9 on Oct. 27, 2015.

(Continued)

*Primary Examiner* — Son T Hoang
(74) *Attorney, Agent, or Firm* — Oblon, McClelland, Maier & Neustadt, L.L.P.

(57) ABSTRACT

A disclosed data structure of a phrase tree includes, as data of each node in the phrase tree, a data block including a first area for holding a code for a character or a character string, a second area for holding, for each character that will be used, an appearance sequential number of a second character that appears next to the character or the character string, and a third area for holding, according to the appearance sequential number, a number of appearances or a code corresponding to a character string comprising the character or the character string and the second character when the number of appearances exceeds a threshold.

13 Claims, 78 Drawing Sheets

(56) References Cited

OTHER PUBLICATIONS

Extended European Search Report issued in EP 15174629.4 on Oct. 27, 2015.

Giegerich, et al.; "Efficient Implementation of Lazy Suffix Trees", Software Practice & Experience XP-001170119; vol. 33, No. 11; Sep. 1, 2003, pp. 1035-1049.

* cited by examiner

| CODE | 2 BYTES |
|---|---|
| CHARACTER | 1 BYTE |
| LAYER | 2 BYTES |
| PARENT NODE POINTER | 8 BYTES |
| CHILD NODE POINTER | 8 BYTES * 256 |
| NO. OF APPEARANCES OF CHILD NODES | 4 BYTES * 256 |

■PHRASE TREE

| | 0x | 00 | ... | 41 | 42 | 43 | 44 | 45 | 46 | 47 | 48 | 49 | ... | FF |
|---|---|---|---|---|---|---|---|---|---|---|---|---|---|---|
| ... | | | | | | | | | | | | | | |
| 0x0041 | | | | | | | | | | | | | | |
| CHARACTER APPEARANCE NO. | → | FF | ... | FF | FF | FF | FF | FF | FF | FF | FF | FF | ... | FF |
| COUNTERS/CHILD NODE NOs. | → | 0 | | 0 | 0 | 0 | 0 | 0 | 0 | 0 | 0 | 0 | | 0 |
| SPANNED NO. | → | FFFF | | | | | | | | | | | | |
| NO. OF APPEARANCES OF CHARACTERS | → | 0 | | | | | | | | | | | | |
| 0x0042 | | | | | | | | | | | | | | |
| CHARACTER APPEARANCE NO. | → | FF | ... | FF | FF | FF | FF | FF | FF | FF | FF | FF | ... | FF |
| COUNTERS/CHILD NODE NOs. | → | 0 | | 0 | 0 | 0 | 0 | 0 | 0 | 0 | 0 | 0 | | 0 |
| SPANNED NO. | → | FFFF | | | | | | | | | | | | |
| NO. OF APPEARANCES OF CHARACTERS | → | 0 | | | | | | | | | | | | |
| 0x0043 | | | | | | | | | | | | | | |
| CHARACTER APPEARANCE NO. | → | FF | ... | FF | FF | FF | FF | FF | FF | FF | FF | FF | ... | FF |
| COUNTERS/CHILD NODE NOs. | → | 0 | | 0 | 0 | 0 | 0 | 0 | 0 | 0 | 0 | 0 | | 0 |
| SPANNED NO. | → | FFFF | | | | | | | | | | | | |
| NO. OF APPEARANCES OF CHARACTERS | → | 0 | | | | | | | | | | | | |
| ... | | | | | | | | | | | | | | |

| | | 41 | 42 | 43 | 44 | 45 | 46 | 47 | 48 | 49 | ... | FF |
|---|---|---|---|---|---|---|---|---|---|---|---|---|
| 0x0045 | 00 ... FF | FF | FF | 0 | FF | FF | FF | FF | FF | 41 | ... | FF |
| CHARACTER APPEARANCE NO. | ... 1 | 0 | | | | | | | | 0 | ... | 0 |
| COUNTERS/CHILD NODE NOs. | | | | | | | | | | | | |
| SPANNED NO. | FFFF | | | | | | | | | | | |
| NO. OF APPEARANCES OF CHARACTERS | 1 | | | | | | | | | | | |

| | | 41 | 42 | 43 | 44 | 45 | 46 | 47 | 48 | 49 | ... | FF |
|---|---|---|---|---|---|---|---|---|---|---|---|---|
| 0x0046 | 00 ... FF | FF | FF | 0 | FF | FF | FF | FF | FF | 41 | ... | FF |
| CHARACTER APPEARANCE NO. | ... 1 | 0 | | | | | | | | 0 | ... | 0 |
| COUNTERS/CHILD NODE NOs. | | | | | | | | | | | | |
| SPANNED NO. | FFFF | | | | | | | | | | | |
| NO. OF APPEARANCES OF CHARACTERS | 1 | | | | | | | | | | | |

| | | 41 | 42 | 43 | 44 | 45 | 46 | 47 | 48 | 49 | ... | FF |
|---|---|---|---|---|---|---|---|---|---|---|---|---|
| 0x0047 | 00 ... FF | FF | FF | 0 | FF | FF | FF | FF | FF | 41 | ... | FF |
| CHARACTER APPEARANCE NO. | ... 1 | 0 | | | | | | | | 0 | ... | 0 |
| COUNTERS/CHILD NODE NOs. | | | | | | | | | | | | |
| SPANNED NO. | FFFF | | | | | | | | | | | |
| NO. OF APPEARANCES OF CHARACTERS | 1 | | | | | | | | | | | |

| | | 41 | 42 | 43 | 44 | 45 | 46 | 47 | 48 | 49 | ... | FF |
|---|---|---|---|---|---|---|---|---|---|---|---|---|
| 0x0048 | 00 ... FF | FF | FF | 0 | FF | FF | FF | FF | FF | 41 | ... | FF |
| CHARACTER APPEARANCE NO. | ... 1 | 0 | | | | | | | | 0 | ... | 0 |
| COUNTERS/CHILD NODE NOs. | | | | | | | | | | | | |
| SPANNED NO. | FFFF | | | | | | | | | | | |
| NO. OF APPEARANCES OF CHARACTERS | 1 | | | | | | | | | | | |

| 0x0106 | | |
|---|---|---|
| CHARACTER APPEARANCE NO. | | |
| COUNTERS/CHILD NODE NOs. | | |
| SPANNED NO. | | |
| NO. OF APPEARANCES OF CHARACTERS | | |

| | 00 | ... | 41 | 42 | 43 | 44 | 45 | 46 | 47 | 48 | 49 | ... | FF |
|---|---|---|---|---|---|---|---|---|---|---|---|---|---|
| | FF | ... | FF | FF | 0 | FF | FF | FF | FF | FF | FF | ... | FF |
| | | | 0 | 0 | | 0 | 0 | 0 | 0 | 0 | 0 | | 0 |
| FFFF | | | | | | | | | | | | | |
| 1 | | | | | | | | | | | | | |

| 0x0107 | | |
|---|---|---|
| CHARACTER APPEARANCE NO. | | |
| COUNTERS/CHILD NODE NOs. | | |
| SPANNED NO. | | |
| NO. OF APPEARANCES OF CHARACTERS | | |

| | 00 | ... | 41 | 42 | 43 | 44 | 45 | 46 | 47 | 48 | 49 | ... | FF |
|---|---|---|---|---|---|---|---|---|---|---|---|---|---|
| | FF | ... | FF | FF | 0 | FF | FF | FF | FF | FF | FF | ... | FF |
| | | | 0 | 0 | | 0 | 0 | 0 | 0 | 0 | 0 | | 0 |
| FFFF | | | | | | | | | | | | | |
| 1 | | | | | | | | | | | | | |

| 0x0108 | | |
|---|---|---|
| CHARACTER APPEARANCE NO. | | |
| COUNTERS/CHILD NODE NOs. | | |
| SPANNED NO. | | |
| NO. OF APPEARANCES OF CHARACTERS | | |

| | 00 | ... | 41 | 42 | 43 | 44 | 45 | 46 | 47 | 48 | 49 | ... | FF |
|---|---|---|---|---|---|---|---|---|---|---|---|---|---|
| | FF | ... | FF | FF | 0 | FF | FF | FF | FF | FF | FF | ... | FF |
| | | | 0 | 0 | | 0 | 0 | 0 | 0 | 0 | 0 | | 0 |
| FFFF | | | | | | | | | | | | | |
| 1 | | | | | | | | | | | | | |

| 0x0109 | | |
|---|---|---|
| CHARACTER APPEARANCE NO. | | |
| COUNTERS/CHILD NODE NOs. | | |
| SPANNED NO. | | |
| NO. OF APPEARANCES OF CHARACTERS | | |

| | 00 | ... | 41 | 42 | 43 | 44 | 45 | 46 | 47 | 48 | 49 | ... | FF |
|---|---|---|---|---|---|---|---|---|---|---|---|---|---|
| | FF | ... | FF | FF | 0 | FF | FF | FF | FF | FF | FF | ... | FF |
| | | | 0 | 0 | | 0 | 0 | 0 | 0 | 0 | 0 | | 0 |
| FFFF | | | | | | | | | | | | | |
| 1 | | | | | | | | | | | | | |

| | 00 | ... | 41 | 42 | 43 | 44 | 45 | 46 | 47 | 48 | 49 | ... | FF |
|---|---|---|---|---|---|---|---|---|---|---|---|---|---|
| ← CHARACTER APPEARANCE NO. | FF | ... | FF | FF | 0 | FF | FF | FF | FF | FF | FF | ... | FF |
| ← COUNTERS/CHILD NODE NOs. | | | | | | | | | | | | | |

0x0049

| | | |
|---|---|---|
| | 1 | 0 |
| ← SPANNED NO. | FFFF | |
| ← NO. OF APPEARANCES OF CHARACTERS | 1 | |

...

| | 00 | ... | 41 | 42 | 43 | 44 | 45 | 46 | 47 | 48 | 49 | ... | FF |
|---|---|---|---|---|---|---|---|---|---|---|---|---|---|
| ← CHARACTER APPEARANCE NO. | FF | ... | FF | FF | 0 | FF | FF | FF | FF | FF | FF | ... | FF |
| ← COUNTERS/CHILD NODE NOs. | | | | | | | | | | | | | |

0x0100

| 0x0101 | 0 |
|---|---|
| ← SPANNED NO. FFFF | |
| ← NO. OF APPEARANCES OF CHARACTERS 1 | |

| | 00 | ... | 41 | 42 | 43 | 44 | 45 | 46 | 47 | 48 | 49 | ... | FF |
|---|---|---|---|---|---|---|---|---|---|---|---|---|---|
| ← CHARACTER APPEARANCE NO. | FF | ... | 0 | FF | 1 | FF | FF | FF | FF | FF | FF | ... | FF |
| ← COUNTERS/CHILD NODE NOs. | | | 1 | 1 | 0 | 0 | 0 | 0 | 0 | 0 | 0 | | 0 |

0x0101

| ← SPANNED NO. | FFFF |
|---|---|
| ← NO. OF APPEARANCES OF CHARACTERS | 2 |

| 0x0106 | | | | | | | | | | | | | | |
|---|---|---|---|---|---|---|---|---|---|---|---|---|---|---|
| CHARACTER APPEARANCE NO. | 00 | ... | 41 | 42 | 43 | 44 | 45 | 46 | 47 | 48 | 49 | 41 | ... | FF |
| COUNTERS/CHILD NODE NOs. | FF | ... | FF | FF | 0 | FF | FF | FF | FF | FF | FF | FF | ... | FF |
| SPANNED NO. | 1 | | 0 | 0 | 0 | 0 | 0 | 0 | 0 | 0 | 0 | 0 | | 0 |
| NO. OF APPEARANCES OF CHARACTERS | FFFF 1 | | | | | | | | | | | | | |

| 0x0107 | | | | | | | | | | | | | | |
|---|---|---|---|---|---|---|---|---|---|---|---|---|---|---|
| CHARACTER APPEARANCE NO. | 00 | ... | 41 | 42 | 43 | 44 | 45 | 46 | 47 | 48 | 49 | 41 | ... | FF |
| COUNTERS/CHILD NODE NOs. | FF | ... | FF | FF | 0 | FF | FF | FF | FF | FF | FF | FF | ... | FF |
| SPANNED NO. | 1 | | 0 | 0 | 0 | 0 | 0 | 0 | 0 | 0 | 0 | 0 | | 0 |
| NO. OF APPEARANCES OF CHARACTERS | FFFF 1 | | | | | | | | | | | | | |

| 0x0108 | | | | | | | | | | | | | | |
|---|---|---|---|---|---|---|---|---|---|---|---|---|---|---|
| CHARACTER APPEARANCE NO. | 00 | ... | 41 | 42 | 43 | 44 | 45 | 46 | 47 | 48 | 49 | 41 | ... | FF |
| COUNTERS/CHILD NODE NOs. | FF | ... | FF | FF | 0 | FF | FF | FF | FF | FF | FF | FF | ... | FF |
| SPANNED NO. | 1 | | 0 | 0 | 0 | 0 | 0 | 0 | 0 | 0 | 0 | 0 | | 0 |
| NO. OF APPEARANCES OF CHARACTERS | FFFF 1 | | | | | | | | | | | | | |

| 0x0109 | | | | | | | | | | | | | | |
|---|---|---|---|---|---|---|---|---|---|---|---|---|---|---|
| CHARACTER APPEARANCE NO. | 00 | ... | 41 | 42 | 43 | 44 | 45 | 46 | 47 | 48 | 49 | 41 | ... | FF |
| COUNTERS/CHILD NODE NOs. | FF | ... | FF | FF | 0 | FF | FF | FF | FF | FF | FF | FF | ... | FF |
| SPANNED NO. | 1 | | 0 | 0 | 0 | 0 | 0 | 0 | 0 | 0 | 0 | 0 | | 0 |
| NO. OF APPEARANCES OF CHARACTERS | FFFF 1 | | | | | | | | | | | | | |

| CODE | PARENT NODE CODE | CHARACTER |
|---|---|---|
| 0x0000 | root | 0x00 |
| ⋮ | ⋮ | ⋮ |
| 0x00FF | root | 0xFF |

FIG.32

| NEW | 0x0000 | ... | 0x0041 | 0x0042 | ... | 0x00FF |
|---|---|---|---|---|---|---|
| PRESENT | 0x0000 | ... | 0x0041 | 0x0042 | ... | 0x00FF |

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |

FIG.35

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |
| 0x0102 | 0x0042 | 0x43 |

FIG.41

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |
| 0x0102 | 0x0042 | 0x43 |
| 0x0103 | 0x0043 | 0x42 |

FIG.44

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |
| 0x0102 | 0x0042 | 0x43 |
| 0x0103 | 0x0043 | 0x42 |
| 0x0104 | 0x0100 | 0x43 |

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |
| 0x0102 | 0x0042 | 0x43 |
| 0x0103 | 0x0043 | 0x42 |
| 0x0104 | 0x0100 | 0x43 |
| 0x0105 | 0x0103 | 0x41 |

FIG.48

| CODE | PARENT NODE CODE | CHARACTER |
|---|---|---|
| 0x0000 | root | 0x00 |
| ⋮ | ⋮ | ⋮ |
| 0x00FF | root | 0xFF |
| 0x0100 | 0x0041 | 0x41 |
| 0x0101 | 0x0041 | 0x42 |
| 0x0102 | 0x0042 | 0x43 |
| 0x0103 | 0x0043 | 0x42 |
| 0x0104 | 0x0100 | 0x43 |
| 0x0105 | 0x0103 | 0x41 |
| 0x0106 | 0x0103 | 0x42 |
| 0x0107 | 0x0103 | 0x43 |
| 0x0108 | 0x0103 | 0x44 |
| 0x0109 | 0x0103 | 0x45 |
| 0x010A | 0x0103 | 0x46 |
| 0x010B | 0x0103 | 0x47 |
| 0x010C | 0x0103 | 0x48 |
| 0x010D | 0x0103 | 0x49 |

FIG.50

| CODE | PARENT NODE CODE | CHARACTER | CHARACTER STRING |
|---|---|---|---|
| 0x0000 | root | 0x00 | 0x00 |
| ⋮ | ⋮ | ⋮ | ⋮ |
| 0x0041 | root | 0x41 | 'A' |
| 0x0042 | root | 0x42 | 'B' |
| 0x0043 | root | 0x43 | 'C' |
| ⋮ | ⋮ | ⋮ | ⋮ |
| 0x00FF | root | 0xFF | 0xFF |
| 0x0100 | 0x0041 | 0x41 | 'AA' |
| 0x0101 | 0x0041 | 0x42 | 'AB' |
| 0x0102 | 0x0042 | 0x43 | 'BC' |
| 0x0103 | 0x0043 | 0x42 | 'CB' |
| 0x0104 | 0x0101 | 0x43 | 'ABC' |
| 0x0105 | 0x0103 | 0x41 | 'CBA' |
| 0x0106 | 0x0103 | 0x42 | 'CBB' |
| 0x0107 | 0x0103 | 0x43 | 'CBC' |
|  | 2 BYTES | 1 BYTE |  |

☐ COMPRESSION MAP

FIG.54

| No. | CURRENT NODE | COMPRESSION RESULT |
|---|---|---|
| 1 | 0x0041 |  |
| 2 | 0x0101 |  |
| 3 | 0x0104 |  |
| 4 | 0x0041 | 0x0104 |
| 5 | 0x0100 | 0x0104 |
| 6 | – | 0x0104 0100 |

FIG.55

| No. | CURRENT NODE | WORK AREA DATA | DECOMPRESSION RESULT |
|---|---|---|---|
| 1 | 0x0104<br>0x0101 | "C" | |
| 2 | 0x0041 | "CB" | |
| 3 | | "CBA" ⇒ | "ABC" |
| 4 | 0x0100<br>0x0041 | "A" | |
| 5 | | "AA" ⇒ | "ABCAA" |

| | 0x | 00 | ... | 41 | 42 | 43 | 44 | 45 | 46 | 47 | 48 | 49 | ... | FF |
|---|---|---|---|---|---|---|---|---|---|---|---|---|---|---|
| 0x0041(2 BYTES) | | | | | | | | | | | | | | |
| CHARACTER APPEARANCE NO. (1 * 256) → | | FF | ... | 1 | 0 | 2 | FF | FF | FF | FF | FF | FF | ... | FF |
| COUNTERS/CHILD NODE NOs. (2 * 8) → | | | | 0x0100 | | 0x0104 | 1 | 0 | 0 | 0 | 0 | 0 | ... | 0 |
| SPANNED NO. (2) → | | | | FFFF | | | | | | | | | | |
| NO. OF APPEARANCES OF CHARACTERS (1) → | | 3 | | | | | | | | | | | | |

FIG.59

| | 0x | 00 | ... | 41 | 42 | 43 | 44 | 45 | 46 | 47 | 48 | 49 | ... | FF |
|---|---|---|---|---|---|---|---|---|---|---|---|---|---|---|
| 0x0100 | | | | | | | | | | | | | | |
| CHARACTER APPEARANCE NO. → | | FF | ... | FF | FF | 0 | FF | FF | FF | FF | FF | FF | ... | FF |
| COUNTERS/CHILD NODE NOs. → | | | | | | 0x0101 | 0 | 0 | 0 | 0 | 0 | 0 | ... | 0 |
| SPANNED NO. → | | | | | | FFFF | | | | | | | | |
| NO. OF APPEARANCES OF CHARACTERS → | | 1 | | | | | | | | | | | | |

| | | | |
|---|---|---|---|
| ← | ← | ← | ← |
| CHARACTER APPEARANCE NO. | COUNTERS/CHILD NODE NOs. | SPANNED NO. | NO. OF APPEARANCES OF CHARACTERS |

Array (columns 00, ..., 41, 42, 43, 44, 45, 46, 47, 48, 49, ..., FF):
- Row 1 (CHARACTER APPEARANCE NO.): FF, ..., FF, FF, 0, FF, FF, FF, FF, FF, FF, ..., FF
- Row 2 (COUNTERS/CHILD NODE NOs.): 0, ..., 0, 0, 0x0101, 0, 0, 0, 0, 0, 0, ..., 0
- SPANNED NO.: FFFF
- NO. OF APPEARANCES OF CHARACTERS: 1

0x0041 (2 BYTES)

| | | | |
|---|---|---|---|
| ← | ← | ← | ← |
| CHARACTER APPEARANCE NO. (1 * 256) | COUNTERS/CHILD NODE NOs. (2 * 8) | SPANNED NO. (2) | NO. OF APPEARANCES OF CHARACTERS (1) |

Array (columns 0x, 00, ..., 41, 42, 43, 44, 45, 46, 47, 48, 49, ..., FF):
- Row 1: FF, ..., 1, 0, 2, 1, FF, FF, FF, FF, FF, ..., FF
- Row 2: 0, ..., 0x0100, 0x0104, 0, 0, 0, 0, 0, 0, ..., 0
- SPANNED NO.: FFFF
- NO. OF APPEARANCES OF CHARACTERS: 3

| | PARENT NODE CODE | CHARACTER | MAXIMUM CODE OF CHILD NODES |
|---|---|---|---|
| | ⋮ | ⋮ | ⋮ |
| 0x0100 | 0x0041 | 0x41 | 0x0103 |
| 0x0101 | 0x0041 | 0x42 | 0x0104 |
| 0x0102 | 0x0042 | 0x43 | 0x0104 |
| | ⋮ | ⋮ | ⋮ |

| COMPRESSION CODE | PARENT NODE CODE | CHARACTER | MAXIMUM CHILD NODE CODE | CHARACTER STRING |
|---|---|---|---|---|
| 0x0000 | root | 0x00 | 0x00FF | 0x00 |
| ⋮ | ⋮ | ⋮ | ⋮ | ⋮ |
| 0x0041 | root | 0x41 | 0x0101 | 'A' |
| 0x0042 | root | 0x42 | 0x0102 | 'B' |
| 0x0043 | root | 0x43 | 0x0103 | 'C' |
| ⋮ | ⋮ | ⋮ | ⋮ | ⋮ |
| 0x00FF | root | 0xFF | 0x0103 | 0xFF |
| 0x0100 | 0x0041 | 0x41 | 0x0103 | 'AA' |
| 0x0101 | 0x0041 | 0x42 | 0x0104 | 'AB' |
| 0x0102 | 0x0042 | 0x43 | 0x0104 | 'BC' |
| 0x0103 | 0x0043 | 0x42 | 0x0107 | 'CB' |
| 0x0104 | 0x0101 | 0x43 | 0x0107 | 'ABC' |
| 0x0105 | 0x0103 | 0x41 | 0x0107 | 'CBA' |
| 0x0106 | 0x0103 | 0x42 | 0x0107 | 'CBB' |
| 0x0107 | 0x0103 | 0x43 | 0x0107 | 'CBC' |
|  | 2 BYTES | 1 BYTE | 2 BYTES |  |

FIG.71

| COMPRESSION CODE | PARENT NODE CODE | CHARACTER | LAYER NO. | CHARACTER STRING |
|---|---|---|---|---|
| 0x0000 | root | 0x00 | 1 | 0x00 |
| ⋮ | ⋮ | ⋮ | ⋮ | ⋮ |
| 0x0041 | root | 0x41 | 1 | 'A' |
| 0x0042 | root | 0x42 | 1 | 'B' |
| 0x0043 | root | 0x43 | 1 | 'C' |
| ⋮ | ⋮ | ⋮ | ⋮ | ⋮ |
| 0x00FF | root | 0xFF | 1 | 0xFF |
| 0x0100 | 0x0041 | 0x41 | 2 | 'AA' |
| 0x0101 | 0x0041 | 0x42 | 2 | 'AB' |
| 0x0102 | 0x0042 | 0x43 | 2 | 'BC' |
| 0x0103 | 0x0043 | 0x42 | 2 | 'CB' |
| 0x0104 | 0x0101 | 0x43 | 3 | 'ABC' |
| 0x0105 | 0x0103 | 0x41 | 3 | 'CBA' |
| 0x0106 | 0x0103 | 0x42 | 3 | 'CBB' |
| 0x0107 | 0x0103 | 0x43 | 3 | 'CBC' |
|  | (2 BYTES) | (1 BYTE) | (2 BYTES) |  |

FIG.72

|  | NO. OF NODES WITHIN LAYER | START CODE WITHIN LAYER | OFFSET OF TOP DECOMPRESSED CHARACTER STRING WITHIN LAYER |
|---|---|---|---|
| 1st LAYER | 256 | 0x0000 | 0 |
| 2nd LAYER | 4 | 0x0100 | 256 |
| 3rd LAYER | 4 | 0x0104 | 264 |
|  | (1 BYTE) | (2 BYTES) | (4 BYTES) |

| No. | CURRENT NODE | DECOMPRESSION RESULT |
|---|---|---|
| 1 | 0x0104 | "ABC" |
| 2 | 0x0100 | "ABCAA" |

FIG.80

| CODE | CHARACTER | MAXIMUM CHILD NODE CODE | LAYER NO. | CHARACTER STRING |
|---|---|---|---|---|
| 0x0000 | 0x00 | 0x00FF | 1 | 0x00 |
| ⋮ | ⋮ | ⋮ | ⋮ | ⋮ |
| 0x0041 | 0x41 | 0x0101 | 1 | 'A' |
| 0x0042 | 0x42 | 0x0102 | 1 | 'B' |
| 0x0043 | 0x43 | 0x0103 | 1 | 'C' |
| ⋮ | ⋮ | ⋮ | ⋮ | ⋮ |
| 0x00FF | 0xFF | 0x0103 | 1 | 0xFF |
| 0x0100 | 0x41 | 0x0103 | 2 | 'AA' |
| 0x0101 | 0x42 | 0x0104 | 2 | 'AB' |
| 0x0102 | 0x43 | 0x0104 | 2 | 'BC' |
| 0x0103 | 0x42 | 0x0107 | 2 | 'CB' |
| 0x0104 | 0x43 | 0x0107 | 3 | 'ABC' |
| 0x0105 | 0x41 | 0x0107 | 3 | 'CBA' |
| 0x0106 | 0x42 | 0x0107 | 3 | 'CBB' |
| 0x0107 | 0x43 | 0x0107 | 3 | 'CBC' |
|  | (1 BYTE) | (2 BYTES) | (2 BYTES) |  |

FIG.81

|  | NO. OF NODES WITHIN LAYER | START CODE WITHIN LAYER | OFFSET OF TOP DECOMPRESSED CHARACTER STRING WITHIN LAYER |
|---|---|---|---|
| 1st LAYER | 256 | 0x0000 | 0 |
| 2nd LAYER | 4 | 0x0100 | 0 |
| 3rd LAYER | 4 | 0x0104 | 8 |
|  | (1 BYTE) | (2 BYTES) | (4 BYTES) |

FIG.82

| 1st LAYER | 00 | 01 | ... | 'A' | 'B' | 'C' | ... | FF |
|---|---|---|---|---|---|---|---|---|
| 2nd LAYER | 'AA' | | 'AB' | | 'BC' | | 'CB' | |
| 3rd LAYER | 'ABC' | | 'CBA' | | | 'CBB' | | |
| | 'CBC' | | | | | | | |

FIG.83

CODE PROCESSING TECHNIQUE

CROSS-REFERENCE TO RELATED APPLICATIONS

This application is based upon and claims the benefit of priority of the prior Japanese Patent Application No. 2012-145224, filed on Jun. 28, 2012, the entire contents of which are incorporated herein by reference.

FIELD

This technique relates to an encoding technique.

BACKGROUND

In a conventional technique, a phrase tree is generated in order to compress an input character string. Each node in a phrase tree includes a code to be replaced with a character or character string, characters to be compressed, data representing the hierarchy level, a pointer to a parent node, pointers that point to each of child nodes, which corresponds to each character that may be used, and a counter that counts the number of times that a character corresponding to each of the child nodes appears. For example, when an input character string "ABABCABCABCCBCBCBCAAACBAC-BACBBCCBB" is inputted, a phrase tree such as illustrated in FIG. 1 is generated. The threshold value for the number of appearances in order to generate a new node is "2". In this example, a root node is provided as the 0-th level node, and nodes for characters "0x00" to "0xFF" are provided as 1st level nodes. As 2nd level nodes, nodes for characters "0x42" and "0x41" are provided as child nodes of character "0x41", a node for character "0x43" is provided as a child node of character "0x42", a node for character "0x42" is provided as a child node of character "0x43". Furthermore, as 3rd level nodes, a node for character "0x43" is provided as a child node of character "0x42", and nodes for characters "0x43", "0x41" and "0x42" are provided as child nodes of character "0x42". For each node, a code (A), a character (B), the numbers of appearances (C) for characters of child nodes, and pointers (D) that point to child nodes are illustrated schematically.

As illustrated in FIG. 2, because the number of child node pointers and the number of counters for the numbers of appearances of characters for child nodes are equal to 256, which is equal to the number of characters that may be used, 3,085 bytes are used as a capacity of the memory used for one node. Presuming that 65,536 nodes, which are the maximum number of nodes that can be expressed with a 2 bytes of the code length are provided, about 192 Mbytes are totally used as a capacity of memory.

The phrase tree can compress various data, when the number of types of codes (in other words, the number of nodes) used for replacing the character strings becomes greater. However, when the types of codes increase in this way, the number of nodes also increases, and thus the overall size of the phrase tree becomes large.

SUMMARY

A data structure of a phrase tree in a first mode of this technique includes, as data of each node in the phrase tree, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string comprising the character or the character string and the second character when the number of appearances exceeds a threshold.

A data structure relating to a second mode of this technique includes: first data corresponding to a phrase tree; second data for a character or a character string, which corresponds to each node in the phrase tree; and third data for layers of the phrase tree. The first data includes, for each node of the phrase tree, correlation data to correlate a code for a parent node of the node or a greatest code among codes of child nodes of the node with a code for a character, which is represented by the node, and a layer identifier of a layer to which the node belongs, wherein the correlation data is arranged in order of a code assigned to the node. The second data includes, for each node in each layer of a second layer and subsequent layers in the phrase tree, a code for a character or a character string, which corresponds to the node, in order of the code assigned to the node. The third data includes, for each layer of the second layer and the subsequent layers in the phrase tree, the number of nodes belonging to the layer, a least code among codes of nodes belonging to the layer, and an off set value of a position of a character or a character string corresponding to the least code in the second data from a beginning of the second data.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 9 is a diagram to explain the generation processing of data of the phrase tree;

FIG. 14 is a diagram to explain the generation processing of data of the phrase tree;

FIG. 16 is a diagram to explain the generation processing of data of the phrase tree;

FIG. 19 is a diagram to explain the generation processing of data of the phrase tree;

Figure 20A:
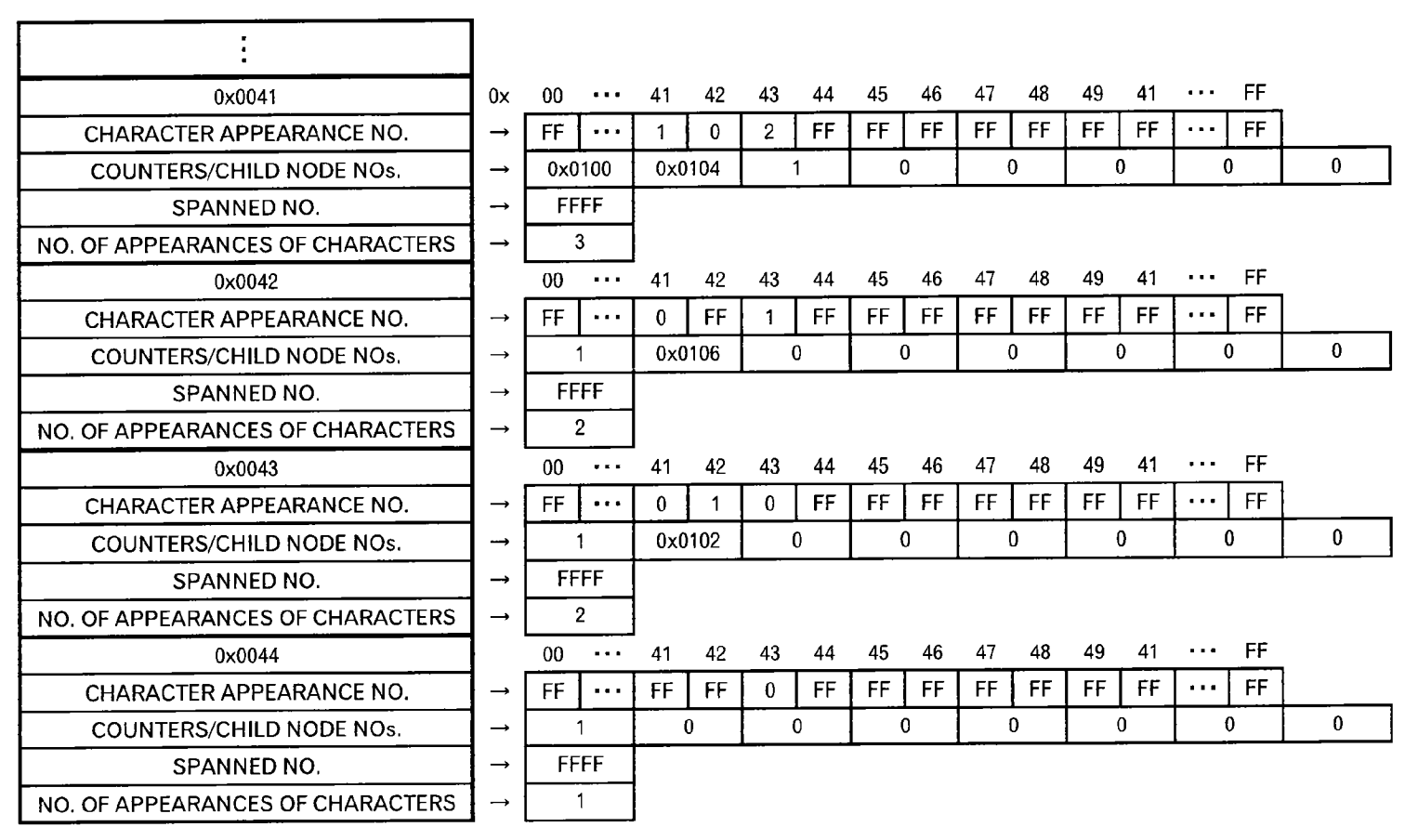
Figure 20F:
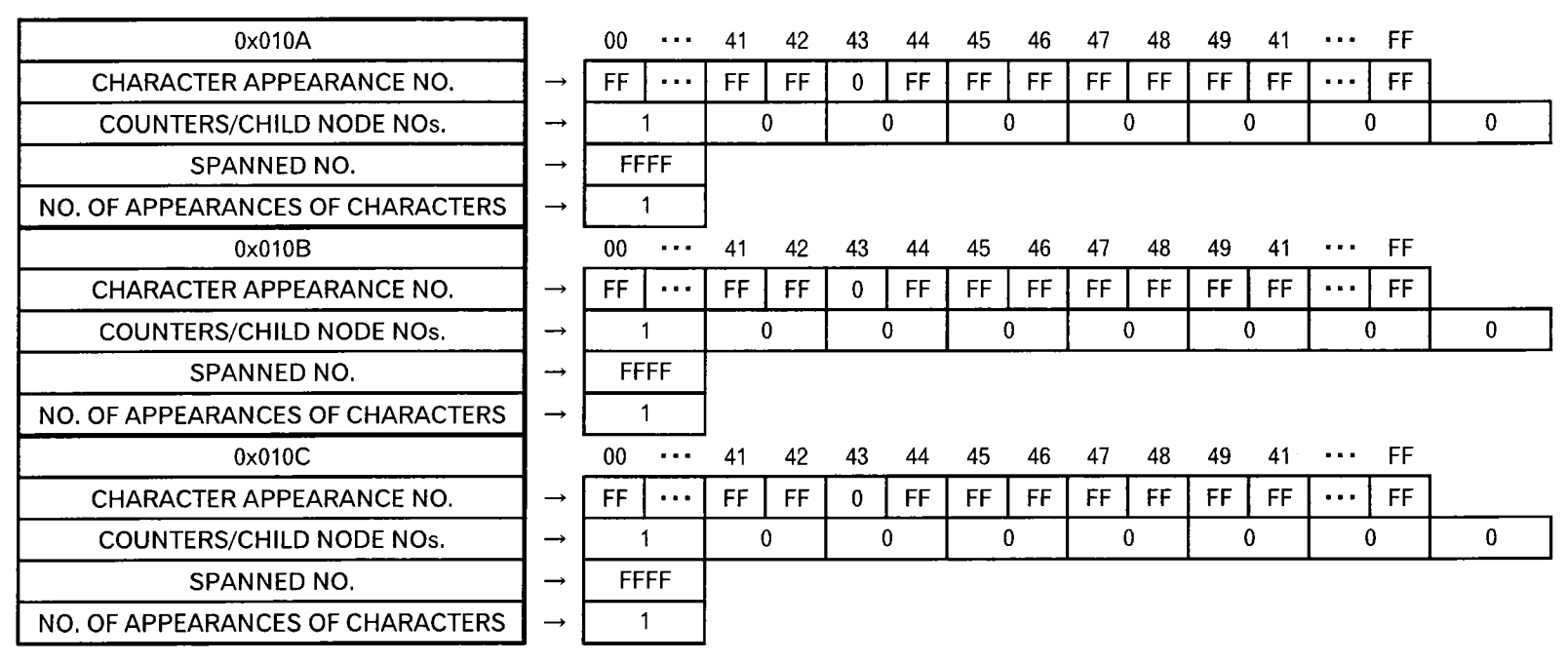

FIG. 20A is a diagram to explain the generation processing of data of the phrase tree;

FIG. 20B is a diagram to explain the generation processing of data of the phrase tree;

FIG. 20E is a diagram to explain the generation processing of data of the phrase tree;

FIG. 20F is a diagram to explain the generation processing of data of the phrase tree;

FIG. 22A is a diagram to explain the generation processing of data of the phrase tree;

FIG. 22B is a diagram to explain the generation processing of data of the phrase tree;

FIG. 23 is a diagram to explain the generation processing of data of the phrase tree;

Figure 24A:
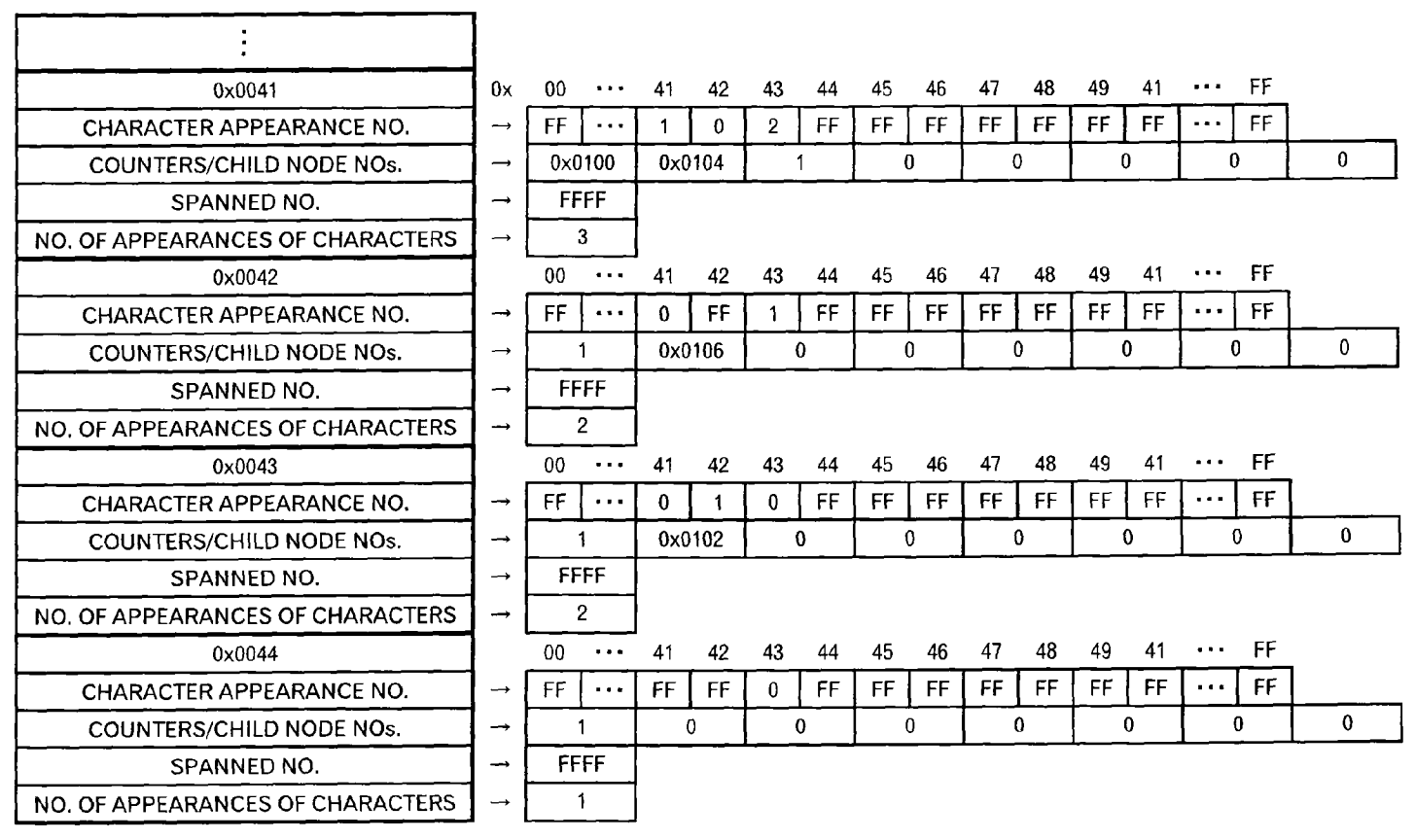
Figure 24B:
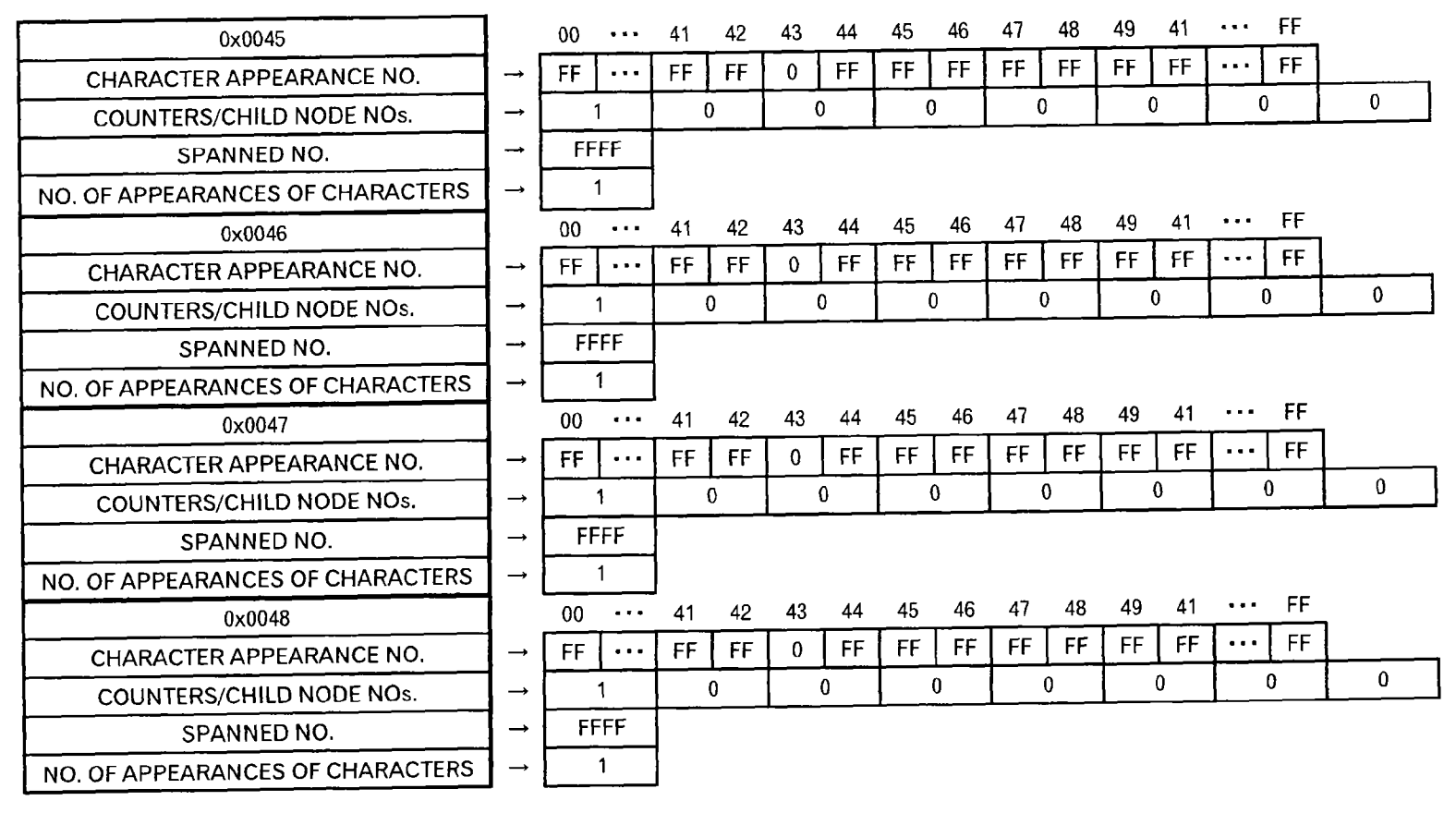
Figure 24D:
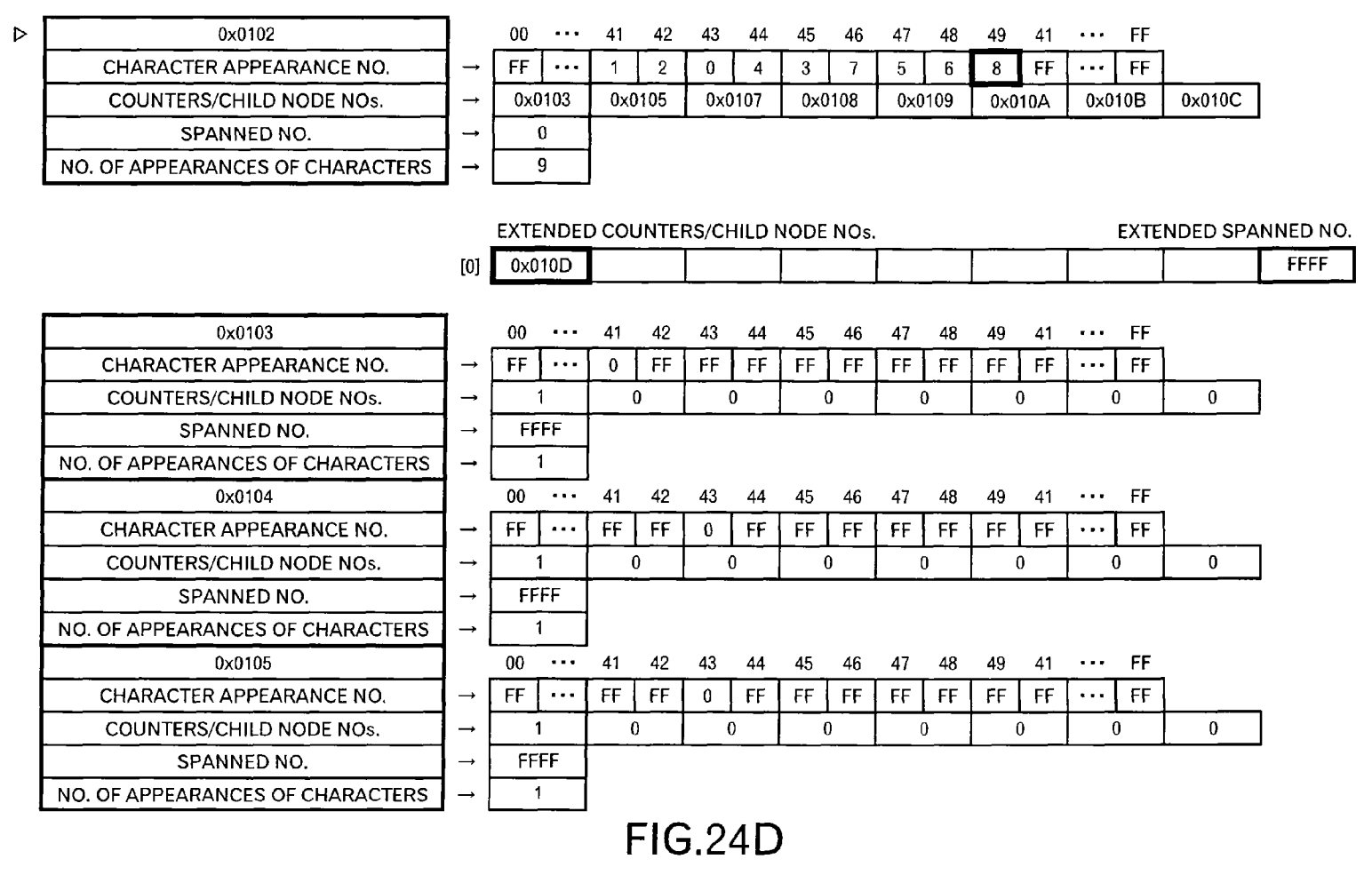

FIG. 24A is a diagram to explain the generation processing of data of the phrase tree;

FIG. 24B is a diagram to explain the generation processing of data of the phrase tree;

FIG. 24C is a diagram to explain the generation processing of data of the phrase tree;

FIG. 24D is a diagram to explain the generation processing of data of the phrase tree;

FIG. 24E is a diagram to explain the generation processing of data of the phrase tree;

FIG. 32 is a diagram to explain a compression map generation processing;

FIG. 33 is a diagram to explain the compression map generation processing;

FIG. 34 is a diagram to explain the compression map generation processing;

FIG. 35 is a diagram to explain the compression map generation processing;

FIG. 36 is a diagram to explain the compression map generation processing;

FIG. 37 is a diagram to explain the compression map generation processing;

FIG. 38 is a diagram to explain the compression map generation processing;

FIG. 39 is a diagram to explain the compression map generation processing;

FIG. 40 is a diagram to explain the compression map generation processing;

FIG. 41 is a diagram to explain the compression map generation processing;

FIG. 42 is a diagram to explain the compression map generation processing;

FIG. 43 is a diagram to explain the compression map generation processing;

FIG. 44 is a diagram to explain the compression map generation processing;

FIG. 45 is a diagram to explain the compression map generation processing;

FIG. 46 is a diagram to explain the compression map generation processing;

FIG. 48 is a diagram to explain the compression map generation processing;

FIG. 50 is a diagram to explain the compression map generation processing;

FIG. 54 is a diagram depicting an example of the compression map;

FIG. 55 is a diagram to explain the compression processing;

FIG. 57 is a diagram to explain the decompression processing;

FIG. 58 is a diagram to explain a processing when compressing using the data structure of the phrase tree;

FIG. 59 is a diagram to explain a processing when compressing using the data structure of the phrase tree;

FIG. 60 is a diagram to explain a processing when compressing using the data structure of the phrase tree;

FIG. 61 is a diagram to explain a processing when compressing using the data structure of the phrase tree;

FIG. 62 is a diagram to explain a processing when decompressing using the data structure of the phrase tree;

FIG. 63 is a diagram to explain a processing when decompressing using the data structure of the phrase tree;

FIG. 71 is a diagram depicting an example of the compression map in the second embodiment;

FIG. 72 is a diagram depicting an example of the compression map in a third embodiment;

FIG. 80 is a diagram to explain the second decompression processing;

FIG. 81 is a diagram depicting an example of the compression map in a fourth embodiment;

FIG. 82 is a diagram depicting an example of layer information in the fourth embodiment;

FIG. 83 is a diagram depicting an example of a decompression map in the fourth embodiment;

DESCRIPTION OF EMBODIMENTS

Embodiment 1

Figure 3:
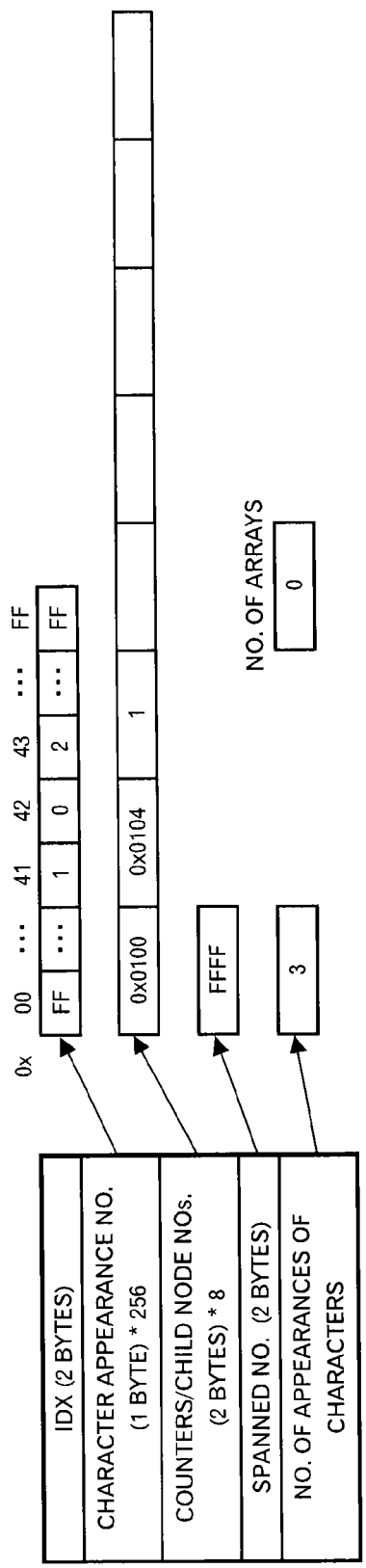
FIG. 3 is a diagram depicting a data structure for one node in the phrase tree relating to a first embodiment.

FIG. 3 illustrates a data structure for one node in a phrase tree relating to this embodiment. A data block of one node includes an area for a code (IDX), an area for an array for character appearance numbers, an area for an array for counters/child node numbers, an area for spanned numbers, and an area for the number of appearances of characters. Moreover, separate from this, there is an area for counting the number of arrays for extended counters/child node numbers.

The area for the character appearance numbers is an array that holds the appearance sequential number (ranking) of each character (each character from 0x00 to 0xFF) that appears next to the character or character string corresponding to the code of this node. However, "FF" represents an unused state except for when the number of appearances of the characters is 256. Each of other values represents an array index in the array for the counters/child node numbers. For example, focusing on the node of character "0x41 (A)", when the character string for generating the phrase tree is "ABAAC", the character that first appears after the first "A" is B (0x42) so "0" is set in the 0x42-th array area in the array for the character appearance numbers, the character that appears after the next "A" is A, so "1" is set in the 0x41-th array area in the array for the character appearance numbers, and the character that appears after the further next "A" is C, so "2" is set in the 0x43-th array area in the array for the character appearance numbers.

In the array for the counters/child node numbers, the number of appearances (counter value) or the child node number (the number with "0x" given) is stored according to the appearance sequential number (ranking). In the example described above, the child node number (code) "0x0100" for character "0x42" is stored in the 0-th array area, the child number (code) "0x0104" for character "0x41" is stored in the 1st array area, and the number of appearances "1" for character "0x043" is stored in the 2nd array area. In this embodiment, there are only eight array areas for the number of appearances or child node numbers in the area for the array for the counters/child node numbers. When the number of array areas for the number of appearances or child node numbers exceeds eight, the array number of the extended counters/child node numbers is set in the area for the spanned number. The initial value of the spanned number is "0xFFFF".

Figure 4:
FIG. 4 is a diagram depicting an example of an array for extended counters/child node numbers.

The array for the extended counters/child node numbers is provided in a common area that can be referenced from any node. As illustrated in FIG. 4, this array includes eight array areas for the number of appearances or child node numbers, and an array area is finally provided for the array number of the extended counters/child node numbers (extended spanned number), which is to be referenced, when even this array becomes insufficient.

In the area for the number of appearances of characters, the number of characters that appeared after the character or character string that corresponds to this node is set. In the example described above, the three characters "B", "A" and "C" appeared, so "3" is set.

In this way, the number of child nodes, which can be identified by default, is limited, and the area for pointers that point to child nodes that do not have to be used is reduced. Moreover, there are also no pointers that point to a parent node, so the amount of memory used is reduced.

In this embodiment, a processing for generating such a kind of phrase tree, processing for generating a compression map, which is the data structure to be stored onto a disk unit, from the phrase tree, compression processing and decompression processing using the compression map, and apparatus that performs such processing will be explained.

Figure 1:
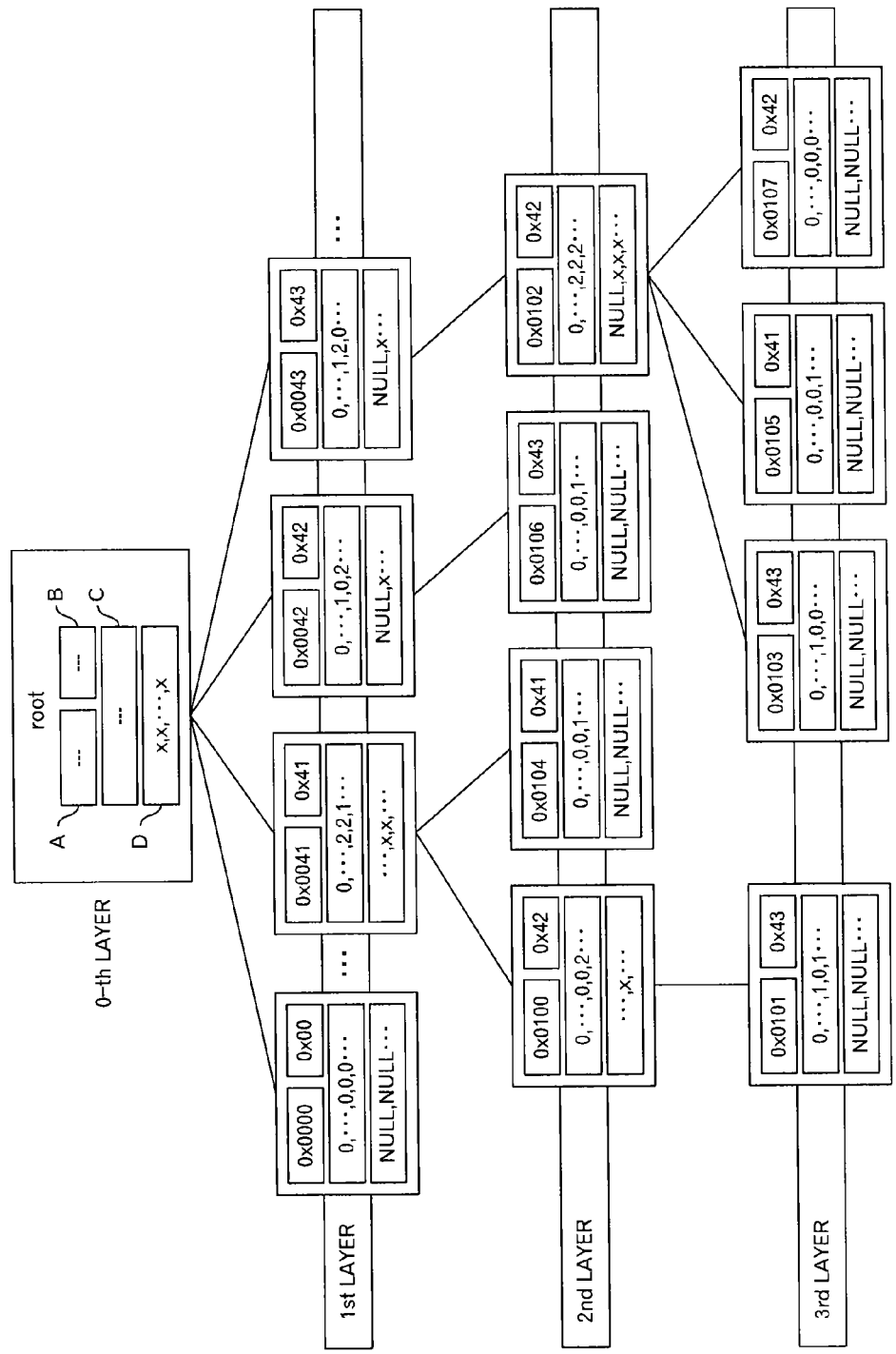
FIG. 1 is a diagram schematically depicting an example of a data structure representing a phrase tree in a conventional example.
Figures 2, 5:
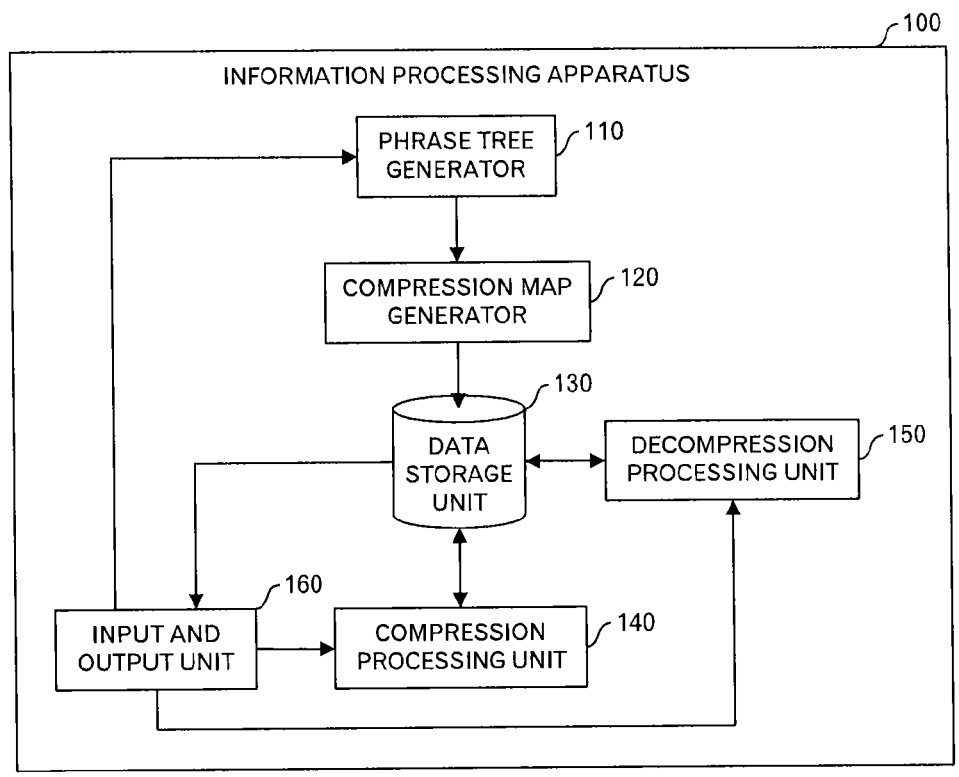
FIG. 2 is a diagram depicting an example of a used memory amount in the conventional example.
FIG. 5 is a functional block diagram of an information processing apparatus relating to the embodiments.

FIG. 5 illustrates a functional block diagram of an information processing apparatus 100 relating to this embodiment. The information processing apparatus 100 has a phrase tree generator 110, a compression map generator 120, a data storage unit 130, a compression processing unit 140, a decompression processing unit 150 and an input and output unit 160.

The phrase tree generator 110 performs a processing for an input character string to be used for the generation of the phrase tree, which was inputted, for example, from the input and output unit 160, to generate data of the phrase tree relating to this embodiment. The compression map generator 120 generates a compression map from the data of the phrase tree, which was generated by the phrase tree generator 110, and stores the generated compression map in the data storage unit 130.

The compression processing unit 140 uses the compression map that is stored in the data storage unit 130, to perform a compression processing for the input character string to be compressed, which was inputted, for example, from the input and output unit 160, and then stores the compression result in the data storage unit 130. The decompression processing unit 150 uses the compression map that is stored in the data storage unit 130, to perform a decompression processing for the compression result that is stored, for example, in the data storage unit 130, and stores the decompression result in the data storage unit 130. The input and output unit 160 may output the decompression result to an output apparatus such as a display apparatus, or to another computer or the like.

Figure 6:
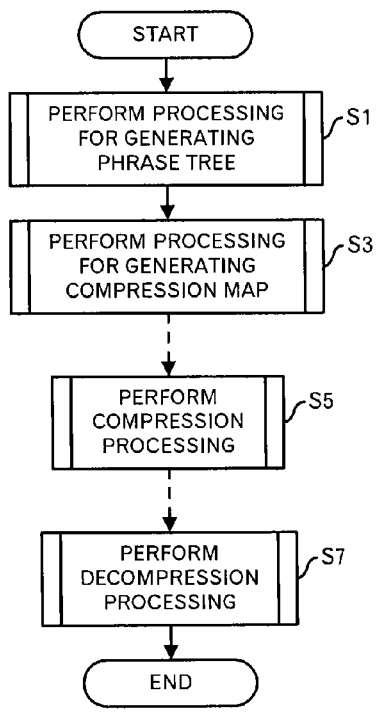
FIG. 6 is a diagram depicting a main processing flow relating to the embodiments.
Figure 66:
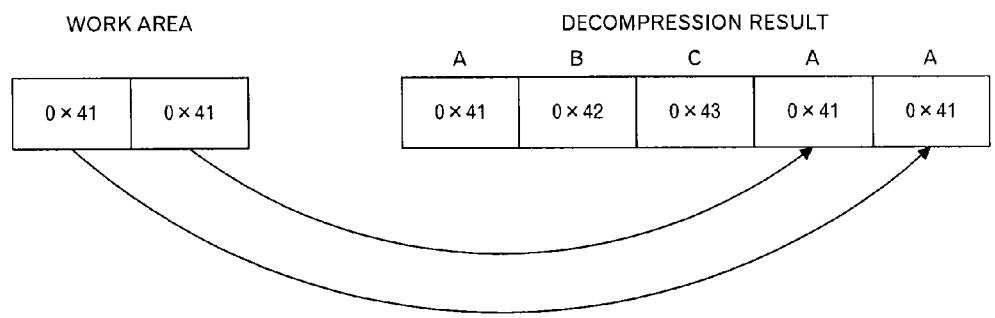
FIG. 66 is a diagram to explain a processing when decompressing using the data structure of the phrase tree.

Next, FIG. 6 to FIG. 66 will be used to explain processing contents by the information processing apparatus 100. First, the phrase tree generator 110 performs a processing for generating a phrase tree for an input character string (FIG. 6: step S1). This processing for generating a phrase tree will be explained in detail using FIG. 7 to FIG. 27. The compression map generator 120 then performs a processing for generating a compression map from the phrase tree that was generated by the phrase tree generator 110, and stores the compression map in the data storage unit 130 (step S3). The processing for generating a compression map will be explained in detail using FIG. 28 to FIG. 52.

After that, when an input character string to be compressed is inputted from, for example, the input and output unit 160, the compression processing unit 140 performs a compression processing using the compression map, and stores the compression result in the data storage unit 130 (step S5). The compression processing will be explained in detail using FIG. 53 to FIG. 55. When receiving an instruction from, for example, the input and output unit 160, the decompression processing unit 150 uses the compression map to perform a decompression processing for the compression result stored, for example, in the data storage unit 130, and stores the processing result in the data storage unit 130 (step S7). The decompression processing will be explained in detail using FIG. 56 and FIG. 57.

Figure 7:
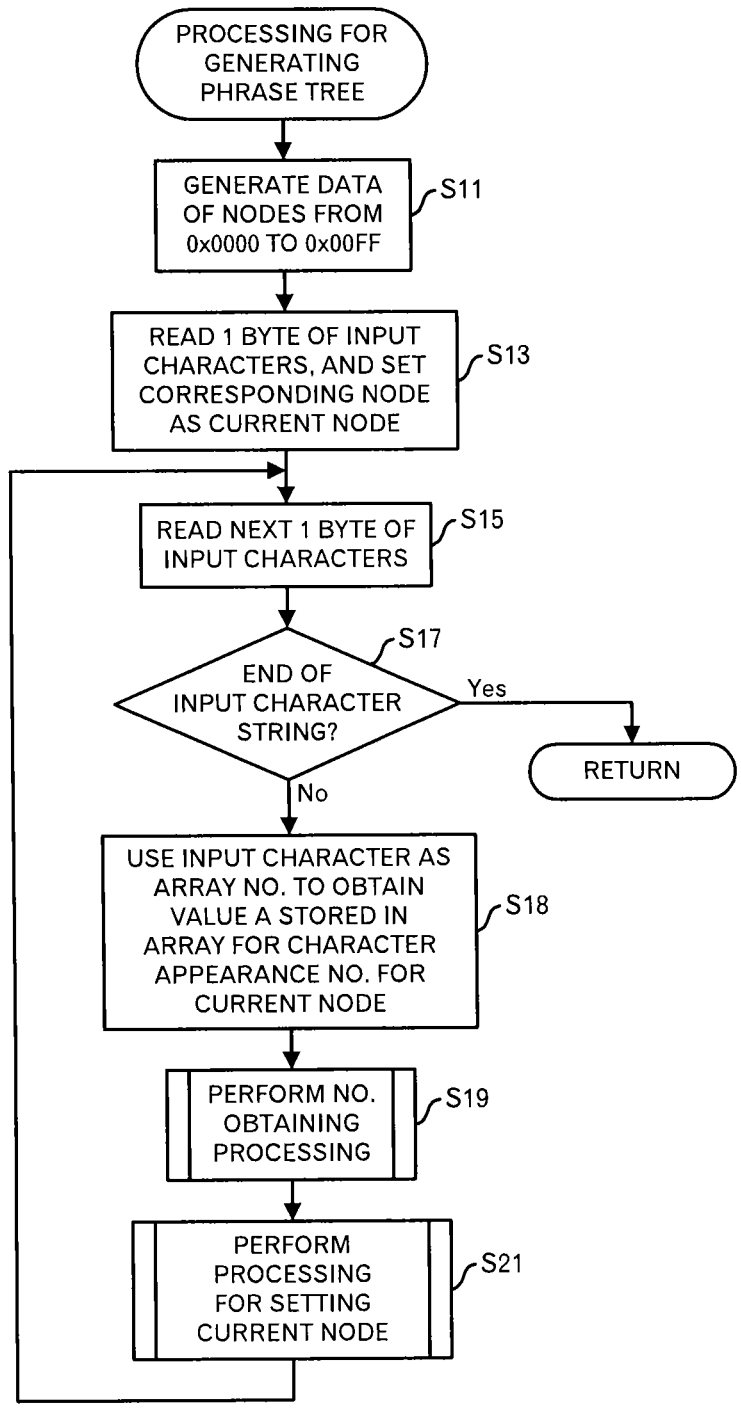
FIG. 7 is a diagram depicting a processing flow of a processing for generating a phrase tree.

Next, the processing for generating the phrase tree will be explained using FIG. 7. First, the phrase tree generator 110 generates data for the nodes having codes 0x0000 to 0x00FF (step S11). The first-layer nodes that are always provided are generated as the initial setting.

The phrase tree generator 110 then reads a 1-byte input character from the input character string, and sets the node corresponding to the read character as the current node (step S13). Furthermore, the phrase tree generator 110 reads the next 1-byte input character from the input character string (step S15). Then, the phrase tree generator 110 determines whether the next input character is the end of the input character string (step S17). When the next input character is the end of the input character string, the processing returns to the processing of the calling source.

On the other hand, when the next input character is not the end of the input character string, the phrase tree generator 110 uses the code of the input character as an array index to obtain a value A that is stored in the array for the character appearance numbers for the current node (step S18). Then, the phrase tree generator 110 performs a number obtaining processing (step S19). This number obtaining processing will be explained using FIG. 26A and FIG. 26B.

After that, the phrase tree generator 110 performs a processing for setting a current node (step S21). The processing for setting the current node will be explained using FIG. 27. After that, the processing returns to the step S15.

Before describing details of the number obtaining processing and processing for setting the current node, a detailed example will be explained using FIG. 8 to FIG. 25 in order to make it easier to understand the processing. Here, the processing when a character string "ABABCABCABCCBCB-CBCAAACBACBACBBCCBBCBECBECBD-CBDCBGCBGCBHCBHCBFCBFCBICBI" is inputted will be explained. Moreover, not only the data structure of the phrase tree, but also a schematic diagram of the phrase tree will be explained.

Figure 8:
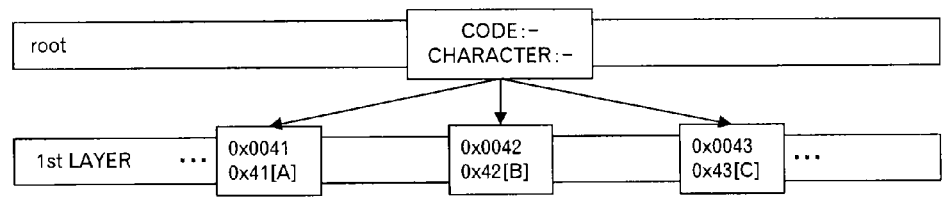
FIG. 8 is a diagram to explain a generation processing of data of the phrase tree.

At the step S11, when schematically illustrated as in FIG. 8, the nodes for the codes 0x0001 to 0x00FF are generated as the 1st-layer nodes. In this example, mainly the nodes of the code "0x0041", "0x0042" and "0x0043" and the child nodes of these nodes are the targets of the processing, so only this portion is illustrated. Moreover, data blocks of a data structure such as illustrated in FIG. 9 are generated. In this way, the data block illustrated in FIG. 3 for the code "0x0041" that corresponds to character "0x41", the data block illustrated in FIG. 3 for the code "0x0042" that corresponds to character "0x42", and the data block illustrated in FIG. 3 for the code "0x0043" that corresponds to character "0x43" are generated. In this stage, the values set are initial values.

Figure 10:
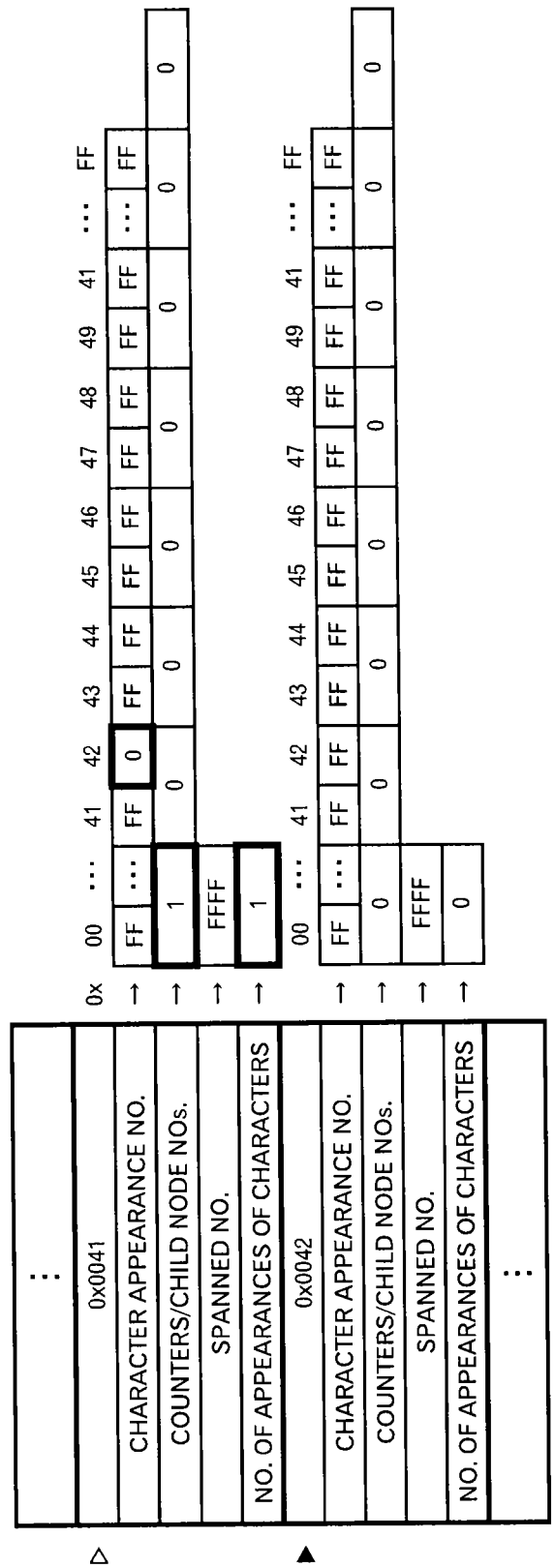
FIG. 10 is a diagram to explain the generation processing of data of the phrase tree.

Next, the first "A" of the input character string "'A'BABCABCABCCBCBCBCAAACBACBACBBCCBB CBECBECBDCBDCBGCBGCBHCBHCBFCBFCBICBI" is read, and the node of the corresponding code "0x0041" is set as the current node. Then, the next "B" in the input character string "A'B'ABCABCABCCBCBC BCAAACBAC-BACBBCCBBCBECBECBDCBDCBGCB-GCBHCBHCBFCBFCBICBI" is read. Then, as illustrated in FIG. 10, when referencing the value of index "0x42(B)" in the array for the character appearance numbers for the current node, the value is "0xFF". Therefore, the appearance sequential number "0", which is equal to the number of appearances of characters, is set as the character appearance number for "0x42". Moreover, the number of appearances of characters is updated from "0" to "1". Furthermore, in the array for counters/child node numbers, the value of the 0-th counter, which corresponds to the appearance sequential number, is less than "0x0100", so the number of appearances "0" is incremented by 1, then "1" is set as the value of the 0-th counter. The number of appearances (i.e. the value of the counter) has not reached the threshold value "2", so the current node is updated to the node of code "0x0042" that corresponds to the character "0x42". The new current node is represented by the black triangle, and the old current node is represented by the white triangle in the drawing.

Figure 11:
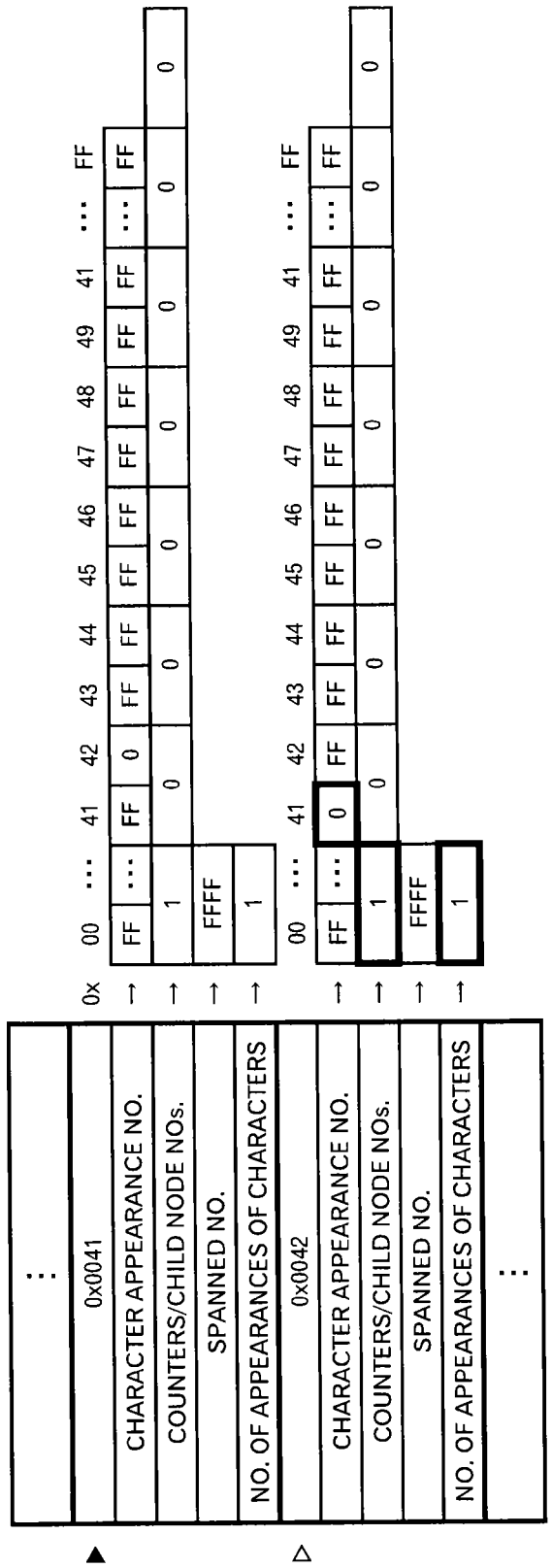
FIG. 11 is a diagram to explain the generation processing of data of the phrase tree.

Next, the "A" in the input character string "AB'A'BCABCABCCBCBCBCAAACBACBACBBCCBB CBECBECBDCBDCBGCBGCBHCBIICBFCBFCBICBI" is read. Then, as illustrated in FIG. 11, when referencing the value for index "0x41 (A)" in the array for the character appearance numbers for the current node, the value is "0xFF". Therefore, the appearance sequential number "0", which is equal to the number of appearances of characters, is set as the character appearance number for "0x41". Moreover, the number of appearances of characters is updated from "0" to "1". Furthermore, in the array for counters/child node numbers, the value of the 0-th counter, which corresponds to the appearance sequential number, is less than "0x0100", so the number of appearances "0" is incremented by 1, then "1" is set as the value of the 0-th counter. The number of appearances has not reached the threshold value "2", so the current node is updated to the node of code "0x0041" that corresponds to the character "0x41".

Figure 12:
FIG. 12 is a diagram to explain the generation processing of data of the phrase tree.
Figure 13:
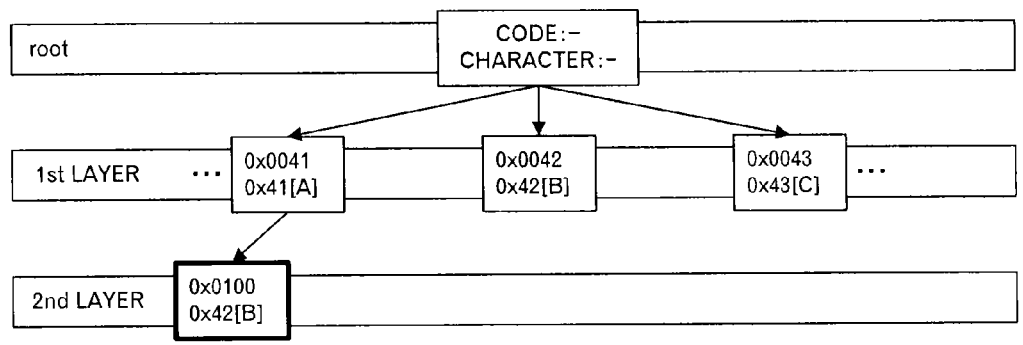
FIG. 13 is a diagram to explain the generation processing of data of the phrase tree.
Figure 18:
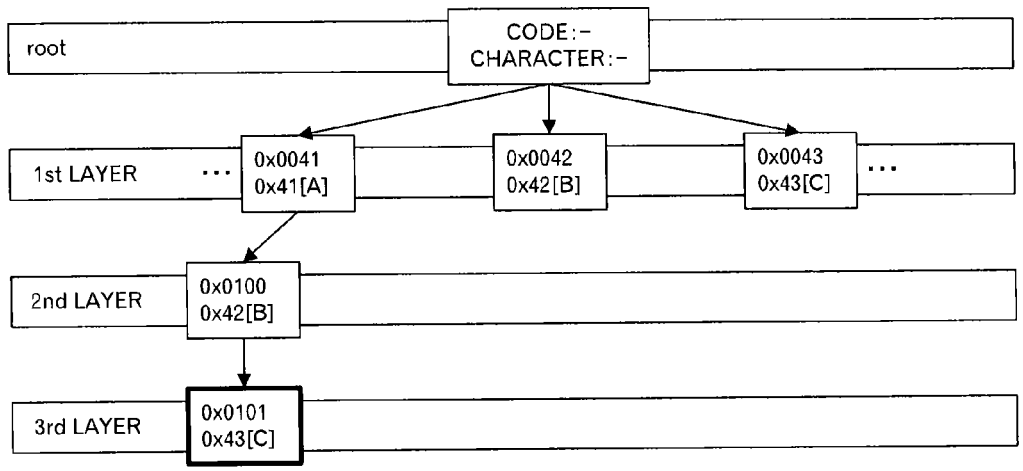
FIG. 18 is a diagram to explain the generation processing of data of the phrase tree.

Furthermore, "B" in the input character string "ABA'B'CABCABCCBCBCBCAAACBACBACBBCCBB CBECBECBDCBDCBGCBGCBHCBHCBFCBFCBICBI" is read. Then, as illustrated in FIG. 12, when referencing the value of index "0x42 (B)" in the array for the character appearance numbers for the current node, the appearance sequential number "0" is obtained. Furthermore, in the array for counters/child node numbers, the 0-th value, which corresponds to the appearance sequential number "0", is less than "0x0100", so the number of appearances "1" is incremented by 1. As a result, the number of appearances has reached the threshold value "2". Then, as illustrated in FIG. 12, a new child node for code "0x0100" is generated, and the code "0x0100" of the new child node is set as the 0-th value in the array for counters/child node numbers. The code "0x0100" is the code corresponding to "AB". The child node of the code "0x0100" is then set as the current node. The phrase tree changes from the state illustrated in FIG. 8 to the state illustrated in FIG. 13.

Figure 14:
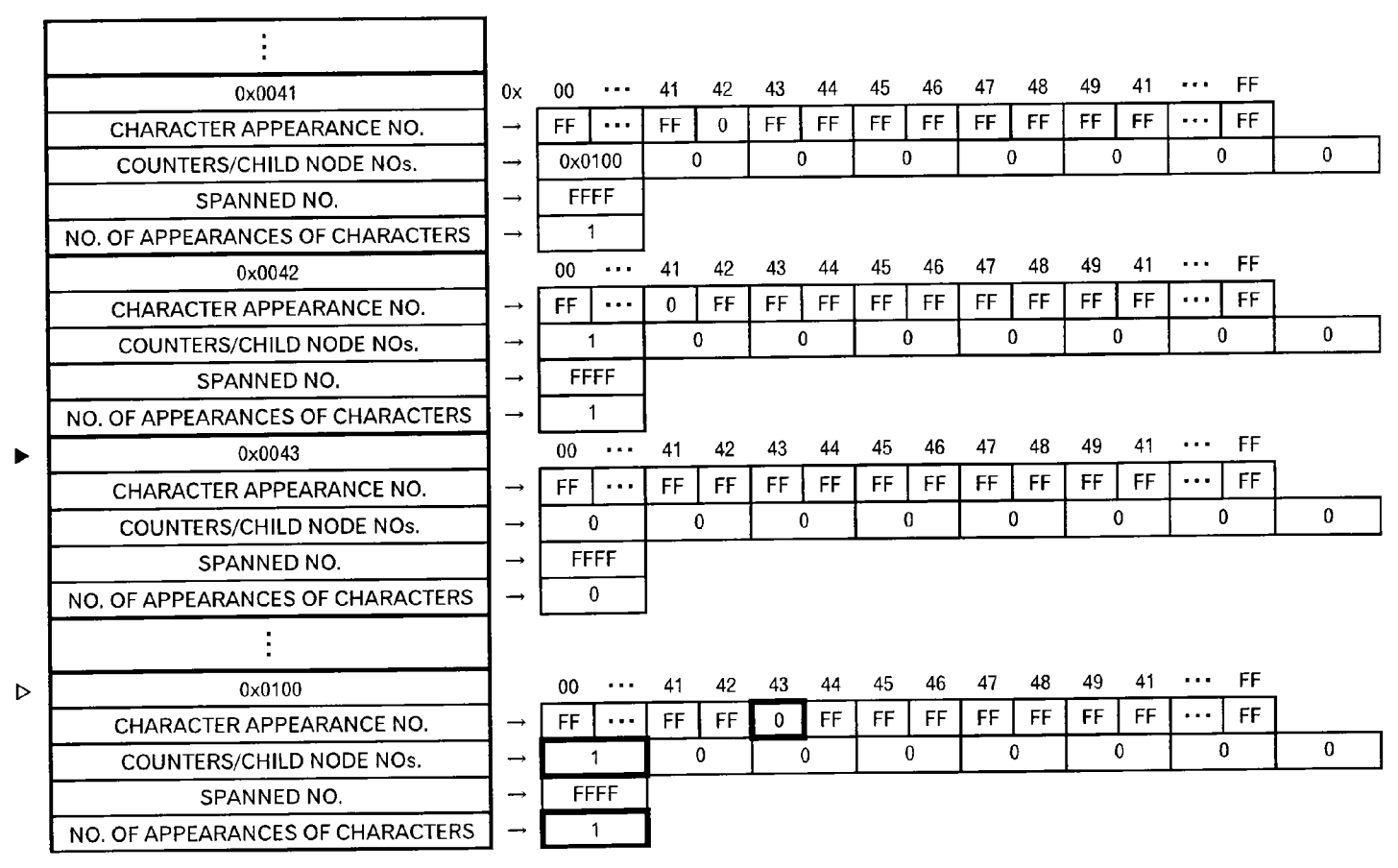

The "C" is then read from the input character string "ABAB'C'ABCABCCBCBCBCAAACBACBACBBCCBB CBECBECBDCBDCBGCBGCBHCBH-CBFCBFCBICBI". Then, as illustrated in FIG. 14, when referencing the value of index "0x43 (C)" in the array for character appearance numbers for the current node, the value is "0xFF". Therefore, the appearance sequential number "0", which is equal to the number of appearances of characters, is set as the character appearance number for "0x43". Moreover, the number of appearances of characters is updated from "0" to "1". Furthermore, in the array for counters/child node numbers, the value of the 0-th counter, which corresponds to the appearance sequential number, is less than "0x0100", so the number of appearances "0" is incremented by 1, and "1" is set as the value of the 0-th counter. Because the number of appearances has not reached the threshold value "2", the current node is updated to the node of code "0x0043" that corresponds to the character "0x43".

Figure 15:
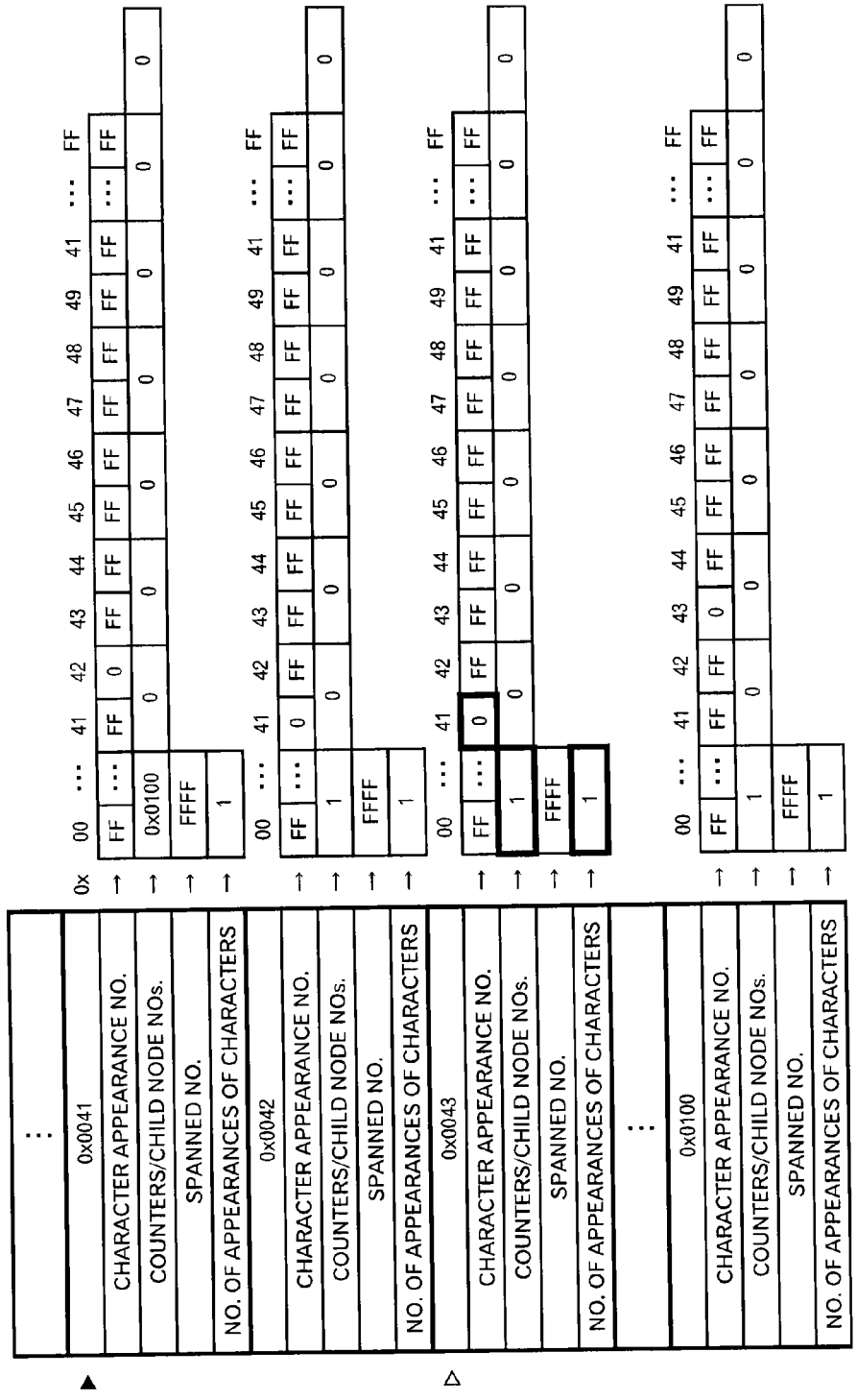
FIG. 15 is a diagram to explain the generation processing of data of the phrase tree.

Furthermore, "A" in the input character string "ABABC'A'BCABCCBCBCBCAAACBACBACBBCCBB CBECBECBDCBDCBGCBGCBHCBHCBFCBFCBICBI" is read. In doing so, as illustrated in FIG. 15, when referencing the value of index "0x41 (A)" in the array for the character appearance numbers for the current node, the value is "0xFF". Therefore, the appearance sequential number "0", which is equal to the number of appearances of characters, is set as the character appearance number for "0x41". Moreover, the number of appearances of characters is updated from "0" to "1". Furthermore, in the array for counters/child node numbers, the value of the 0-th counter, which corresponds to the appearance sequential number, is less than "0x0100", so the number of appearances "0" is incremented by 1, then "1" is set as the value of the 0-th counter. The number of appearances (i.e. the value of the counter) has not reached the threshold value "2", so the current node is updated to the node of code "0x0041" that corresponds to the character "0x41".

Figure 16:
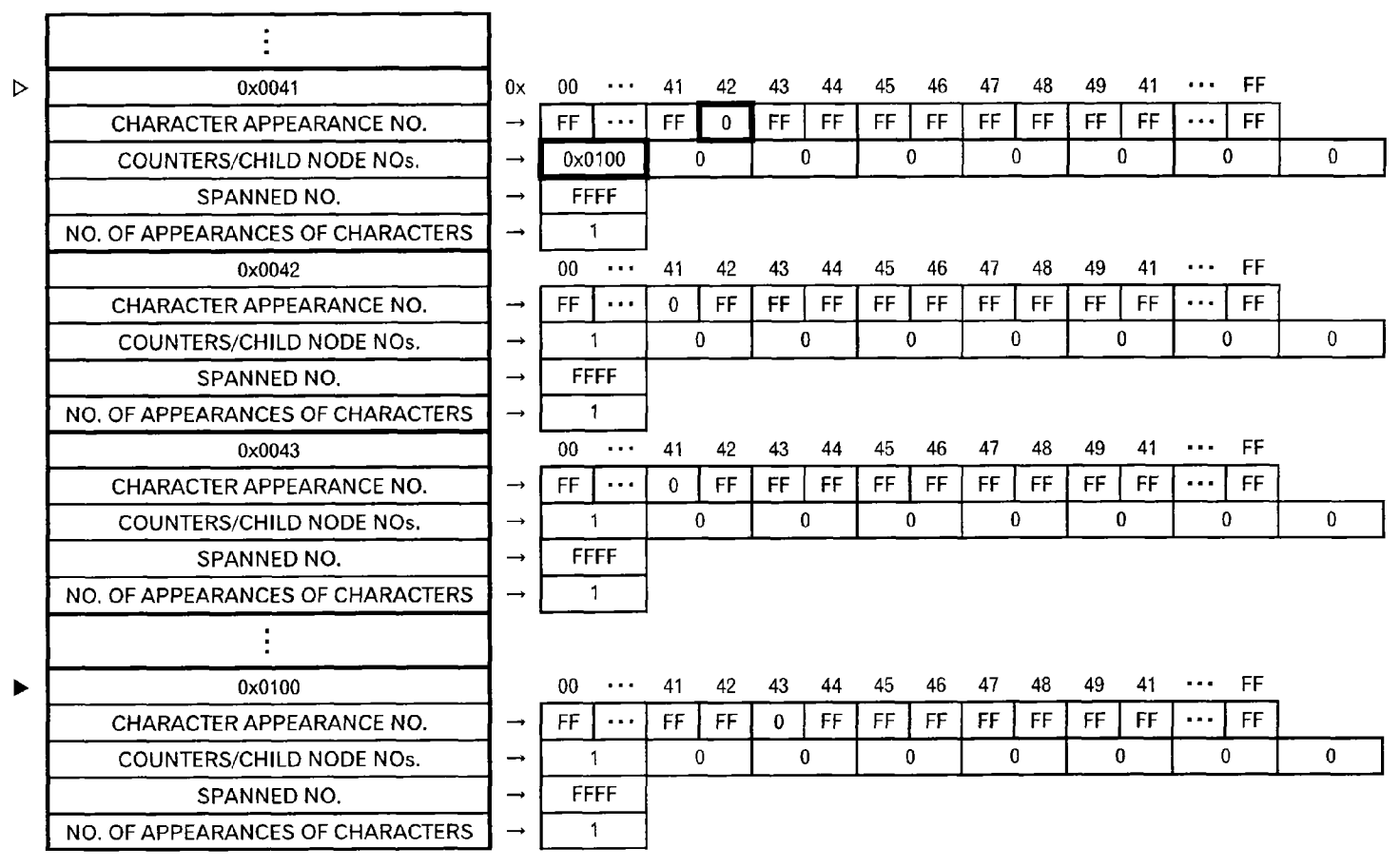

Then, the "B" in the input character string "ABABCA'B'CABCCBCBCBCAAACBACBACBBCCBB CBECBECBDCBDCBGCBGCBHCBHCBFCBFCBICBI" is read. In doing so, as illustrated in FIG. 16, when referencing the value of index "0x42 (B)" in the array for the character appearance numbers for the current node, the value is "0". Therefore, in the array for counters/child node numbers, the 0-th value is referenced. As a result, because the code "0x0100" is obtained, the current node is updated to the node of the code "0x0100".

Figure 17:
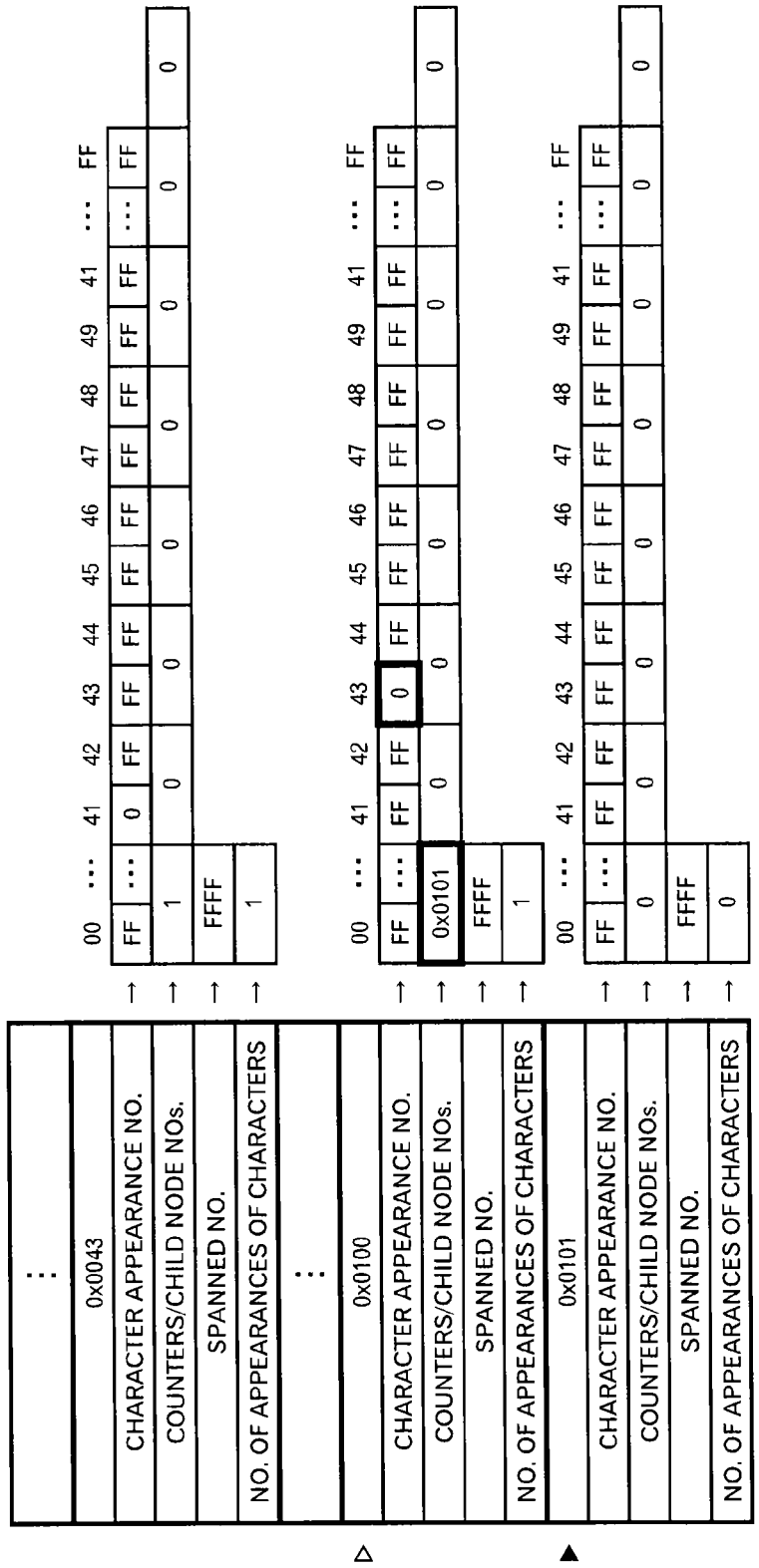
FIG. 17 is a diagram to explain the generation processing of data of the phrase tree.
Figure 20C:
FIG. 20C is a diagram to explain the generation processing of data of the phrase tree.
Figure 20D:
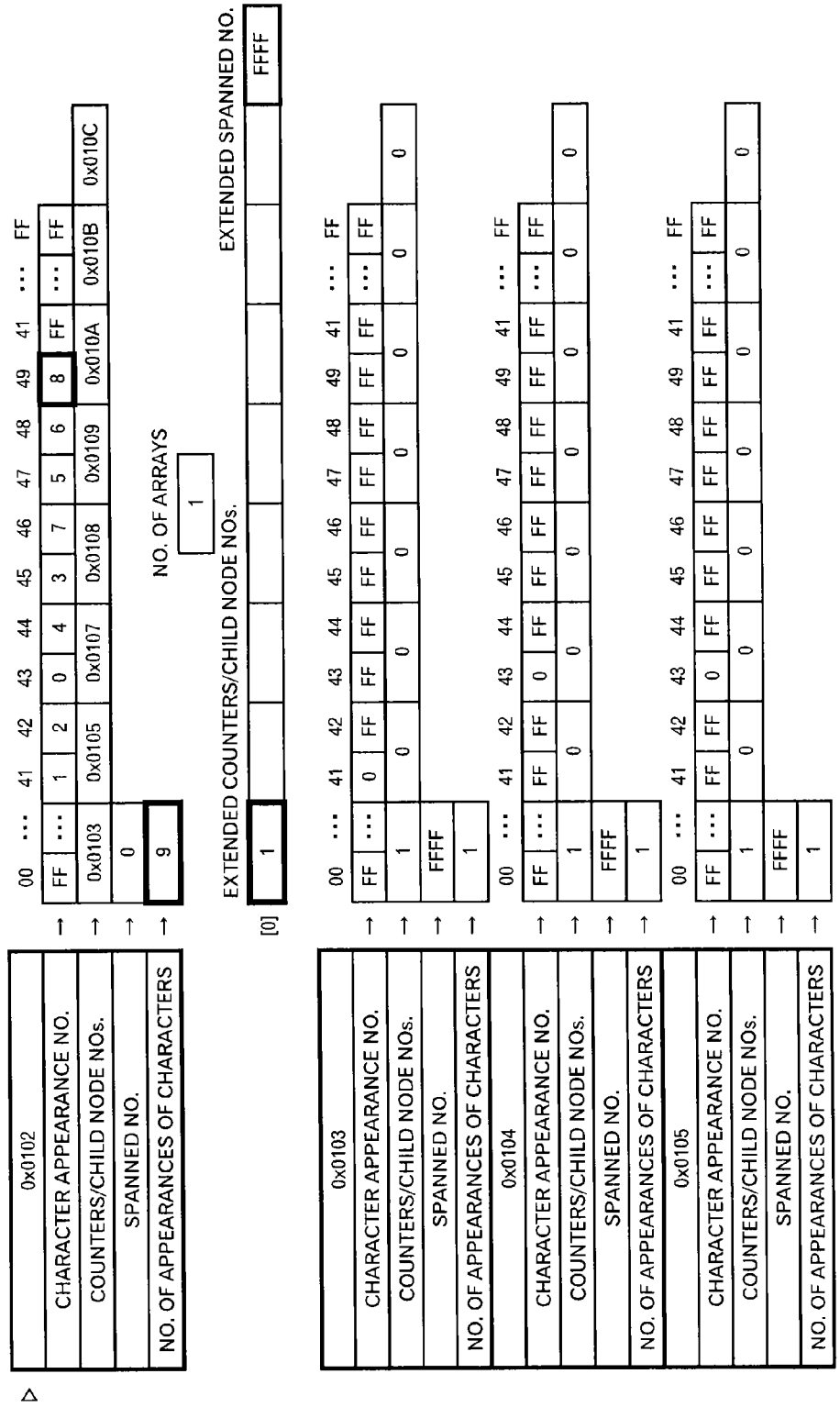
FIG. 20D is a diagram to explain the generation processing of data of the phrase tree.

Moreover, the "C" in the input character string "ABABCAB'C'ABCCBCBCBCAAACBACBACBBCCBB CBECBECBDCBDCBGCBGCBHCBHCBFCBFCBICBI" is read. In doing so, as illustrated in FIG. 17, when referencing the value of index "0x43 (C)" in the array for character appearance numbers for the current node, the appearance sequential number "0" is obtained. Then, in the array for counters/child node numbers, the value of the 0-th counter, which corresponds to the appearance sequential number, is less than "0x0100", so the number of appearances "1" is incremented by 1. As a result, the number of appearances reaches the threshold value "2", so as illustrated in FIG. 17, a new child node for code "0x0101" is generated, and the code "0x0101" of the new child node is set as the 0-th value in the array for counters/child node numbers. The code "0x0101" is the code corresponding to "ABC". The child node of the code "0x0101" is set as the current node. The phrase tree changes from the state illustrated in FIG. 13 to the state illustrated in FIG. 18.

Figure 19:
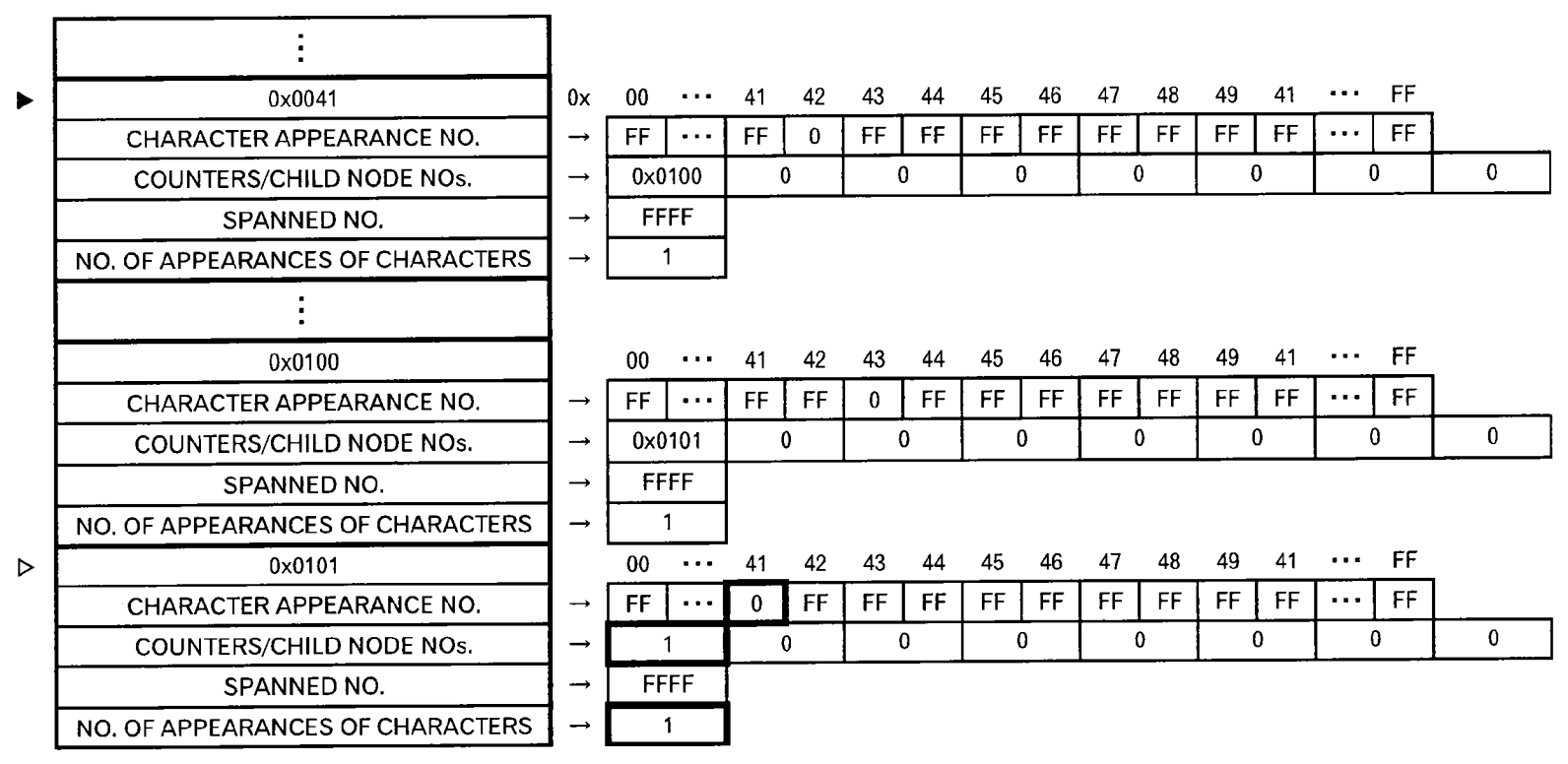

Moreover, the "A" in the input character string "ABABCABC'A'BCCBCBCBCAAACBACBACBBCCBB CBECBECBDCBDCBGCBGCBHCBHCBFCBFCBICBI" is read. In doing so, as illustrated in FIG. 19, when referencing the value of index "0x41 (A)" in the array for character appearance numbers for the current node, the value is "0xFF". Therefore, the appearance sequential number "0", which is equal to the number of appearances of characters, is set as the character appearance number for "0x41". Moreover, the number of appearances of characters is updated from "0" to "1". Furthermore, in the array for counters/child node numbers, because the value of the 0-th counter, which corresponds to the appearance sequential number, is less than "0x0100", the number of appearances "0" is incremented by 1, and then, "1" is set as the value of the 0-th counter. Because the number of appearances has not reached the threshold value "2", the current node is updated to the node of code "0x0041" that corresponds to the character "0x41". Such a processing is repeated.

Figure 21:
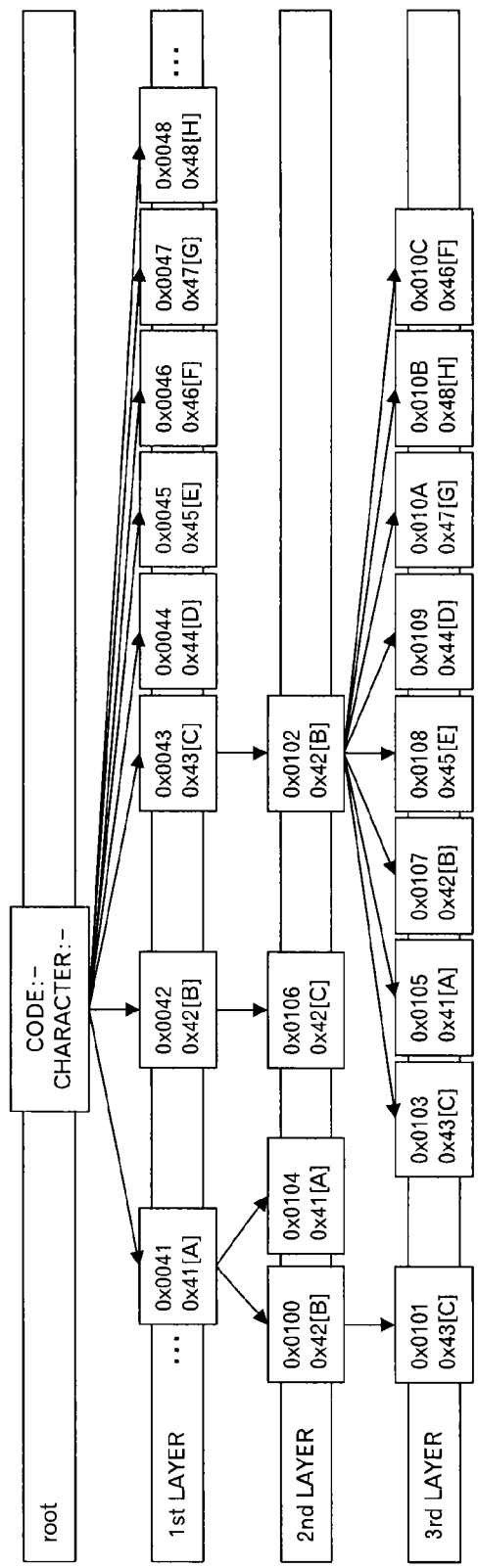
FIG. 21 is a diagram to explain the generation processing of data of the phrase tree.
Figure 24F:
FIG. 24F is a diagram to explain the generation processing of data of the phrase tree.
Figure 25:
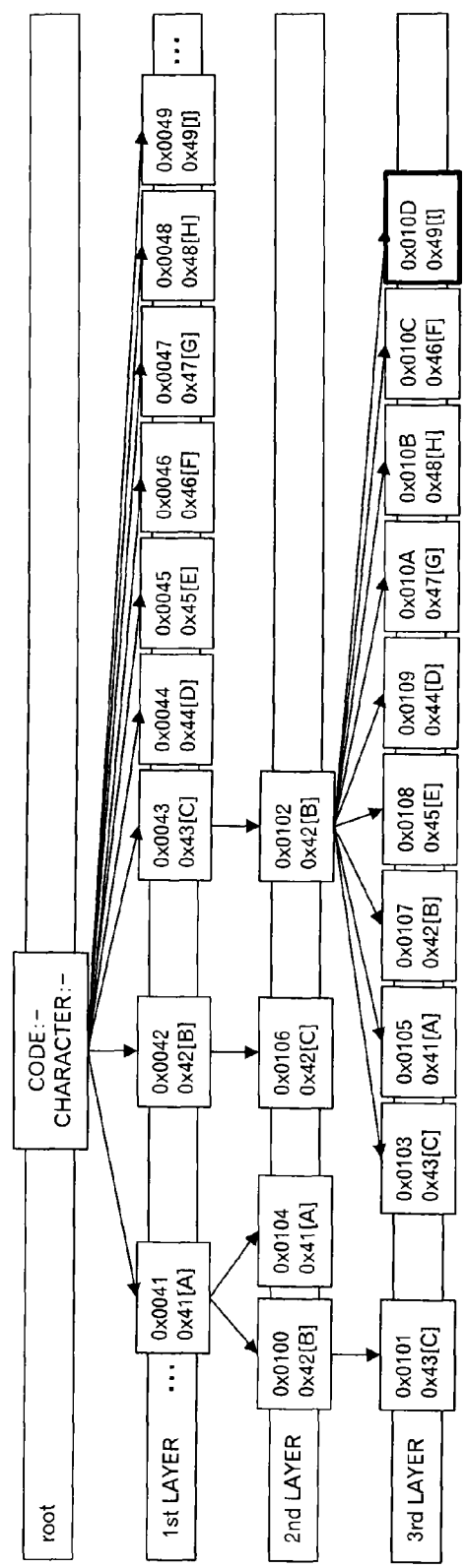
FIG. 25 is a diagram to explain the generation processing of data of the phrase tree.

The stage is reached in which the "I" in the input character string "ABABCABCABCCBCBCBCAAACBAC-BACBBCCBBCBECBECBDCBDCBGCB-GCBHCBHCBFCBFCB'I'CBI" is read. Here, the current node is the node of code "0x0102", and as illustrated in FIG. 20A to FIG. 20F, when referencing the value of index "0x49 (I)" in the array for character appearance numbers for the current node, the value is "0xFF". Therefore, the appearance sequential number "8", which is the number of appearances of characters, is set as the character appearance number for "0x49". Moreover, the number of appearances of characters is updated from "8" to "9". Furthermore, in the array for counters/child node numbers, the 8-th value, which corresponds to the appearance sequential number, is not included in the default array. Therefore, the array for the extended counters/child node numbers is referenced. Here, the 0-th array for the extended counters/child node numbers is identified, and the 0-th (=8−8) value in that array is referenced. Because the 0-th value, which corresponds to the appearance sequential number, in the 0-th array for extended counters/child node numbers is less than "0x0100", the number of appearances "0" is incremented by 1, and "1" is set as the number of appearances. The number of appearances has not reached the threshold value "2", so the current node is updated to the node of code "0x0049" that corresponds to the character "0x49". In this stage, the phrase tree is in a state as illustrated in FIG. 21. Eight child nodes (i.e. third-layer nodes) of the code "0x0102" have already been generated.

Figure 22A:
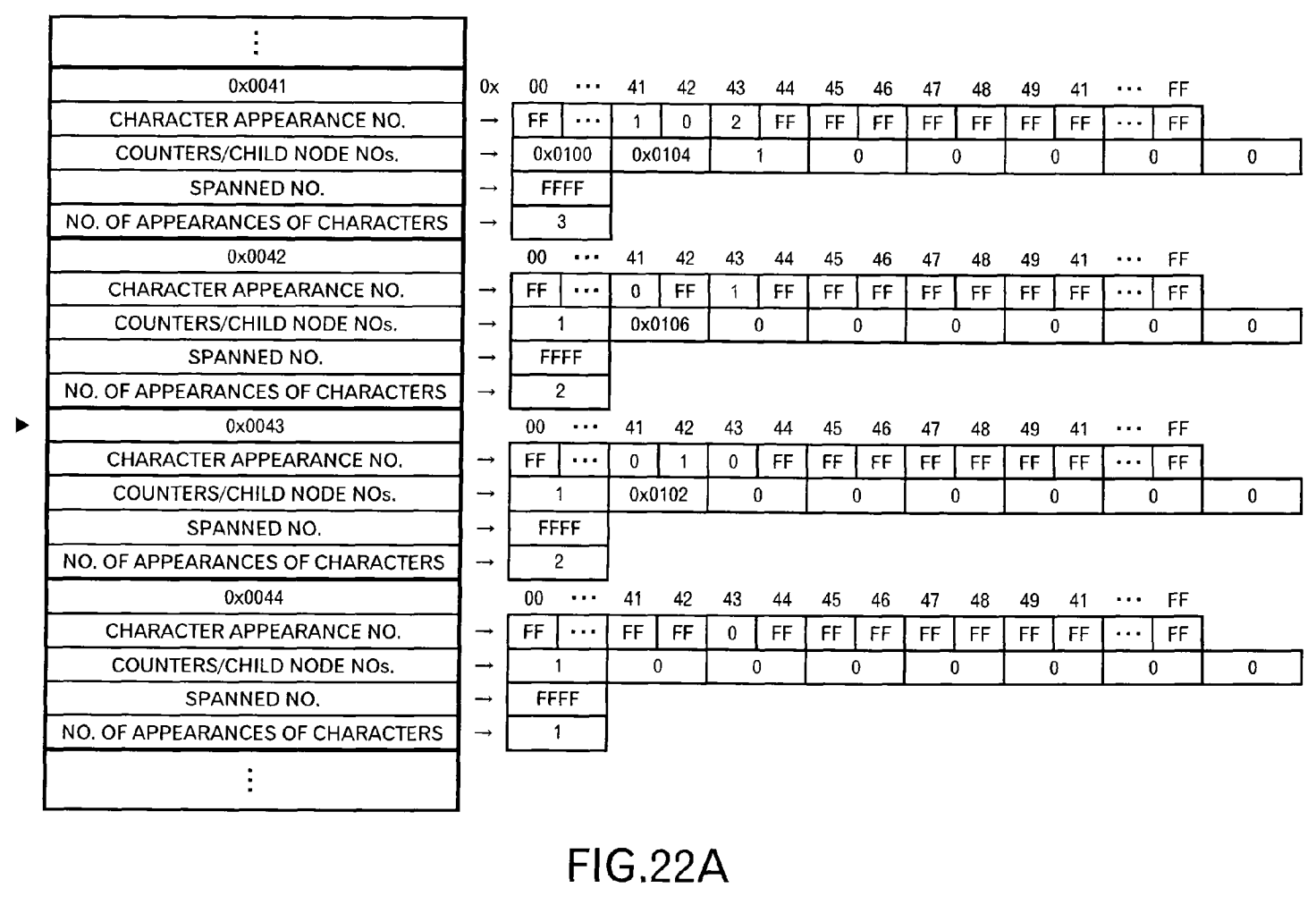
Figure 22B:
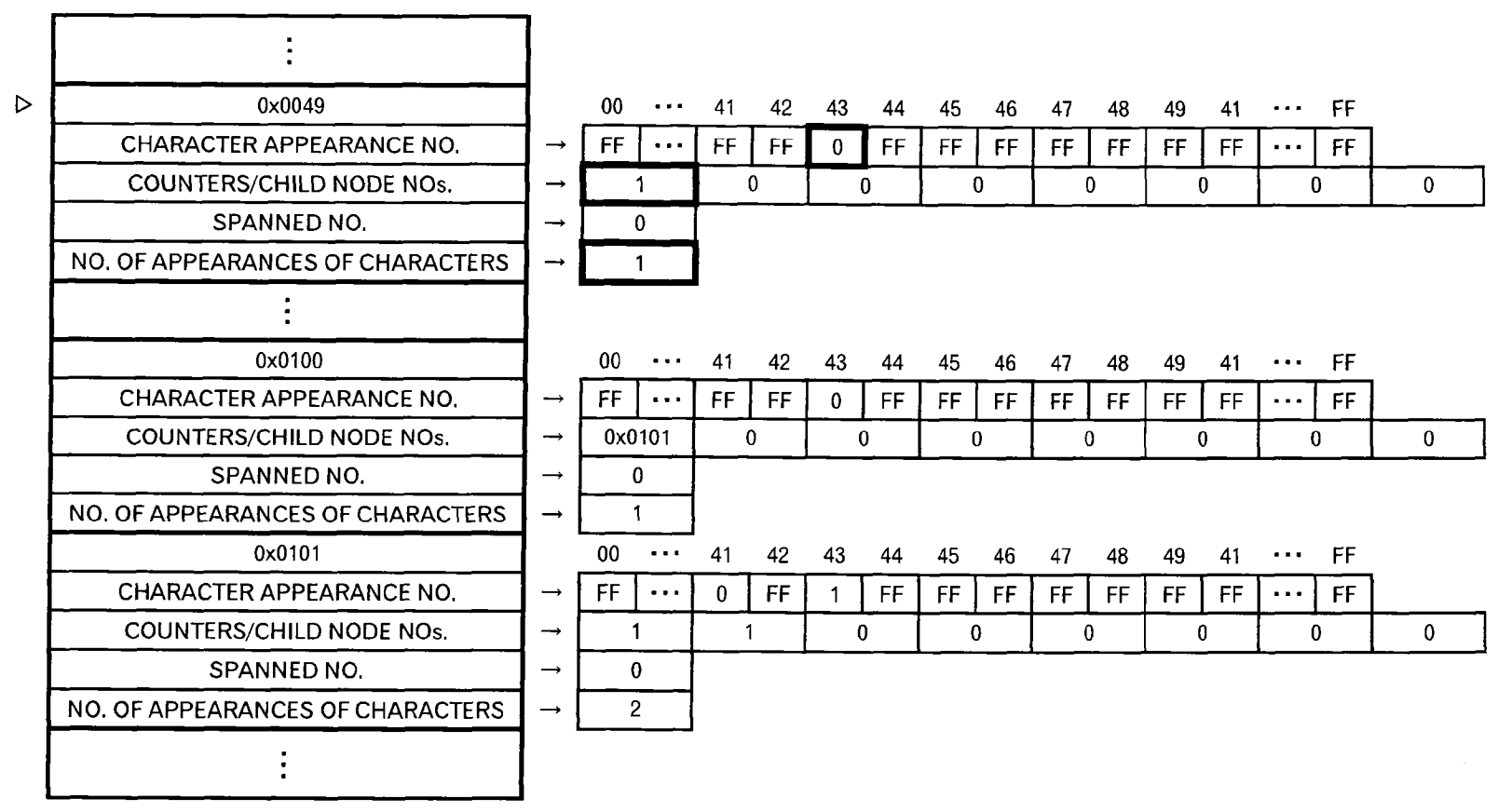

After that, the "C" in the input character string "ABAB-CABCABCCBCBCBCAAACBACBACBBC-CBBCBECBECBDCBDCBGCBGCBHCBH-CBFCBFCBI'C'BI" is read. In doing so, as illustrated in FIG. 22A and FIG. 22B, when referencing the value of index "0x43 (C)" in the array for character appearance numbers for the current node, the appearance sequential number "0" is obtained. Then, in the array for counters/child node numbers, the 0-th value, which corresponds to the appearance sequential number, is less than "0x0100", so the number of appearances "0" is incremented by 1, and then, "1" is set as the number of appearances. The number of appearances has not reached the threshold value "2", so the current node is updated to the node of code "0x0043" that corresponds to the character "0x43".

Figure 23:
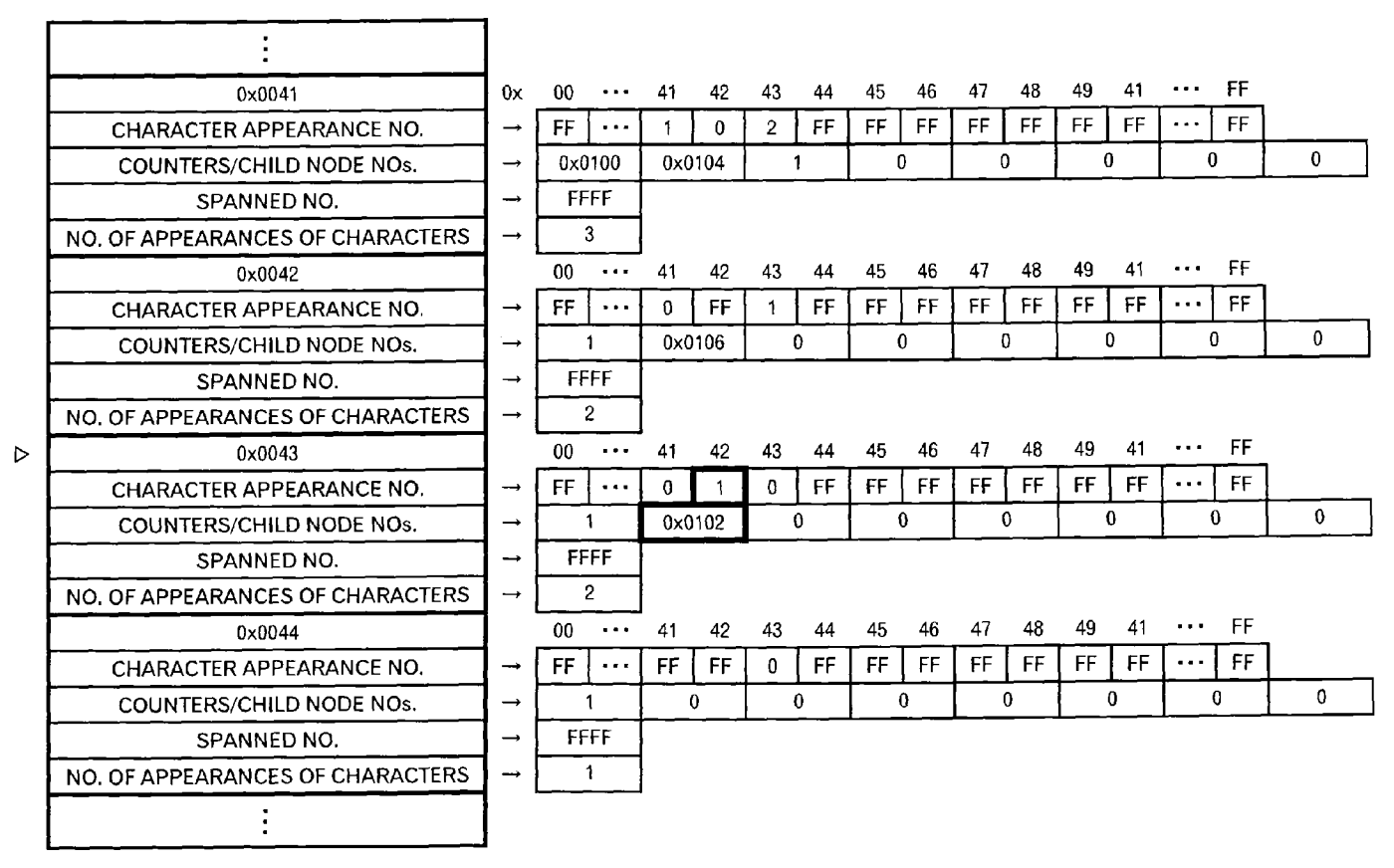

Furthermore, the "B" in the input character string "ABAB-CABCABCCBCBCBCAAACBACBACBBC-CBBCBECBECBDCBDCBGCBGCBHCBH-CBFCBFCBIC'B'I" is read. In doing so, as illustrated in FIG. 23, when referencing the value of index "0x42 (B)" in the array for character appearance numbers for the current node, the value is "1". Therefore, in the array for counters/child node numbers, the 1st value, which corresponds to the appearance sequential number, is referenced. As a result, the code "0x0102" is obtained, so the current node is updated to the node of the code "0x0102".

Finally, the "I" in the input character string "ABABCAB-CABCCBCBCBCAAACBACBACBBCCB-BCBECBECBDCBDCBGCBGCBHCBH-CBFCBFCBICB'I'" is read. In doing so, as illustrated in FIG. 24A to FIG. 24F, when referencing the value of index "0x49 (I)" in the array for character appearance numbers for the current node, the appearance sequential number "8" is obtained. In the array for counters/child node numbers, the 8-th value, which corresponds to the appearance sequential number, is not included in the default array, so the array for extended counters/child node numbers is referenced. Here, when referencing the 0-th (=8–8) value in the 0-th array for extended counters/child node numbers, the value is less than "0x0100". Therefore, the number of appearances "1" is incremented by 1. As a result, the number of appearances has reached the threshold value "2", so as illustrated in FIG. 24A to FIG. 24F, a new child node of code "0x010D" is generated, and the code "0x010D" of the new child node is set as the 0-th value in the array for the counters/child node numbers. The code "0x010D" is a code corresponding to the character string "ABI". Then, the current node is changed to the child node of the code "0x010D". The phrase tree is changed from a state such as in FIG. 23 to the state illustrated in FIG. 25. In this way, a phrase tree is generated in which there are four nodes in the second layer, and ten nodes in the third layer, however, child nodes are generated according to the appearance order, so in the second layer and third layer, the code is not arranged in order of codes of corresponding characters.

Figure 26A:
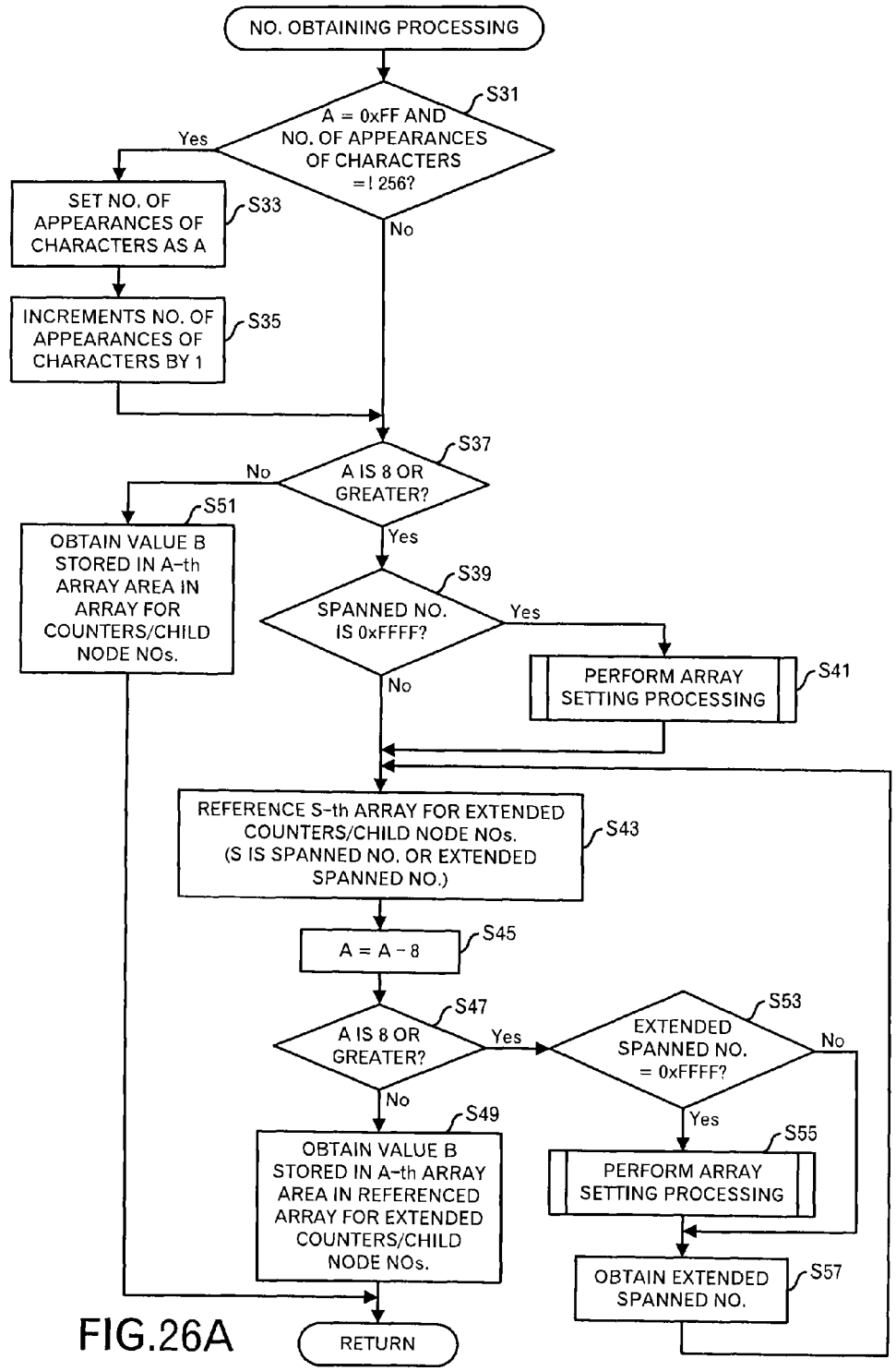
FIG. 26A is a diagram to depict a processing flow of a processing for obtaining numbers.

The number obtaining processing to carry out such a processing will be explained using FIG. 26A. The phrase tree generator 110 determines whether or not a condition that a value A is 0xFF and the number of appearances of characters is not 256 is satisfied (step S31). When this condition is satisfied, a character that has not appeared up to this point has appeared, so the phrase tree generator 110 sets the number of appearances of characters for the current node as the value A (step S33), and then increments the number of appearances of characters by 1 (step S35).

When it is determined that the condition of the step S31 is not satisfied, or after the step S35, the phrase tree generator 110 determines whether or not the value A is 8 or greater (step S37). When the value A is less than 8, the phrase tree generator 110 acquires the value B that is stored in the A-th array area in the array for counters/child node numbers (step S51). The processing then returns to the calling source processing.

On the other hand, when the value A is 8 or greater, the phrase tree generator 110 determines whether the spanned number is 0xFFFF (step S39). When the spanned number is 0xFFFF, the array for extended counters/child node numbers has not been acquired. Therefore, when the spanned number is 0xFFFF, the phrase tree generator 110 performs an array setting processing (step S41). The processing then moves to step S43.

Figure 26B:
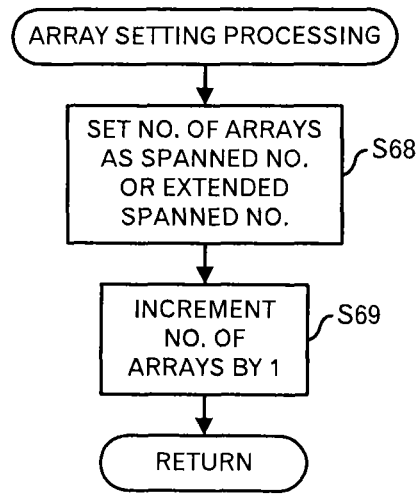
FIG. 26B is a diagram to depict a processing flow of an array setting processing.

The array setting processing will be explained using FIG. 26B. The phrase tree generator 110 sets the current number of arrays as the spanned number for the current node, or as the extended spanned number in the array for the extended counters/child node numbers, which is currently referenced (step S68). Then, the phrase tree generator 110 increments the number of arrays by 1 (step S69). The processing then returns to the processing of the calling source.

When it is determined at the step S39 that the spanned number is not 0xFFFF, and another value is set as the spanned number, or after the step S41, the phrase tree generator 110 references the S-th array for extended counters/child node numbers (step S43). S is the acquired "spanned number" or the "extended spanned number". The phrase tree generator 110 then calculates A=A−8 (step S45). After that, the phrase tree generator 110 determines whether A is 8 or greater (step S47). When A is 8 or greater, 2 or more arrays for the extended counters/child node numbers are used. When A is 8 or greater, the phrase tree generator 110 determines whether the extended spanned number in the array for extended counters/child node numbers, which is currently referenced, is 0xFFFF (step S53). When the extended spanned number is not 0xFFFF, the processing moves to step S57. On the other hand, when the extended spanned number is 0xFFFF, a new array for the extended counters/child node numbers will be set, so the phrase tree generator 110 performs the array setting processing (FIG. 26B) (step S55). The processing then moves to step S57.

The phrase tree generator 110 then acquires the extended spanned number in the referenced array for extended counters/child node numbers, or in the array for extended counters/child node numbers, which is set in the array setting processing (step S57). The processing then returns to the step S43.

On the other hand, when the value A is less than 8, the phrase tree generator 110 acquires the value B that is stored in the A-th array area in the referenced array for extended counters/child node numbers (step S49). Then, the processing returns to the processing of the calling source.

By performing the processing described above, it is possible to obtain the codes of the child node or the number of appearances, which is the value of the counter.

Figure 27:
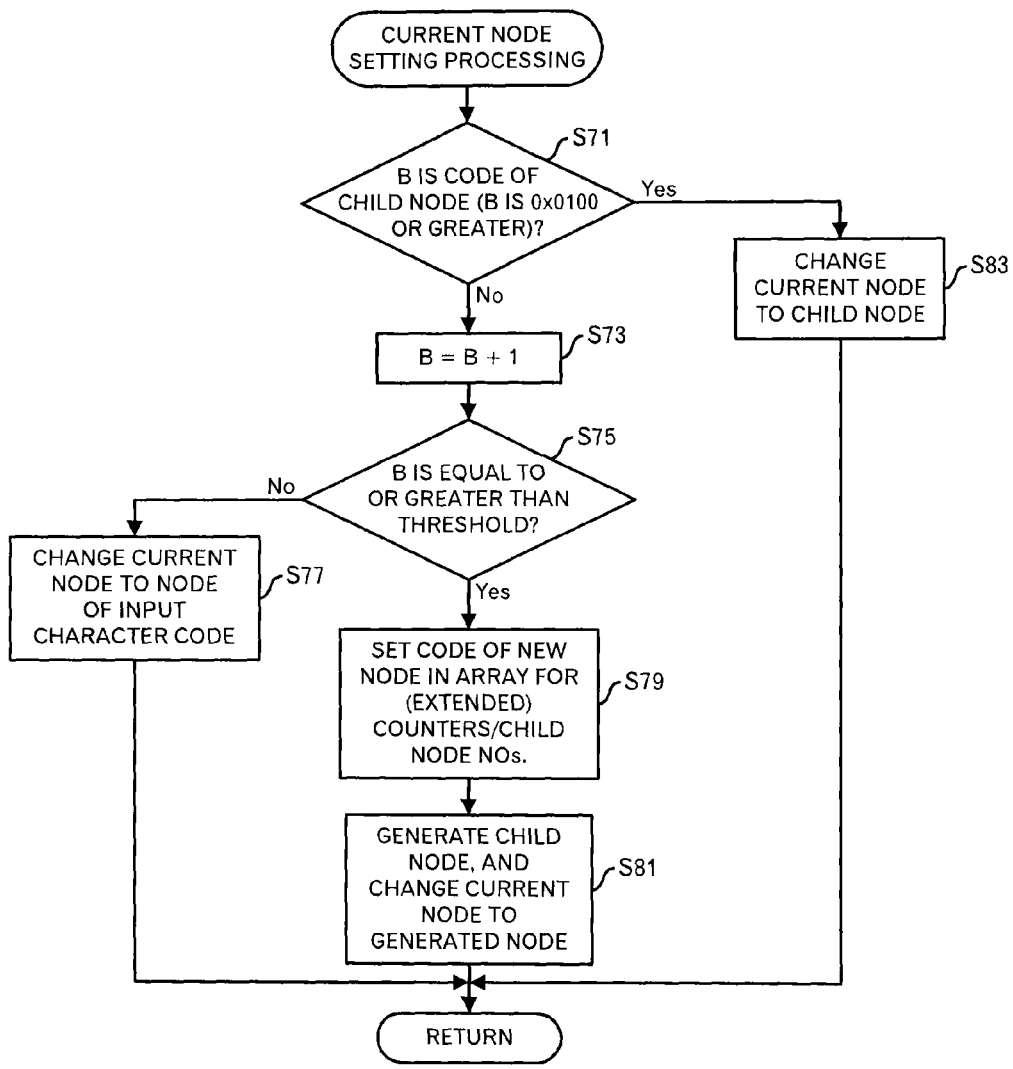
FIG. 27 is a diagram to depict a processing flow of a processing for setting a current node.

Next, the current node setting processing will be explained using FIG. 27. The phrase tree generator 110 determines whether the value B that is stored in the A-th array area in the array for counters/child node numbers (or extended counters/child node numbers) is a child node number (in other words, code of 0x0100 or greater) (step S71). When the value B represents a child node, the phrase tree generator 110 positions the current node at the child node (step S83). The processing then returns to the processing of the calling source.

On the other hand, when the value B does not represent a child node, the phrase tree generator 110 increments the value B by 1 (step S73). Then, the phrase tree generator 110 determines whether or not the value B is equal to or greater than a threshold value (step S75). When the value B is less than the threshold value, the phrase tree generator 110 positions the current node at the node of the code that corresponds to the input character (in other words, the node of the input character code) (step S77). The processing then moves to the processing of the calling source.

On the other hand, when the value B is equal to or greater than a threshold value, the phrase tree generator 110 sets a code for a new child node in the A-th array area in the array for counters/child node numbers (or extended counters/child node numbers) (step S79). The greatest code in the data block+1 is set as the code of the new child node. Furthermore, the phrase tree generator 110 generates a data block of the new child node having the set code, and positions the current node at the generated node (step S81).

By performing such a processing, a phrase tree such as illustrated in FIG. 24A to FIG. 24F is generated.

Next, the processing for generating the compression map will be explained. As was described above, in the phrase tree, the codes in the first layer are given in order of the character code, and are sorted in ascending order of the code, however, in the second layer and subsequent layers, the codes are given in order of the appearance. Therefore, the codes are given independent of the layer or character code. In the simple example illustrated in FIG. 28, the nodes for the code "0x0100", "0x0104", "0x0106", and "0x0102" are given in the second layer, and the codes are not sequential. Moreover, the character code that is expressed by the child node "0x0100" of the code "0x0041" corresponding to the character code "0x41" is "0x42", and the character code that is expressed by the child node "0x0104" is "0x41". Therefore, at this viewpoint as well, the code is not arranged in the order of the character code.

Figure 28:
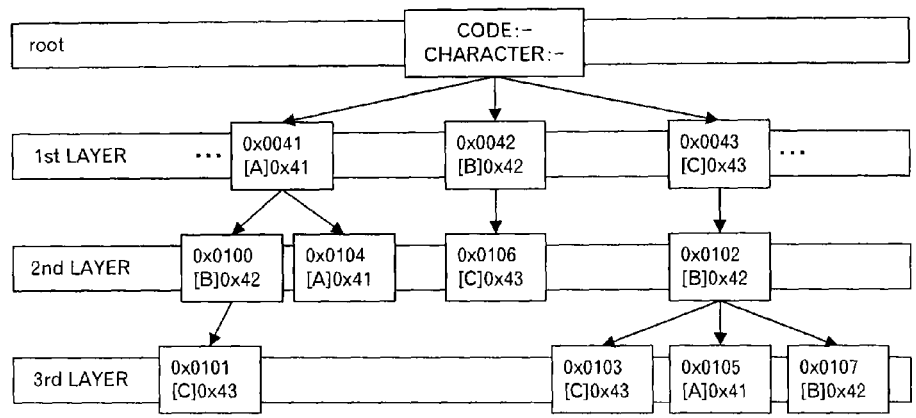
FIG. 28 is a diagram depicting an example of the phrase tree.
Figure 29:
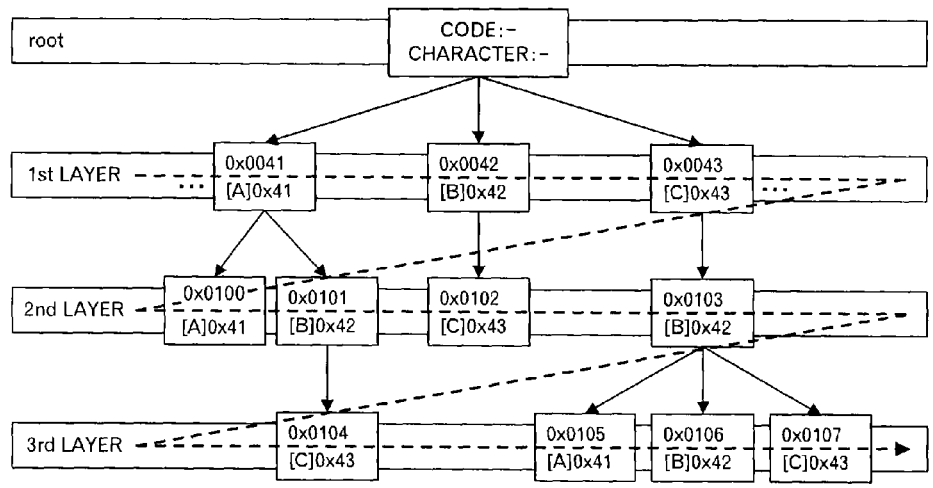
FIG. 29 is a diagram depicting an example of the phrase tree after sorting.

In this embodiment, when generating the compression map, the code is rearranged from the given state of the codes illustrated in FIG. 28 to the state illustrated in FIG. 29 so that the codes are sorted in order of layer and in order of a code of a corresponding character for each parent node (last character in a character string corresponding to the code). In the example in FIG. 29, in the second layer, the node of the character "0x41" is correlated with the code "0x0100", the node of character "0x42" is correlated with the code "0x0101", the node of character "0x43" is correlated with the code "0x0102", and the node of character "0x42" is correlated with the code "0x0103". Moreover, in the third layer, the node of character "0x43" is correlated with the code "0x0104", the node of character "0x41" is correlated with the code "0x0105", the node of character "0x42" is correlated with the code "0x0106", and the node of character "0x43" is correlated with the code "0x0107". In this way, it becomes possible to perform a binary search of the nodes.

Figure 30:
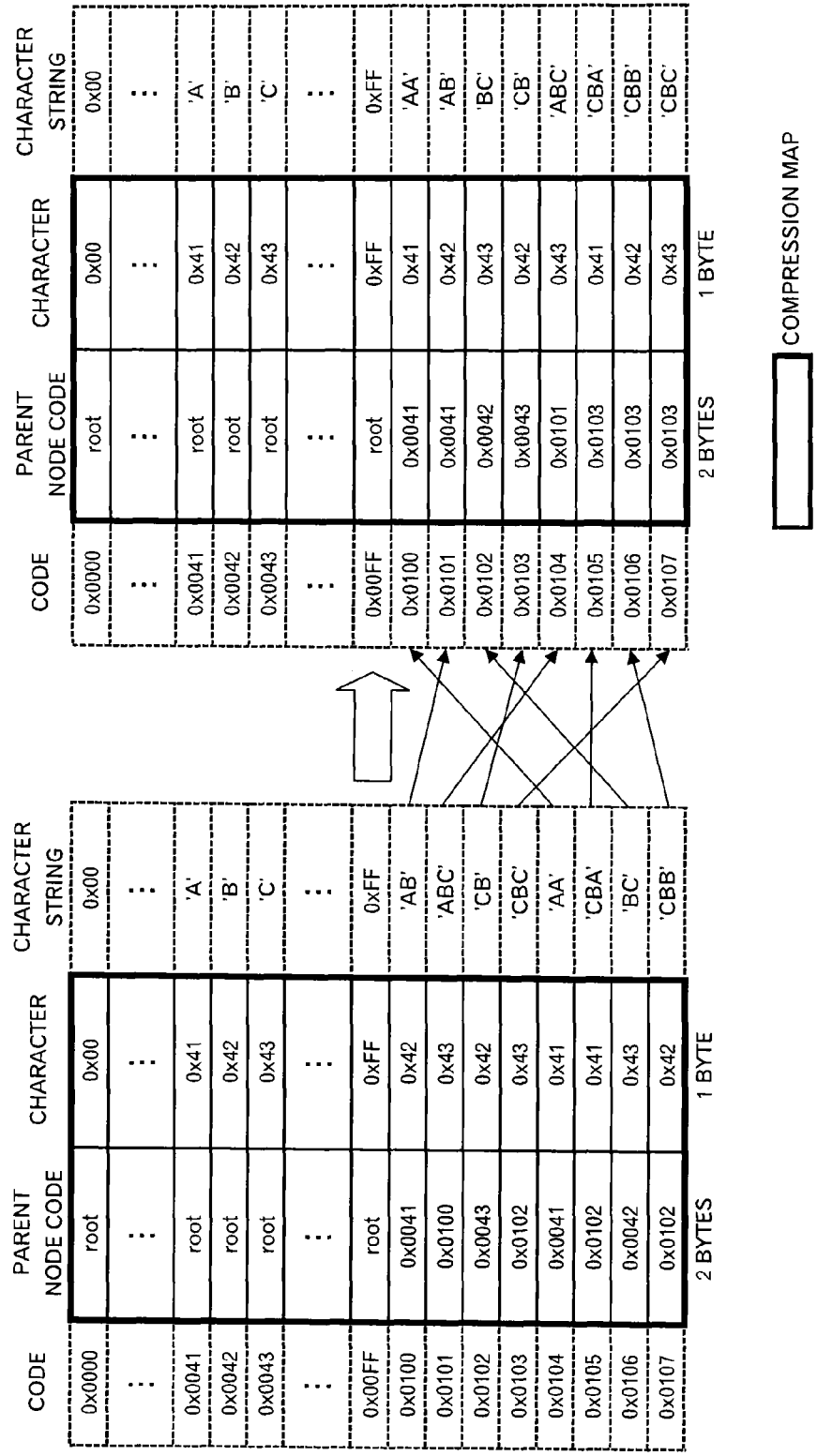
FIG. 30 is a diagram to explain a compression map.

The compression map will be explained in more detail. The compression map is data in which correlation data that correlates the code of a parent node with the character code of its own node (a character corresponding to the code of its own node, or the last character of a character string corresponding to the code of its own node) is arranged in order of the code. Actually, this compression map includes correlation data that correlates the code of the current node with the array index in an array for character appearance numbers, for which it is confirmed that any code is stored in the array for counters/child node numbers for the current node instead of the counter value. In the case of a phrase tree such as illustrated in FIG. 28, a compression map such as illustrated on the left side of FIG. 30 is generated. As described above, the codes are given in order of the appearance, so the code in the column of a parent node code is not sorted, and as a result, the character string itself that is expressed by the code is not sorted in the order of the character code. In the example in FIG. 30, the codes and character strings are illustrated, however, such data is not included in the compression map, and is supplementary information.

In this embodiment, a compression map is generated from the phrase tree, as illustrated on the right side of FIG. 30, by sorting and reassigning the codes such as described above, and arranging correlation data that correlates the code of a parent node with the character code of its own node in order of the newly reassigned codes. As can also be seen in the example in FIG. 30, the codes of the parent nodes are sorted in ascending order of the code. As a result, it is possible to carry out the binary searching of the compression map.

Figure 31:
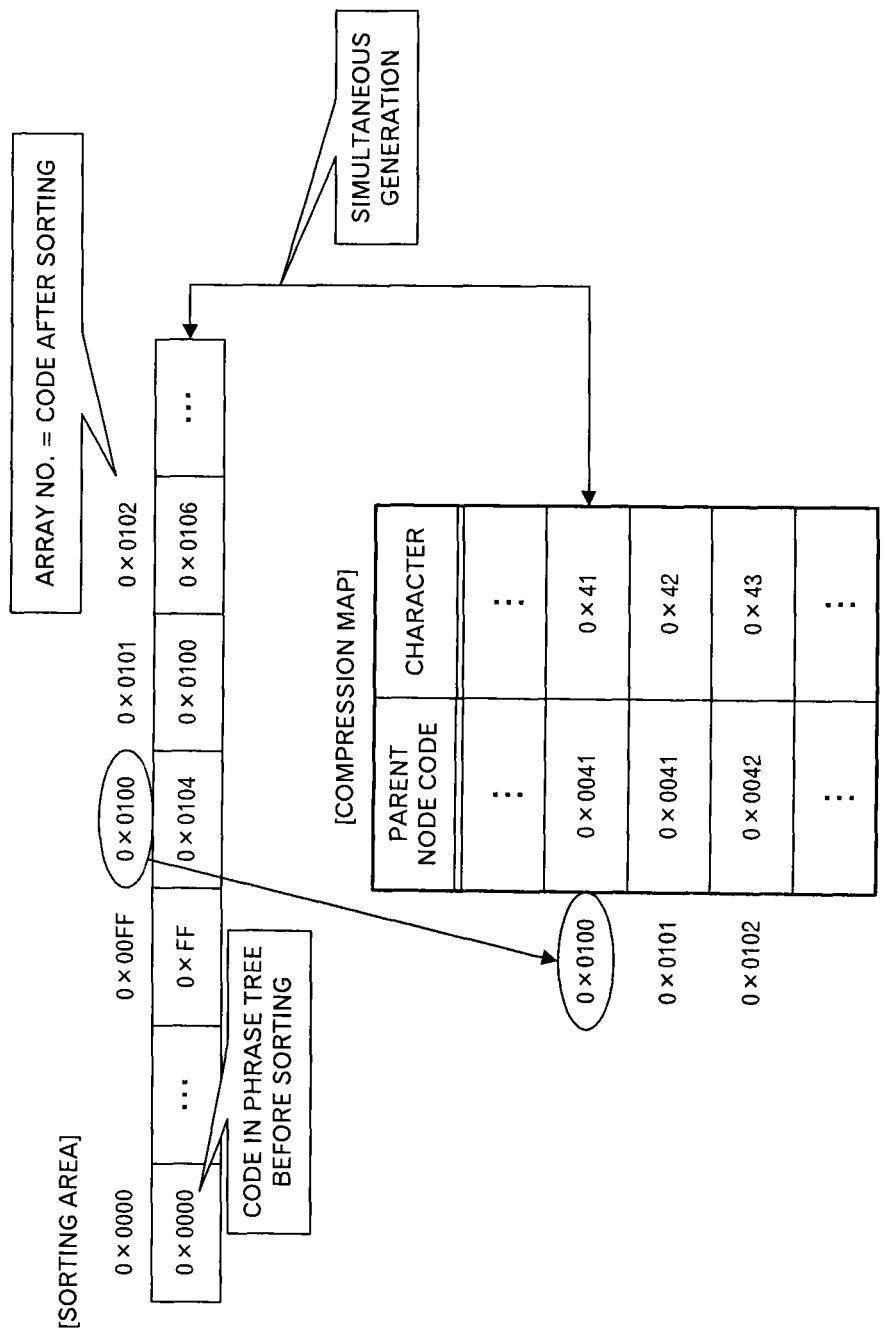
FIG. 31 is a diagram to explain generation of the compression map.

In this embodiment, in order to perform the sorting, a sorting area is adopted as illustrated in FIG. 31. In the sorting area, the code that is identified in the following processing is stored in order that the code is identified in the following processing. When doing this, the array indexes in the sorting area are the codes after sorting. In the example in FIG. 31, the code "0x0104" before sorting is firstly stored in the position of the array index "0x0100" as the code of the node in the second layer. In other words, the node of the code "0x0104" before sorting is handled as the code "0x0100" after sorting. For this node, the code of the parent node is "0x0041", and the character code represented by this node is "0x41".

The processing contents will be explained in more detail step-by-step as an example of a case where data of the phrase tree such as illustrated in FIG. 24A to FIG. 24F is obtained.

First, there is no need to sort the nodes of the codes "0x0000" to "0x00FF", so such nodes are registered in the compression map as they are. For example, data such as illustrated in FIG. 32 is registered in the compression map. The parent node is a root node, so the data "root" is registered as the code of the parent node, and the respective corresponding characters "0x00" to "0xFF" are also registered. Furthermore, as illustrated in FIG. 33, the nodes "0x0000" to "0x00FF" are registered in the sorting area in ascending order of the codes.

Figures 34, 36:
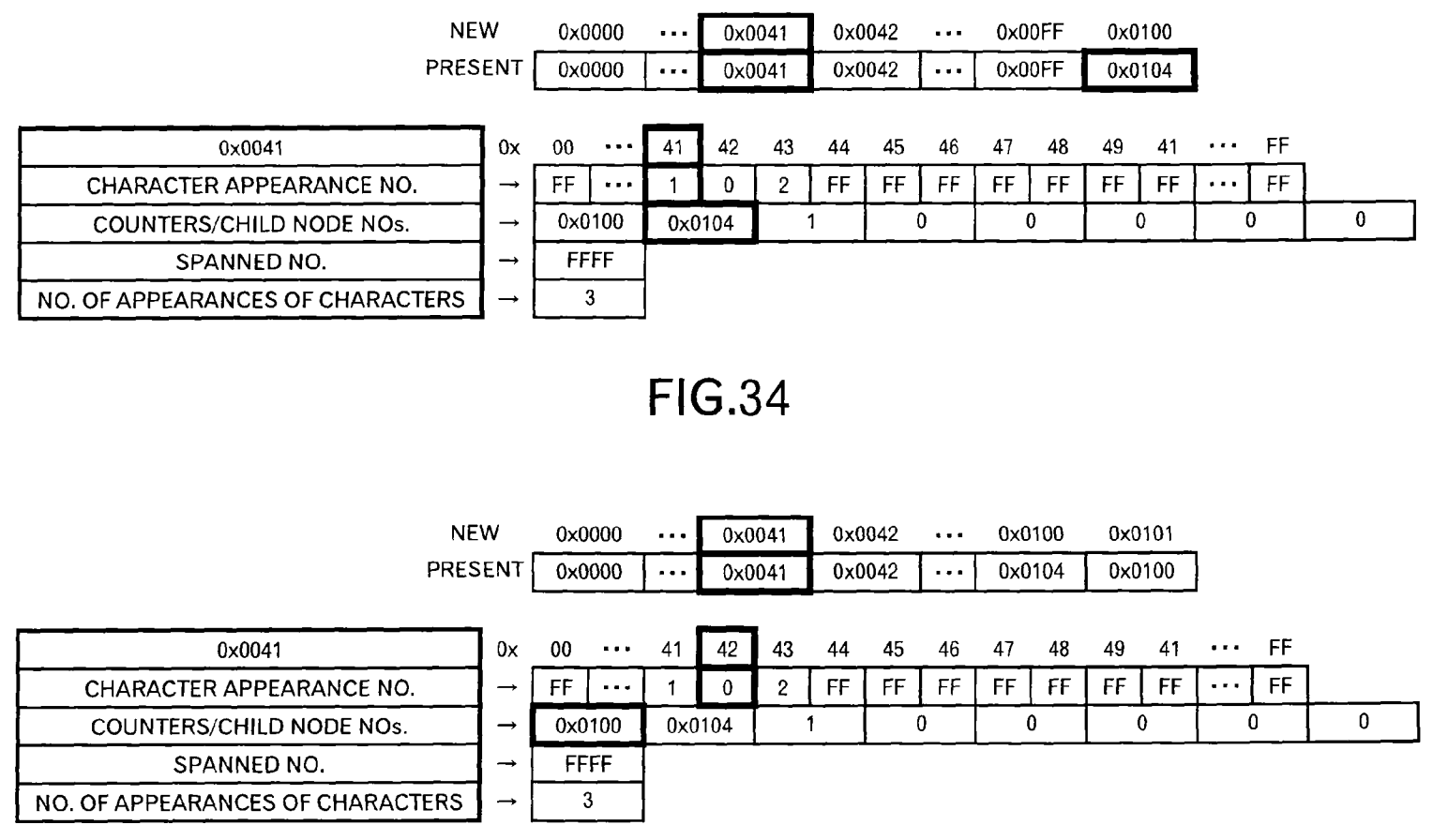

Next, the nodes of the codes registered in the sorting area are processed in ascending order of the array index (=the code after sorting). However, when there is no child node, correlation data is not registered in the compression map, so an explanation of the processing up to the code "0x0040" is omitted as illustrated in the phrase tree illustrated in FIG. 25. As illustrated in FIG. 34, when the array index "0x0041" is to be processed, the data block of the code "0x0041" is referenced, to search for the position where any value other than "0xFF" is stored in sequence from the array index "0x00" of that array for character appearance numbers. In this example, the appearance sequential number "1" is registered in "0x41"-th array area, so "1st" array area in the array for counters/child node numbers is referenced. As a result, the code "0x0104", which is equal to or greater than "0x100", is registered, so "0x0104" is registered in the last end "0x0100" in the sorting area. Furthermore, as illustrated in FIG. 35, in the compression map, correlation data that correlates the code after sorting of the parent node "0x0041" with character code that corresponds to array index "0x41" in the array for character appearance numbers is registered in "0x100"-th array area, which corresponds to the code after sorting.

Moreover, as illustrated in FIG. 36, the appearance sequential number "0" is registered in "0x42"-th array area in the array for character appearance numbers in the data block of the code "0x0041", so the "0"-th value in the array for counters/child node numbers is referenced. As a result, the code "0x0100", which is equal to or greater than "0x100" is registered, so "0x0100" is registered in the last end "0x0101" of the sorting area. Furthermore, in the compression map, as illustrated in FIG. 37, correlation data that correlates the code after sorting of the parent node "0x0041" with the character code that corresponds to the array index "0x42" in the array for character appearance numbers is registered in "0x101"-th array area, which corresponds to the code after sorting.

Figures 38, 39:
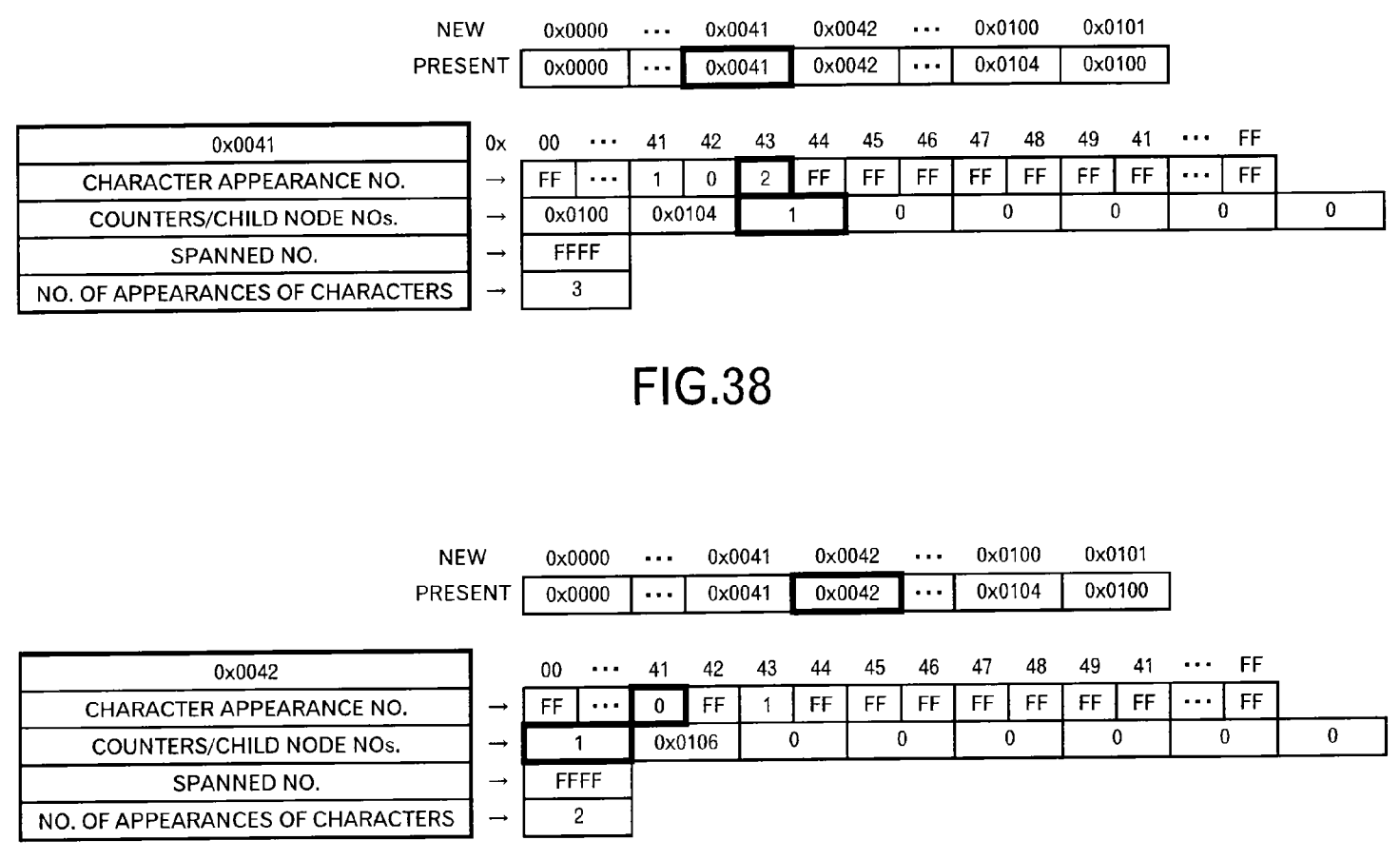

Furthermore, as illustrated in FIG. 38, the appearance sequential number "2" is registered in "0x43"-th array area in the array for character appearance numbers in the data block of the code "0x0041", so the "2nd" array area in the array for counters/child node numbers is referenced. As a result, a value "1" that is less than "0x100" is registered, so the correlation data is not registered in the compression map. Correlation data is not registered in the compression map even though the processing is performed for the subsequent array indexes in the array for character appearance numbers.

Next, as illustrated in FIG. 39, when the array index "0x0042" is processed, the data block of the code "0x0042" is referenced to search for the position where any value other than "0xFF" is registered in sequence from the array index "0x00" in the array for character appearance numbers. In this example, the appearance sequential number "0" is registered in the "0x41"-th array area, so the "0"-th array area is referenced in the array for counters/child node numbers. As a result, a value "1" that is less than "0x100" is registered, so correlation data is not registered in the compression map.

Moreover, "0xFF" is registered in the "0x42"-th array area in the array for character appearance numbers in the data block of the code "0x0042", so data is not registered in the compression map.

Figures 40, 42:
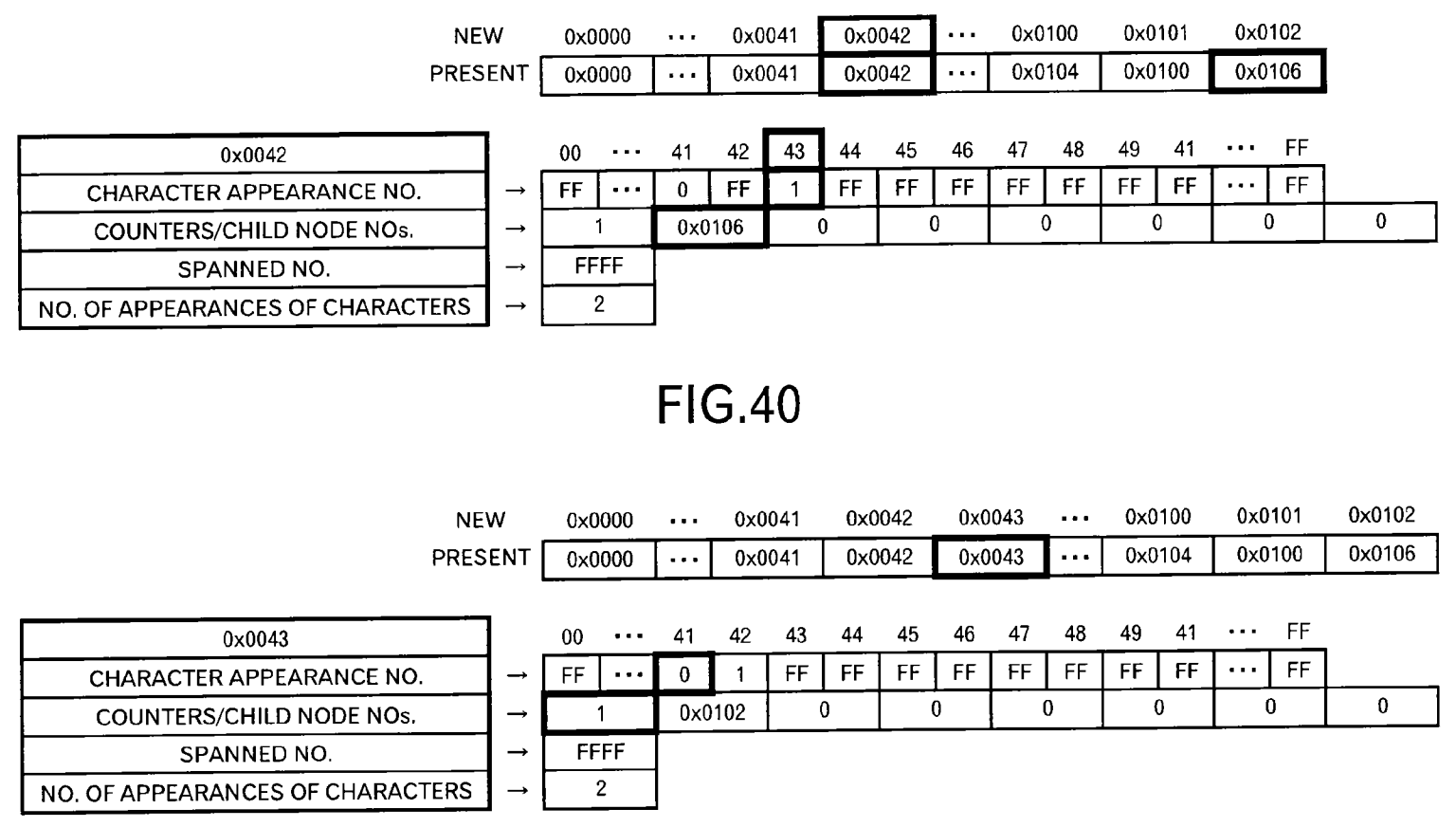

Furthermore, as illustrated in FIG. 40, the appearance sequential number "1" is registered in "0x43"-th array area in the array for character appearance numbers in the data block of the code "0x0042", so "1st" array area in the array for counters/child node numbers is referenced. As a result, the code "0x0106", which is equal to or greater than "0x100" is registered, so "0x106" is registered in the last end "0x0102" in the sorting area. Furthermore, in the compression map, as illustrated in FIG. 41, correlation data that correlates the code after sorting of the parent node "0x0042" with the character code that corresponds to the array index "0x43" in the array for character appearance numbers is registered in "0x102"-th array area, which corresponds to the code after sorting. Even though the processing is performed for the subsequent array indexes in the array for character appearance numbers, correlation data will not be registered in the compression map.

Next, as illustrated in FIG. 42, when the array index "0x0043" is processed, the data block of the code "0x0043" is referenced to search for the position where any value other than "0xFF" is registered in sequence from the array index "0x00" in the array for character appearance numbers. In this example, the appearance sequential number "0" is registered in the "0x41"-th array area, so the "0"-th array area is referenced in the array for counters/child node numbers. As a result, a value "1" that is less than "0x100" is registered, so correlation data is not registered in the compression map.

Figures 43, 45:
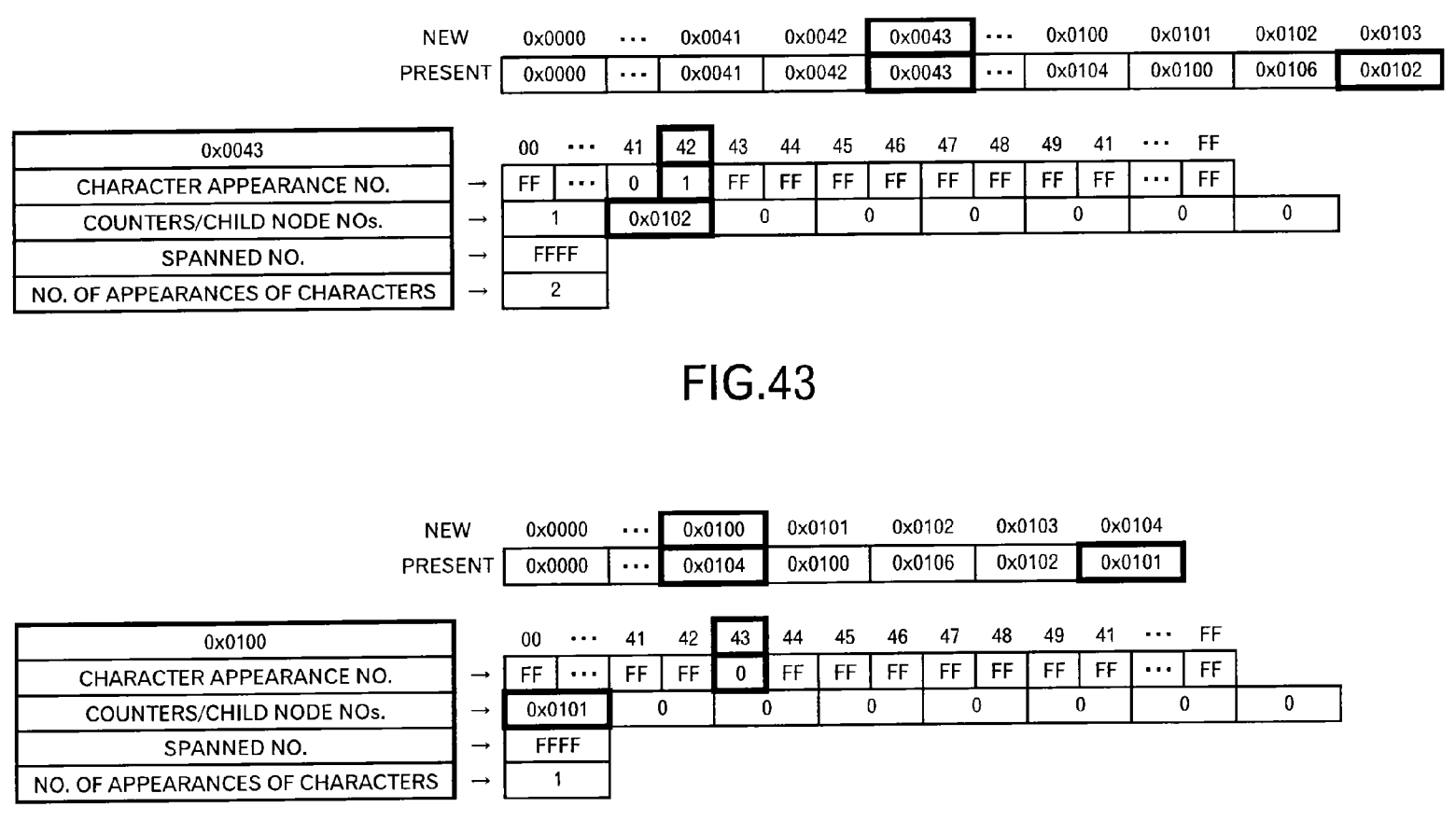

Furthermore, as illustrated in FIG. 43, the appearance sequential number "1" is registered in the "0x42"-th array area in the array for character appearance numbers in the data block of the code "0x0043", so "1st" array area in the array for counters/child node numbers is referenced. As a result, the code "0x0102", which is equal to or greater than "0x100", is registered, so "0x102" is registered in the last end "0x0103" in the sorting area. Furthermore, in the compression map, as illustrated in FIG. 44, correlation data that correlates the code after sorting of the parent node "0x0043" with the character code that corresponds to the array index "0x42" in the array for character appearance numbers is registered in "0x103"-th array area, which corresponds to the code after sorting. Even though the processing is performed for the subsequent array indexes in the array for character appearance numbers, correlation data will not be registered in the compression map.

Even when the data block of the code "0x0044" after sorting is processed, data will not be registered in the compression map, and even when all of the data blocks up to the code "0x00FF" after sorting are processed, data will not be registered in the compression map.

Moreover, as illustrated in FIG. 45, when the array index "0x0100" is processed, the data block of the code "0x0100" is referenced to search for the position where any value other than "0xFF" is stored in sequence from the array index "0x00" in the array for character appearance numbers. In this example, the appearance sequential number "0" is registered in the "0x43"-th array area, so "0"-th array area in the array for counters/child node numbers is referenced. As a result, the code "0x0101", which is equal to or greater than "0x100", is registered, so "0x0101" is registered in the last end "0x0104" in the sorting area. Furthermore, in the compression map, as illustrated in FIG. 46, correlation data that correlates the code after sorting of the parent node "0x0100" with the character code that corresponds to the array index "0x43" in the array for character appearance numbers is registered in "0x104"-th array area, which corresponds to the code after sorting. Even though the processing may be performed for the subsequent array indexes in the array for character appearance numbers, correlation data will not be registered in the compression map.

Moreover, even though the processing for the data blocks up to the code "0x0101" after sorting are processed, data will not be registered in the compression map.

Figure 47:
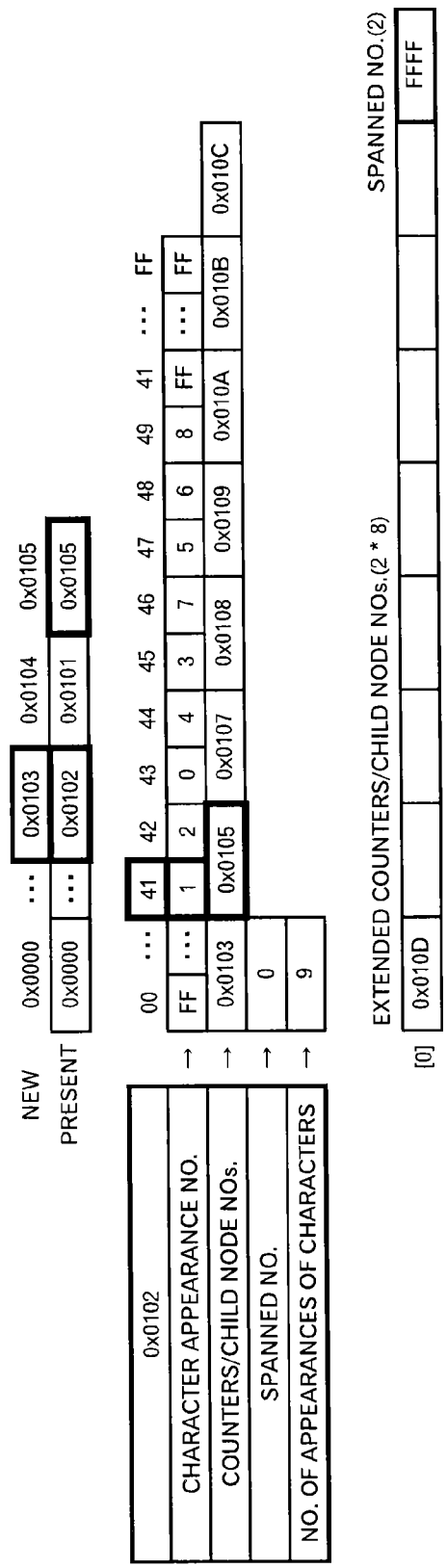
FIG. 47 is a diagram to explain the compression map generation processing.

Moreover, as illustrated in FIG. 47, when the array index "0x0102" is processed, the data block of code "0x0102" is referenced to search for the position where any value other than "0xFF" is registered in sequence from the array index "0x00" in that array for character appearance numbers. In this example, the appearance sequential number "1" is registered in the "0x41"-th array area, so the "1st" array area in the array for counters/child node numbers is referenced. As a result, the code "0x0105", which is equal to or greater than "0x100", is registered, so "0x0105" is registered in the last end "0x0105" in the sorting area. Furthermore, in the compression map, as illustrated in FIG. 48, correlation data that correlates the code after sorting of the parent node "0x0103" with the character code that corresponds to the array index "0x41" in the array for character appearance numbers is registered in the "0x105"-th array area, which corresponds to the code after sorting. For this data block, when the processing may is performed for the subsequent array indexes in the array for character appearance numbers, correlation data is added in smooth to the compression map.

Figure 49:
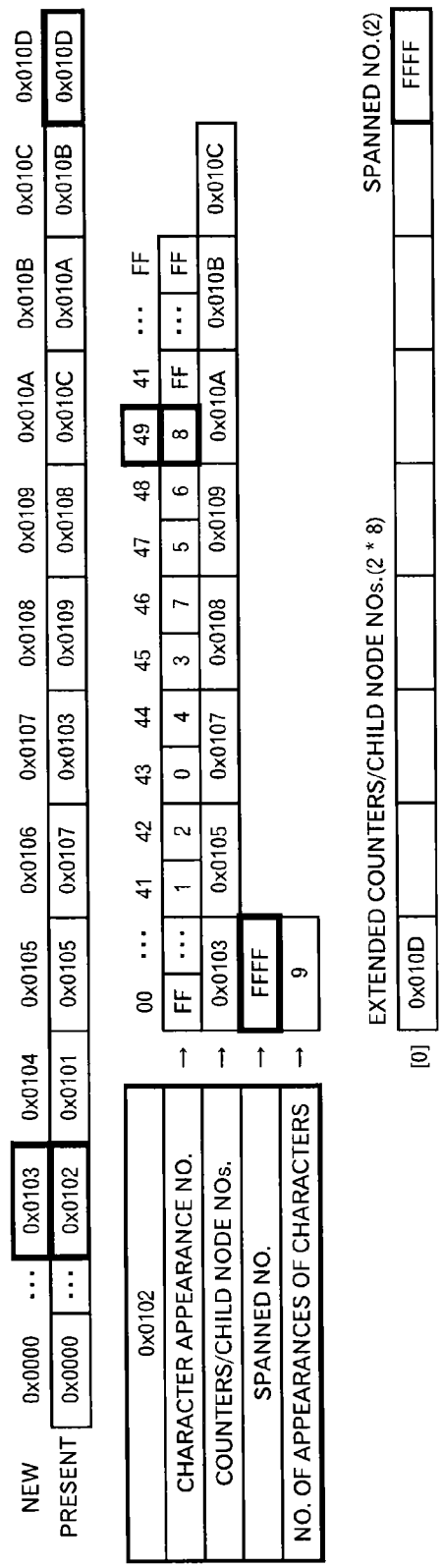
FIG. 49 is a diagram to explain the compression map generation processing.

Then, as illustrated in FIG. 49, the appearance sequential number "8" is registered in the "0x49"-th array area in the array for character appearance numbers in the data block of the code "0x0102", so the "0"-th array area in the array for extended counters/child node numbers is referenced. As a result, the code "0x010D", which is equal to or greater than "0x100" is registered, so "0x010D" is registered in the last end "0x010D" in the sorting area. Furthermore, in the compression map, as illustrated in FIG. 50, correlation data that correlates the code after sorting of the parent node "0x0103" with the character code that corresponds to the array index "0x49" in the array for character appearance numbers is registered in the "0x10D"-th array area, which corresponds to the code after sorting. Even though the processing may be performed for the subsequent array indexes, correlation data will not be registered in the compression map. In the following processing, data is not registered in the compression map, so an explanation is omitted.

Next, the compression map generation processing will be explained using FIG. 51 and FIG. 52.

Figure 51:
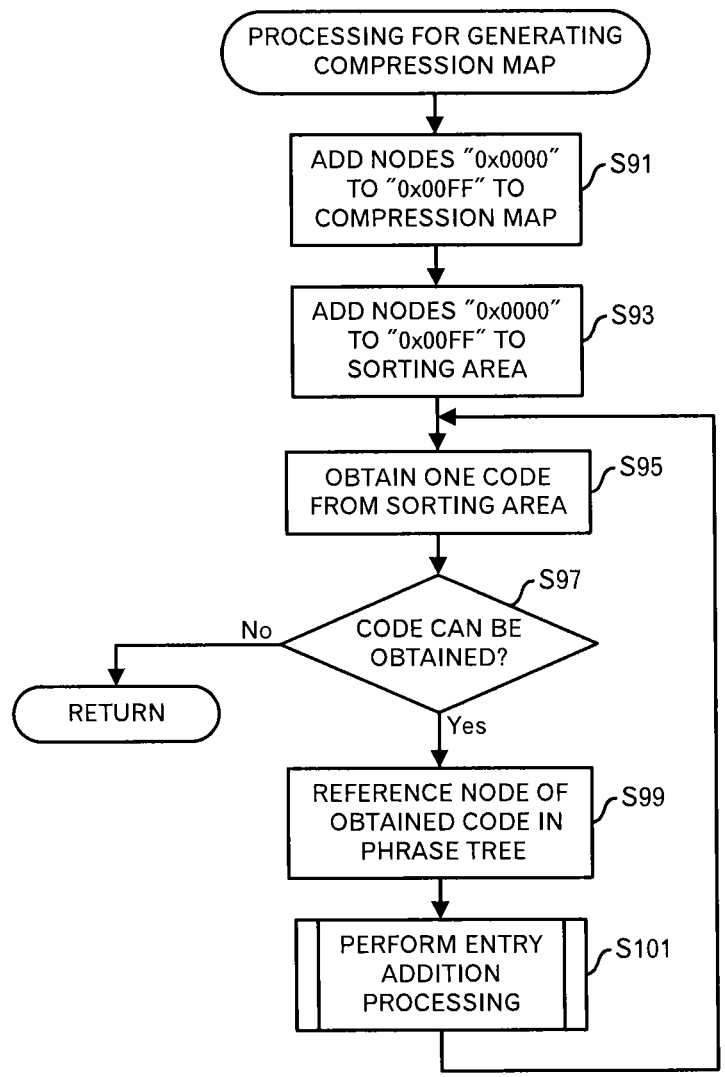
FIG. 51 is a diagram to explain the compression map generation processing.

The compression map generator 120 adds correlation data that correlates the data "root", which expresses a root node, with the character code, which corresponds to the code of the node, as data for the nodes "0x0000" to "0x00FF" in the first layer to the compress ion map in sequence (FIG. 51, step S91). Moreover, the compression map generator 120 adds the codes of the nodes "0x0000" to "0x00FF" in the first layer to the sorting area in sequence (step S93). Then, the compression map generator 120 reads one unprocessed code in ascending order of the code after sorting from the sorting area (step S95). Here, when it is not possible to read any unprocessed code (step S97: NO route), the processing returns to the processing of the calling source.

On the other hand, when it is possible to read any unprocessed code (step S97: YES route), the compression map generator 120 references the data block of the node of the read code in the phrase tree (step S99). The compression map generator 120 then performs an entry addition processing (step S101). This entry addition processing will be explained using FIG. 52. After the entry addition processing has completed, the processing returns to the step S95.

Next, the processing flow of the entry addition processing will be explained.

Figure 52:
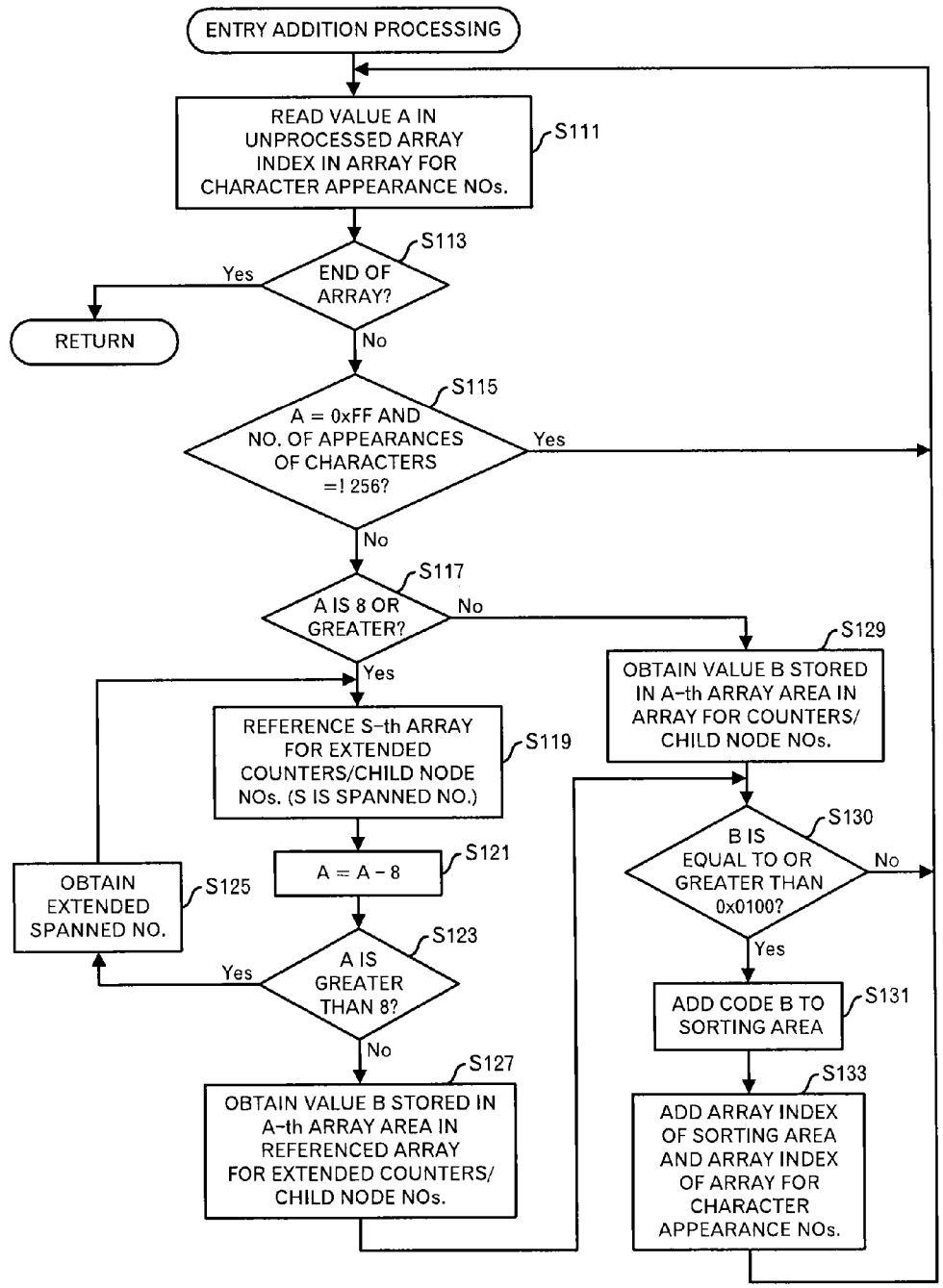
FIG. 52 is a diagram depicting a processing flow of an entry addition processing.

The compression map generator 120 reads the value A in the array area of the unprocessed index in the array for character appearance numbers in the data block for the node of the read code in ascending order of the index (FIG. 52: step S111). Here, the compression map generator 120 determines whether the processing has already been performed to the end of the array for character appearance numbers (step S113). When the processing has already been performed to the end of the array for character appearance numbers, the processing returns to the processing of the calling source.

On the other hand, when the processing has not been performed to the end of the array for character appearance numbers, the compression map generator 120 determines whether a condition that the obtained value A is 0xFF and the number of appearances of characters is not 256 is satisfied (step S115). When this condition is satisfied, the code is not registered in the array for counters/child node numbers, so the processing returns to the step S111.

On the other hand, when the value A does not satisfy the condition described above, the compression map generator 120 determines whether the value A is 8 or greater (step S117). When the value A is 8 or greater, the array for extended counters/child node numbers is used, so the compression map generator 120 reads the value of the spanned number, and references the array for extended counters/child node numbers for the spanned number (this may also be the extended spanned number) (step S119). Moreover, the compression map generator 120 subtracts 8 from the value A (step S121). The compression map generator 120 then determines whether the value A is greater than 8 (step S123). When the value A is still greater than 8, the compression map generator 120 obtains the value C of the extended spanned number that is stored at the tail end of the array for extended counters/child node numbers (step S125). The processing then returns to the step S119.

On the other hand, when the value A is equal to or less than 8, the compression map generator 120 reads the value B that is stored in the A-th array area in the referenced array for extended counters/child node numbers (step S127). The processing then moves to step S130.

On the other hand, when the value A is less than 8 from the beginning, the compression map generator 120 reads the value B that is stored in the A-th array area in the array for counters/child node numbers (step S129).

The compression map generator 120 then determines whether the obtained value B is equal to or greater than "0x0100" (step S130). When the obtained value B is less than "0x0100", data will not be added to the compression map, so the processing returns to the step S111. However, when the obtained value B is equal to or greater than "0x0100", the compression map generator 120 adds the code B to the tail end of the sorting area (step S131). In addition, the compression map generator 120 adds correlation data that correlates the array index in the sorting area, which is the target of the processing, with the array index, which is the target of the processing, in the array for character appearance numbers to the compression map (step S133). The processing then returns to the step S111.

By performing the processing described above, the processing explained by using the aforementioned specific example above is performed. Moreover, with a compression map that is generated in this way, the compression map can be stored on a disk unit as it is, and can be used in the compression processing or decompression processing.

Next, the compression processing that uses the compression map will be explained using FIG. 53 to FIG. 55.

Figure 53:
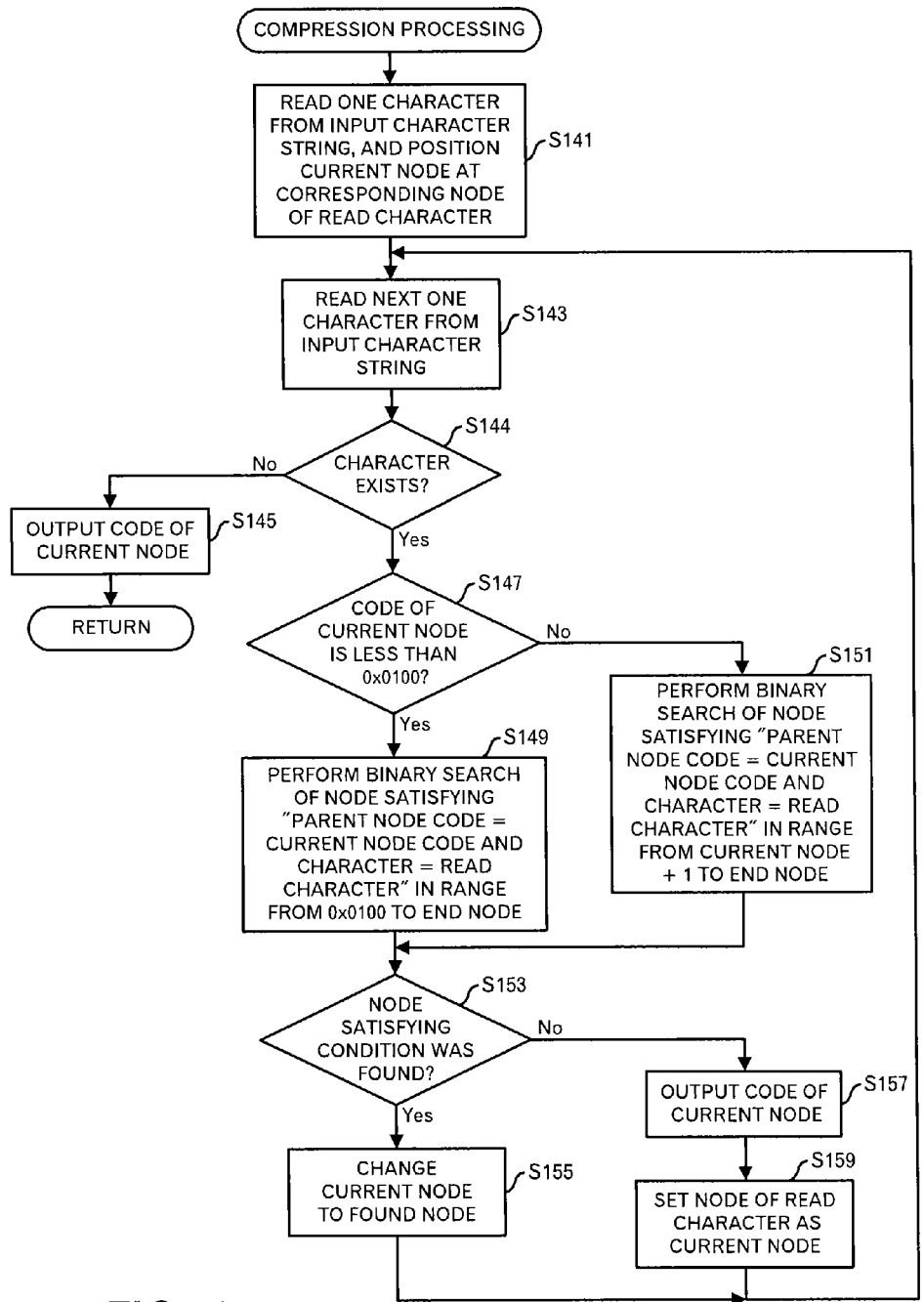
FIG. 53 is a diagram depicting a processing flow of a compression processing.

The compression processing unit 140 acquires one character from the input character string that is the target of the compression, and moves the current node at the code that corresponds to that character in the compression map (FIG. 53: step S141). The compression processing unit 140 also obtains the next one character from the input character string (step S143). Here, the compression processing unit 140 determines whether a character was able to be obtained at the step S143 (step S144). When a character can be obtained, the compression processing unit 140 determines whether the code of the current node is less than "0x0100" (step S147).

When the code of the current node is less than "0x0100", the compression processing unit 140 performs a binary search of the compression map in a range from the code "0x0100" to the last node to find a node satisfying a condition that "the parent node code in the map=the code of the current node, and the character code in the map=the obtained character" (step S149). The processing then moves to step S153.

On the other hand, when the current node is equal to or greater than "0x0100", the compression processing unit 140 performs a binary search of the compression map in a range from (the code of the current node+1) to the last node to find a node satisfying a condition that "the parent node code in the map=the code of the current node, and the character code in the map=the obtained character" (step S151). The processing then moves to step S153.

Moving to the processing of the step S153, the compression processing unit 140 determines whether the node satisfying the aforementioned condition was found in the binary search (step S153). When the node satisfying the aforementioned condition was not found, the compression processing unit 140 outputs the code of the current node as the compression result (step S157), and sets the node of the character obtained at the step S143 as the current node (step S159). The processing then returns to the step S143. On the other hand, when the node satisfying the condition was found, the compression processing unit 140 changes the current node to that node (step S155). The processing then returns to the step S143.

When any character could not be obtained at the step S143, the compression processing unit 140 outputs the code of the current node as the compression result (step S145). The processing then returns to the processing of the calling source.

The compression of a character string is performed by performing the aforementioned processing.

For example, the processing in the case in which a compression map such as illustrated in FIG. 54 is generated, and a character string "ABCAA" is inputted as the target of compression will be explained in detail.

First, when processing "A" of the input character string "ABCAA", "0x0041" is set as the current node ("1" in FIG. 55). Next, when processing "B" in "ABCAA", a binary search is performed in a range from the code "0x0100" to "0x0107" to find a node satisfying a condition "the parent node code=0x0041, and character code=0x42". As a result, it is found that the code "0x0101" is the corresponding node, so "0x0101" is set as the current node ("2" in FIG. 55).

Moreover, when processing "C" in "ABCAA", a binary search is performed in a range from the code "0x0102" to "0x0107" to find a node satisfying a condition that "the parent node code=0x0101, and the character code=0x43". As a result, it is found that the code "0x0104" is the corresponding node, so "0x0104" is set as the current node ("3" in FIG. 55). Furthermore, when processing second "A" in "ABCAA", a binary search is performed in a range from the code "0x0105" to "0x0107" to find a node satisfying a condition "the parent node code=0x0104, and the character code=0x41". Then, because no node satisfying the condition is found, the code "0x0104" of the current node is added to the compression result ("4" in FIG. 55). The node of the code "0x0041" that corresponds to the character code "0x041" is set as the current node.

Furthermore, when processing third "A" in "ABCAA", a binary search is performed in a range from the code "0x0100" to "0x0107" to find a node satisfying a condition that "the parent node code=0x0041, and the character code=0x41". As a result, it is found that the code "0x0100" is the corresponding node, so "0x0100" is set as the current node ("5" in FIG. 55). With that, all of the characters of the input character string have been processed, so the code "0x0100" of the current node is outputted, and the processing ends ("6" in FIG. 55).

In this way, it is possible to perform the compression processing.

Figure 56:
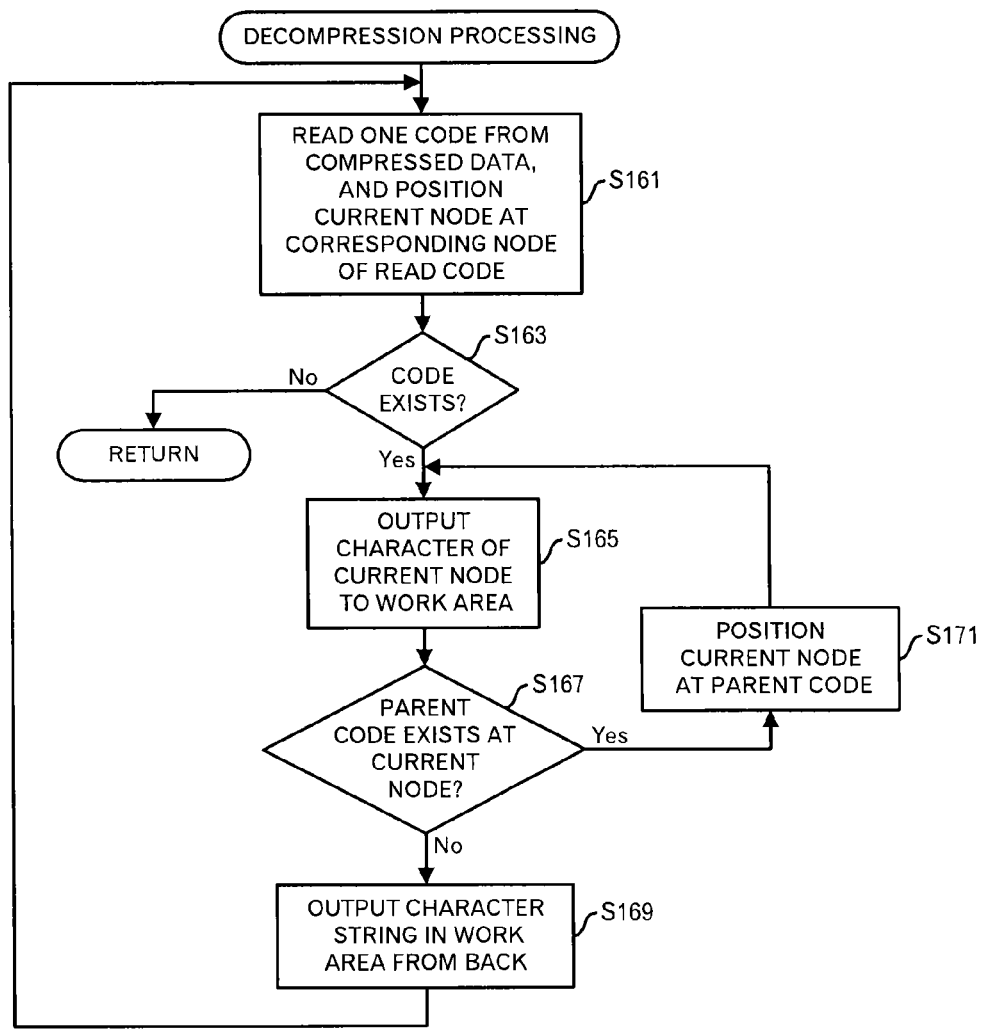
FIG. 56 is a diagram depicting a processing flow of a decompression processing.

Next, the processing flow of the decompression processing will be explained using FIG. 56 and FIG. 57. First, the decompression processing unit 150 reads one unprocessed code from compressed data, and sets the corresponding node in the compression map as the current node (FIG. 56: step S161). At the step S161, when it is not possible to acquire any code, the processing returns to the processing of the calling source (step S163: NO route). However, when a code can be acquired (step S163: YES route), the decompression processing unit 150 outputs the character of the current node to a work area (step S165). The decompression processing unit 150 then determines whether the code of the parent node is included in the current node (step S167). When the code of the parent node is a root, it is determined that the code of the parent node does not exist. When there is no code of the parent node, the decompression processing unit 150 outputs the character string in the work area starting from the back as the decompression result (step S169). The processing then returns to the step S161. On the other hand, when there is a code of the parent node, the decompression processing unit 150 positions the code of the parent node at the current node (step S171). The processing then returns to the step S165.

By performing such a processing, it is possible to decompress codes to a character string.

For example, the case in which the codes "0x0104, 0100" are inputted as compressed data will be explained using a compression map such as illustrated in FIG. 54.

First, the node of the code "0x0104" is set as the current node, and the character "C" at the current node is outputted to the work area. The code of the parent node is "0x0101", so as the current node, the node of the code "0x0101" is set ("1" in FIG. 57). The character "B" in the code "0x0101" of the current node is then outputted to the work area. Furthermore, the code of the parent node is "0x0041", so as the current node, the node of the code "0x0041" is set ("2" in FIG. 57).

Then, the character "A" of the code "0x0041" for the current node is outputted to the work area. However, there is no parent node, so by outputting the characters of the work area in reverse order, "ABC" is obtained.

Next, by reading the new code "0x0100", this node is set as the current node, and the character "A" at the node of that code is outputted to the work area. The code of the parent node is "0x0041", so as the current node, the node of the code "0x0041" is set ("4" in FIG. 57). Then, the character "A" at the current node is outputted to the work area. Here, there is no code of the parent node at the current node, so the character string in the work area is outputted in reverse order, and "AA" is further obtained. The decompression processing is then complete ("5" in FIG. 57).

The data structure of the phrase tree is changed in this way, so it is possible to reduce the memory capacity that is used during the processing.

It is also possible to perform the compression processing using the data of the phrase tree without generating the compression map.

For example, an example of the processing contents of compressing the character string "ABCAA" using the data of the phrase tree depicted in FIG. 24A to FIG. 24F will be explained.

As illustrated in FIG. 58, when reading "A" in "ABCAA", the node of the code "0x0041" that corresponds to the character "A" is set as the current node. Furthermore, when "B" in "ABCAA" is read, the value "0" in the "0x42 (B)"-th array area in the array for character appearance numbers is obtained, and the value of the appearance sequential number "0" in the array for counters/child node numbers is read. In this case, the code "0x0100" is obtained. In the case of the code "0x0100", the node corresponding to this code is set as the current node.

Next, as illustrated in FIG. 59, when "C" in "ABCAA" is read, the value "0" in the "0x43 (C)"-th array area in the array for character appearance numbers is obtained, and the "0"-th value, which corresponds to the appearance sequential number "0", in the array for counters/child node numbers is read. Here, the code "0x0101" is obtained. In the case of the code "0x0101", the node of this code is set as the current node.

Figures 60, 61:
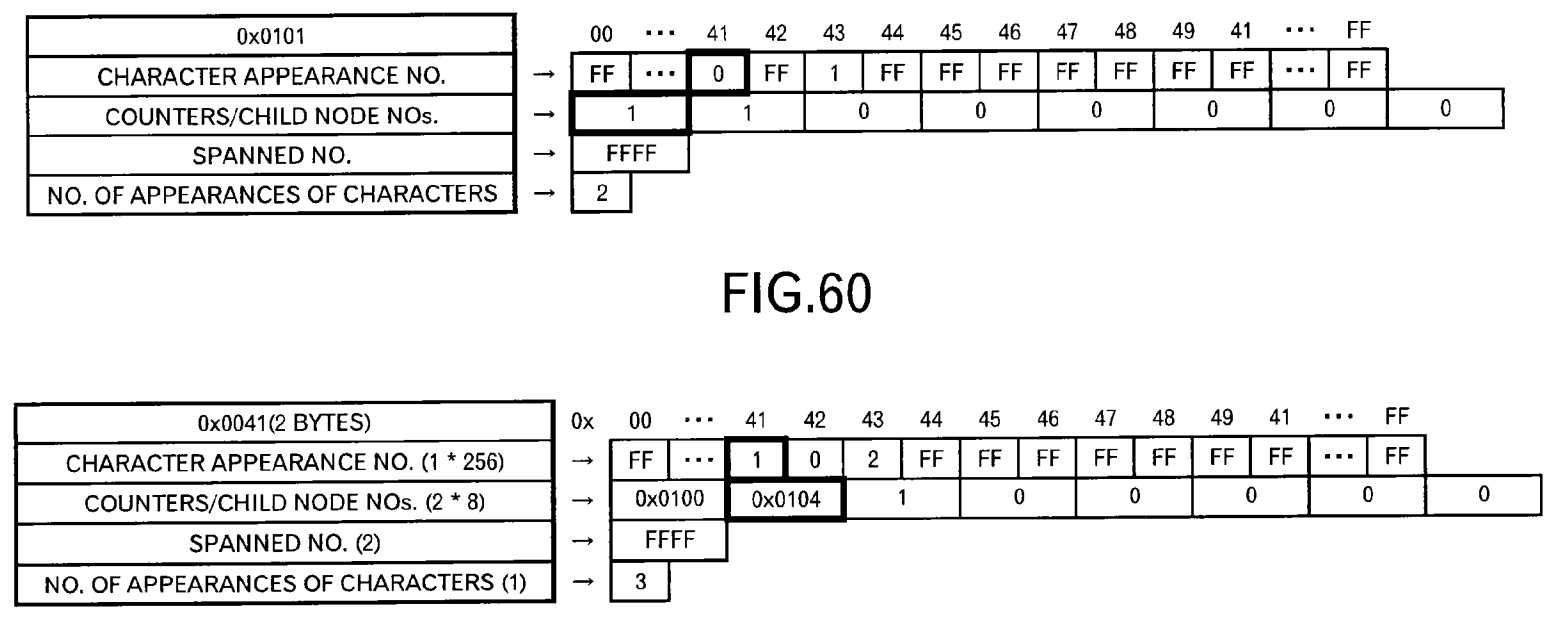

Moreover, when second "A" in "ABCAA" is read, as illustrated in FIG. 60, the value "0" in the "0x41 (A)"-th array area in the array for character appearance numbers is obtained, and the "0"-th value, which corresponds to the appearance sequential number "0", in the array for counters/child node numbers is read. As a result, the read value is less than the code "0x0100", so the code "0x0101" of the current node is outputted as the compression result.

Furthermore, when third "A" in "ABCAA" is read, as illustrated in FIG. 61, the value "1" in the "0x41 (A)"-th array area in the array for character appearance numbers is obtained, and the value in the "1st" array area, which corresponds to the appearance sequential number "1", in the array for counters/child node numbers is read. As a result, the code "0x0104" is obtained. Here, the input character string ends, so the code "0x0104" is also outputted as the compression result. In doing so, finally "0x0101" and "0x0104" are outputted as the compression result.

Moreover, it is possible to decompress the compressed data using the data of the phrase tree. Here, an example of the processing contents of decompressing the code "0x0101" and "0x0104" using the data of the phrase tree depicted in FIG. 24A to FIG. 24F will be explained.

First, as illustrated in FIG. 62, the node that includes the code "0x0101" in the array for counters/child node numbers is searched for. As a result, this time, the appearance sequential number "0" in the node of the code "0x0100" is identified. Then, the array index whose array area registers "0" in the array for character appearance numbers is searched for, and the code "0x43" is obtained. This character code "0x43" is outputted to the work area.

Next, as illustrated in FIG. 63, the node that includes the code "0x0100" in the array for counters/child node numbers is searched for. As a result, this time, the appearance sequential number "0" in the node of the code "0x0041" is identified. After that, the array index whose array area stores "0" in the array for character appearance numbers is searched for, and the code "0x42" is obtained. This character code "0x42" is outputted to the work area.

Next, the code "0x0041" is searched for, however, it is less than the code "0x0100". Therefore, the character "0x41" that corresponds to the code "0x0041" is outputted to the work area.

Figure 64:
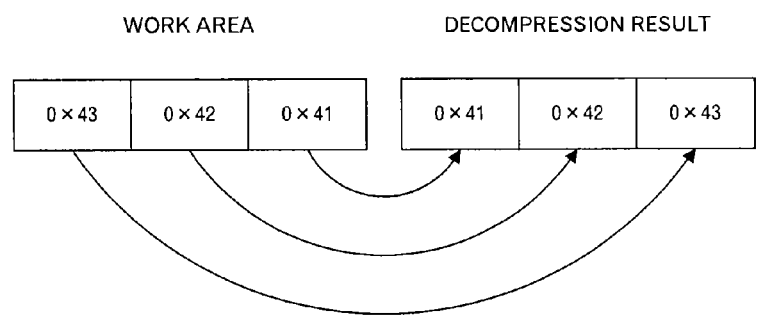
FIG. 64 is a diagram to explain a processing when decompressing using the data structure of the phrase tree.

As a result, as illustrated in FIG. 64, the order of the characters in the work area is reversed, and "0x41", "0x42" and "0x43" are outputted as the decompression result.

Figure 65:
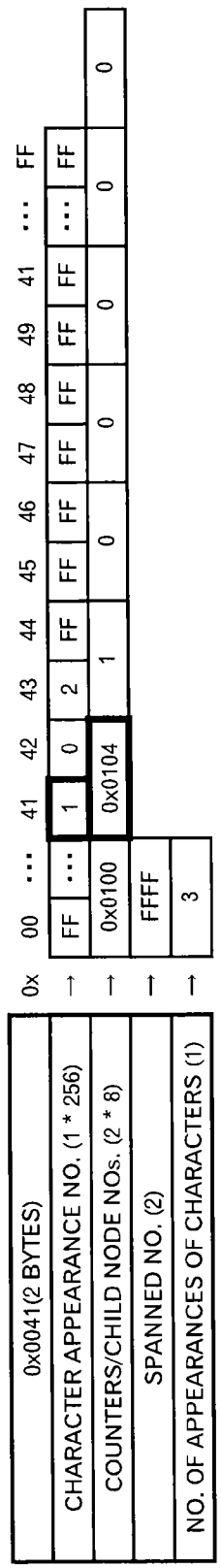
FIG. 65 is a diagram to explain a processing when decompressing using the data structure of the phrase tree.

Next, as illustrated in FIG. 65, the node that includes the code "0x0104" in the array for counters/child node numbers is searched for. As a result, this time, the appearance sequential number "1" in the node of the code "0x0041" is identified. After that, the array index whose array area stores "1" in the array for character appearance numbers is searched for, and the code "0x41" is obtained. This character code "0x41" is outputted to the work area.

Furthermore, the code "0x0041" is searched for, however, as described above, the code is less than the code "0x0100", so the character "0x41" that corresponds to the code "0x0041" is outputted to the work area.

As a result, as illustrated in FIG. 66, the order of the characters in the work area is reversed, and "0x41" and "0x41" are added to the decompression result. In this way, "ABCAA" is obtained.

Embodiment 2

In this embodiment, in order to improve the processing speed of the compression processing, the data structure of the compression map is changed.

More specifically, the maximum node number of the child nodes (i.e. the maximum code of the child nodes) is held for each node. In the compression processing, even at the step S149 or step S151, a node that has the current node as the parent node is searched for. In other words, child nodes of the current node are searched for. However, the search range at the step S149 is from "0x0100" to the last node, and at the step S151, the search range is from (the code of the current node+1) to the last node.

Figures 67, 68:
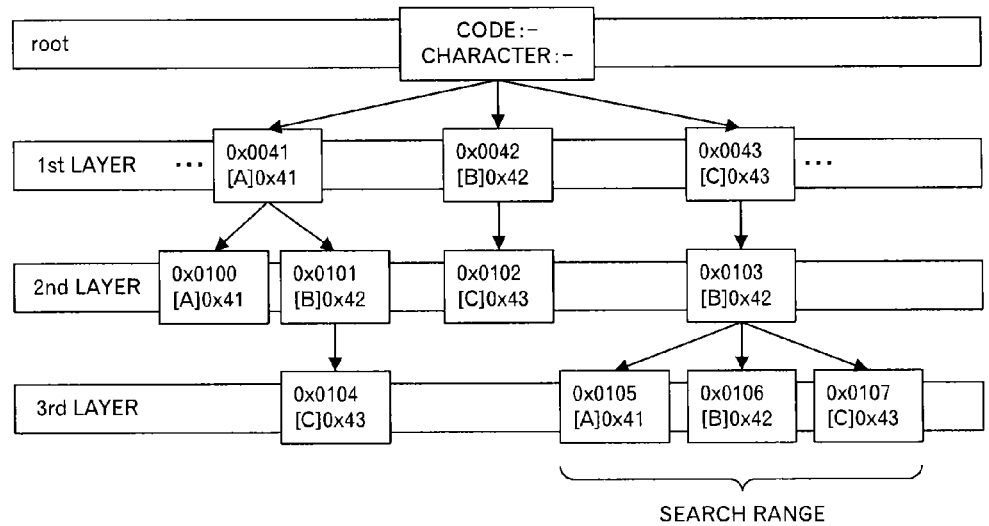
FIG. 67 is a diagram representing a phrase tree for explanation of a second embodiment.
FIG. 68 is a schematic diagram of a compression map in the second embodiment.

In the phrase tree that is schematically illustrated in FIG. 67, for example, when the current node is a node of "0x0103", the search range of the child nodes is actually the nodes of "0x0105" to "0x0107", however, in the first embodiment, the node of "0x0104" was also the target of the search. In this example, only one node is extra, however, actually, there is a bad influence when there are plural child nodes for "0x0100", "0x0101" and "0x0102". Moreover, when "0x0101" is the current node, only "0x0104" is a child node, however, in the first embodiment, the search range is from "0x0102" to "0x0107".

On the other hand, by holding the maximum child node code for each node, it becomes possible to narrow down the search range to be from the node of {the maximum child node code+1} of the node immediately before the current node to the maximum child node of the current node. In the case where there are no child nodes, the maximum child node code of the node corresponding to {the code of that node−1} is copied.

By holding the maximum child node code for each node in this way, when the current node is "0x0103", "0x0107" is identified as the maximum child node code of the current node. Furthermore, "0x0105", which is calculated by adding "1" to the maximum child node code "0x0104" of a node "0x0102" (="0x0103"−1) immediately before the current node code "0x0103", is obtained, so the search range can be efficiently identified as "0x0105" to "0x0107".

More specifically, as illustrated in FIG. 68, the compression map is changed to a form that correlates the code of the parent node, the character code and the maximum code of child nodes.

Figure 69:
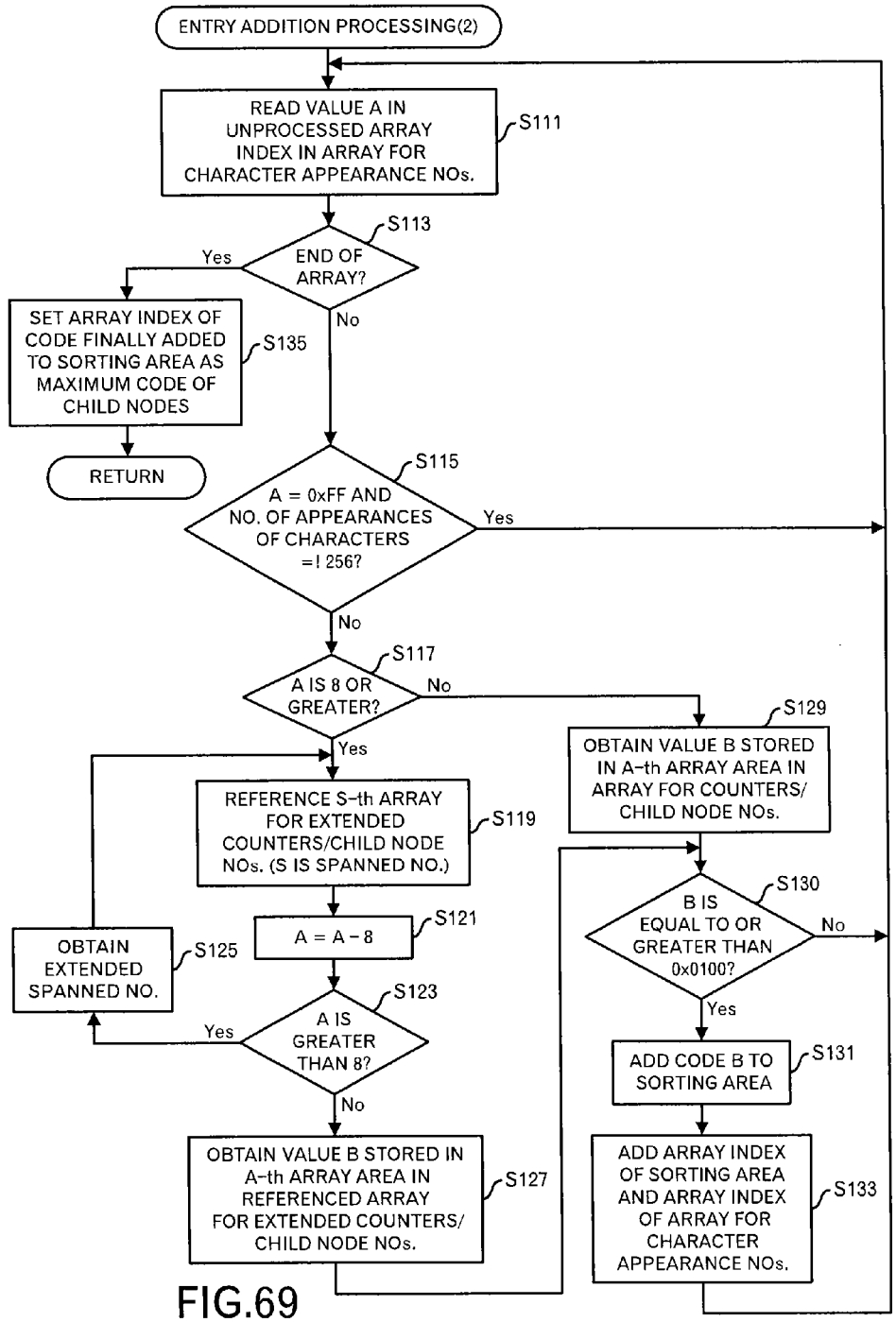
FIG. 69 is a diagram depicting a processing flow of a second entry addition processing in the second embodiment.

Next, the compression map generation processing relating to this embodiment will be explained. In this embodiment, the entry addition processing in the compression map generation processing is changed as illustrated in FIG. 69. However, the changed part is only the part where step S135 is added.

At the step S135, after the array for character appearance numbers for one node has been processed to the end, the compression map generator 120 sets the array index of the code finally added to the sorting area as the maximum code of the child nodes. For the node being processed, when the codes of the child nodes are not added to the sorting area, in other words, when there is no child node, the code that is the same as that of a node immediately before the node being processed is set as the maximum code of the child nodes.

Figure 70:
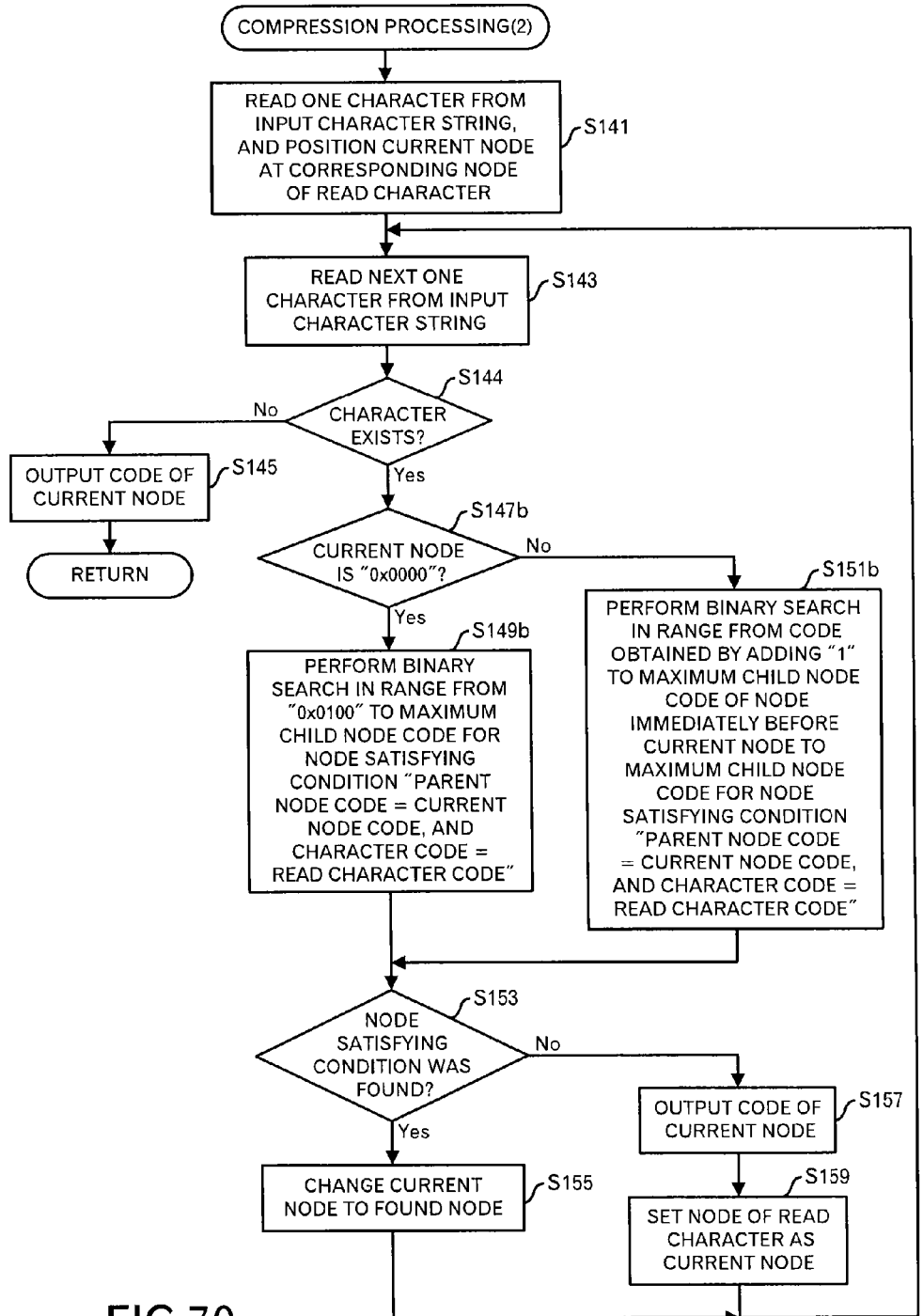
FIG. 70 is a diagram depicting a processing flow of a second compression processing in the second embodiment.

Moreover, the processing flow of the compression processing relating to this embodiment is as illustrated in FIG. 70. However, the part that differs from the processing flow illustrated in FIG. 53 is just the part from step S147 to step S151.

More specifically, the compression processing unit 140 determines whether or not the code of the current node is "0x0000" (step S147b). This is because, as for only the node of "0x0000", the maximum code of the child nodes for the node immediately before the current node cannot be acquired. When the current node code is "0x0000", the compression processing unit 140 performs a binary search in a range from the code "0x0100" to the maximum child node code in the compression map for a node satisfying a condition "the parent node code in the map=the code of the current node, and the character code in the map=the acquired character" (step S149b). The processing then moves to the step S153. The search range is narrowed more than that of the step S149.

On the other hand, when the current node is not "0x0000", the compression processing unit 140 performs a binary search in a range from the code obtained by adding "1" to the maximum child node code of the node immediately before the current node to the maximum child node code of the current node in the compression map for a node satisfying a condition that "the parent node code in the map=the code of the current node, and the character code in the map=the acquired character" (step S151b). The processing then moves to the step S153. Similarly, the search range is narrowed more than that of the step S151.

By performing the processing described above for the phrase tree in FIG. 67, a compression map such as illustrated in FIG. 71 is obtained. Then, by performing the compression processing described above for the input character string "ABCAA" using such a compression map, the result is as described in the following. The processing result itself is the same as that illustrated in FIG. 55.

First, when "A" in the input character string "ABCAA" is processed, "0x0041" is set as the current node ("1" in FIG. 55). Next, when "B" in "ABCAA" is processed, a binary search is performed in a range from the code "0x0100" to "0x0101" (the maximum child node code of the current node) for a node satisfying the condition that "the parent node code=0x0041, and the character code=0x42". As a result, it is found that the code "0x0101" is the code of the node satisfying the condition, so"0x0101" is set as the current node ("2" in FIG. 55).

Furthermore, when "C" in "ABCAA" is processed, a binary search is performed in a range of the code "0x0104" (the code obtained by adding "1" to the maximum child node code of a node immediately before=the maximum child node code of the current node) for a node satisfying a condition that "the parent node code=0x0101, and the character code=0x43". As a result, it is found that the code "0x0104" is the code of the node satisfying the condition, so "0x0104" is set as the current node ("3" in FIG. 55).

Next, when second "A" in "ABCAA" is processed, the search range for searching for a node satisfying a condition that "the parent node code=0x0104, and the character code=0x41" is identified as being from the code "0x0108" (code obtained by adding "1" to the maximum child node code of a node immediately before) to the code "0x0107" (the maximum child node code of the current node), however, it can be seen that the starting point and the ending point of the search range are reversed, and that a search is unnecessary. As a result, the node searched for cannot be found, so the code "0x0104" of the current node is added to the compression result ("4" in FIG. 55). The node of the code "0x0041" corresponding to the character code "0x041" is set as the current node.

Furthermore, when processing third "A" in "ABCAA", a binary search is performed in a range from the code "0x0100" to "0x0101" (the maximum child node code of the current node) for a node satisfying a condition "the parent node code=0x0041, and the character code=0x41". As a result, it is found that the code "0x0100" is the code of the node satisfying the condition, so "0x0100" is set as the current node ("5" in FIG. 55). With that, all of the characters in the input character string have been processed, so the code "0x0100" of the current node is outputted, and the processing ends ("6" in FIG. 55).

As described above, it is seen that even in this detailed example as well, the search range is narrowed down.

Embodiment 3

In this third embodiment, the processing speed of the decompression processing is improved. In the processing illustrated in FIG. 56, nodes are traced back to the root node (i.e. root in figure), so node searches are performed many times. Therefore, in this embodiment, together with changing the data structure of the compression map, hierarchy level information (or layer information) and decompression map are newly generated, and stored. Even when additional data is stored in this way, the additional storage capacity is only about 800 K bytes, so the increased load is not so large. The compression map is about 446 KB.

FIG. 72 illustrates an example of a compression map of this embodiment. As illustrated in FIG. 72, the basic structure is the same as that in the first embodiment, however, the parent node code, the character code of its own node, and the layer number or layer identifier of a layer to which its own node belongs are correlated and stored.

Figures 73, 74:
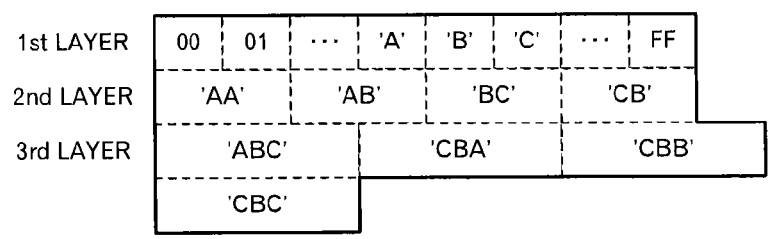
FIG. 73 is a diagram depicting an example of layer information in the third embodiment.
FIG. 74 is a diagram depicting a decompression map in the third embodiment.

Moreover, FIG. 73 depicts layer information, and in this layer information, the number of nodes within the layer, the start code within the layer, and the offset value of the top decompressed character string in the layer from the beginning of the decompression map are correlated for each layer starting from the first layer. The example in FIG. 73 is based on the phrase tree in FIG. 67, however, by using the layer information, it can be seen that there are four nodes "0x0100", "0x0101", "0x0102" and "0x0103" in the second layer, and these nodes represent character strings each containing two characters. Moreover, these character strings use a total 2*4=8 bytes. Furthermore, in the third layer, it can be seen that there are four nodes "0x0104", "0x0105", "0x0106", and "0x0107", and these nodes represent character strings each containing 3 characters. It is also seen that these character strings use a total of 3*4=12 bytes. The offset value of the top decompressed character string in the layer represents how far the character or character string of the start code in the identified layer is separated from the top of the decompression map, when the layer is identified.

Furthermore, FIG. 74 illustrates an example of a decompression map relating to this embodiment. The decompression map relating to this embodiment is an associative array in which characters that correspond to the codes of the nodes belonging to each layer are stored in order of the code. In the case of the phrase tree in FIG. 67, in the second layer, "AA" is registered in the 0-th area, "AB" is registered in the "1st" area, "BC" is registered in the "2nd" area and "CB" is registered in the "3rd" area. Moreover, in the third layer, "ABC" is registered in the "0"-th area, "CBA" is registered in the "1st" area, "CBB" is registered in the "2nd" area and "CBC" is registered in the "3rd" area.

The processing for generating data such as the aforementioned compression map and the like will be explained using FIG. 75 to FIG. 77.

Figure 75:
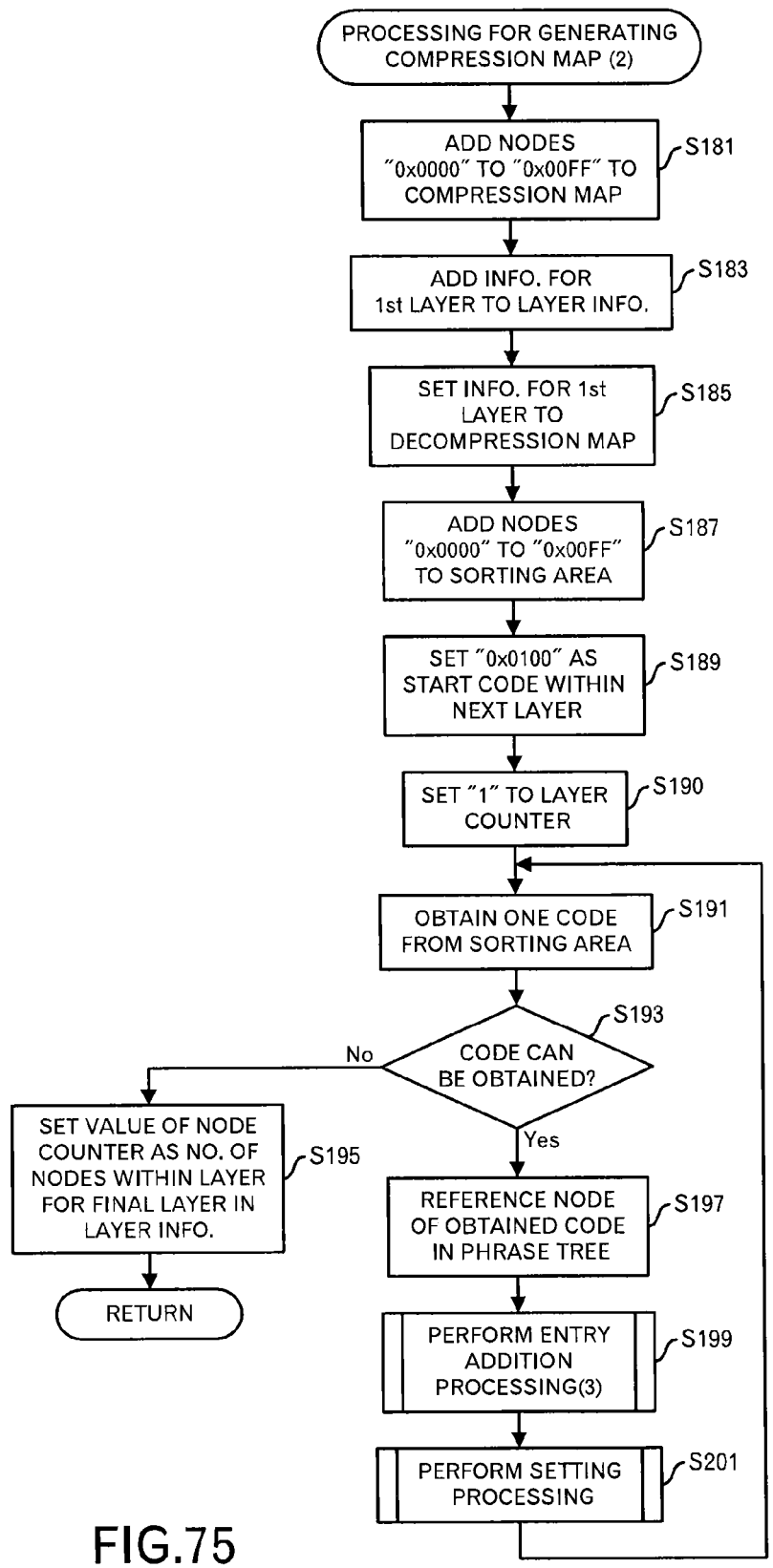
FIG. 75 is a diagram depicting a processing flow of a second compression map generation processing in the third embodiment.
Figure 76:
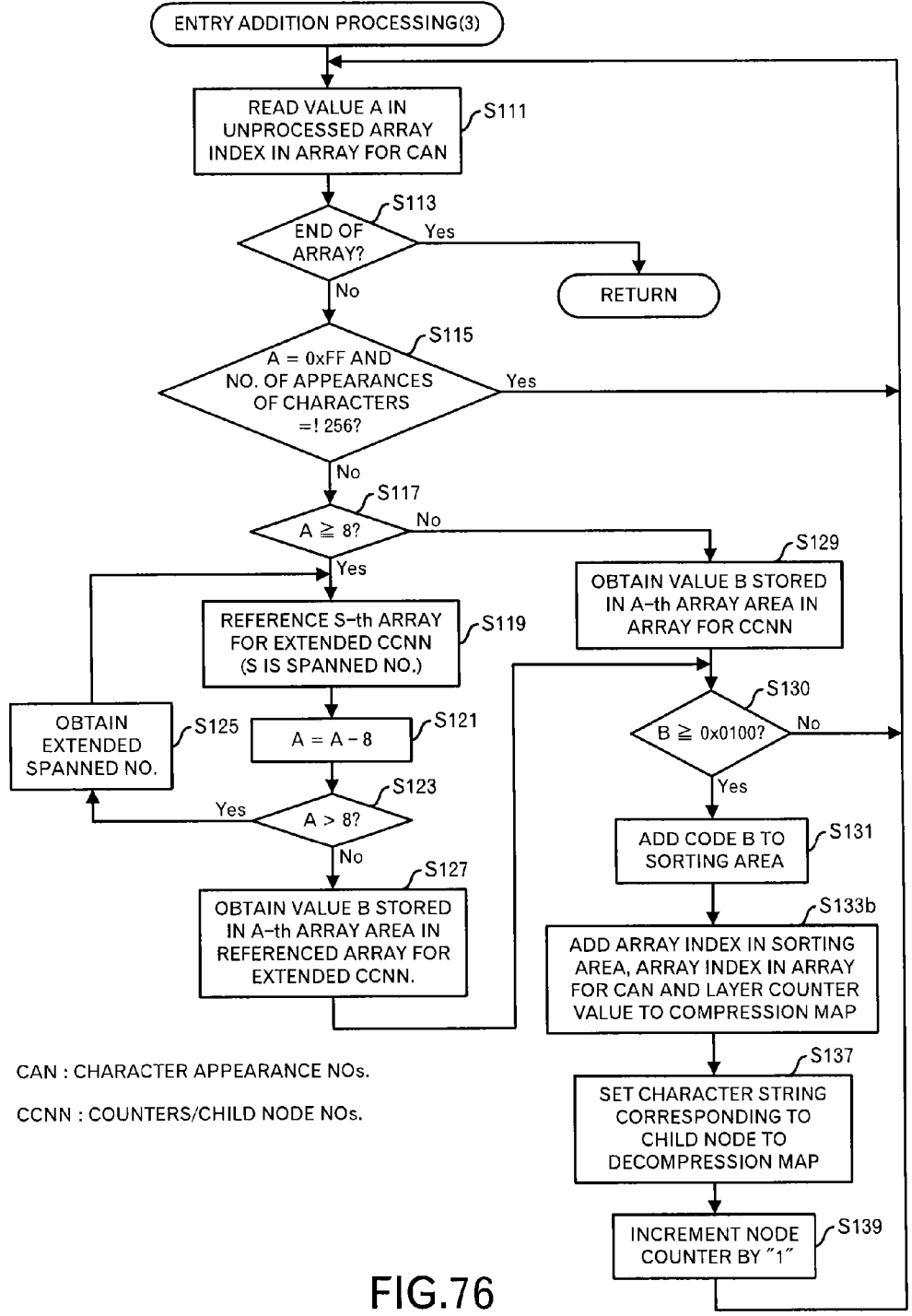
FIG. 76 is a diagram depicting a processing flow of a third entry addition processing in the third embodiment.

The compression map generator 120 adds correlation data that correlates data "root" that represents the root node, character codes that correspond to codes of the nodes "0x0000" to "0x00FF" and a layer number "1" to the compression map in sequence, as the data of the nodes "0x0000" to "0x00FF" in the first layer (FIG. 75: step S181).

The compression map generator 120 then sets information about the first layer in the layer information (step S183). In other words, there are 256 nodes in the first layer, so "256" is set as the number of nodes in the layer, "0x0000" is set as the code for the start code within the layer, and "0" is set as the offset value of the top decompressed character string. These are fixed values.

Furthermore, the compression map generator 120 sets information of the first layer in the decompression map (step S185). Because the first layer includes one character code for each character, the character codes "0x00" to "0xFF" are set. There are fixed values.

The compression map generator 120 then adds the codes of the nodes "0x0000" to "0x00FF" in the first layer to the sorting area in sequence (step S187). Moreover, the compression map generator 120 sets "0x0100" as the start code within the next layer (step S189). The start code within the next layer is a variable that is used in the following. Furthermore, the compression map generator 120 initializes a layer counter (step S190).

After that, the compression map generator 120 reads one unprocessed code from the sorting area in ascending order of the code after sorting (step S191). Here, when it is not possible to read an unprocessed code (step S193: NO route), the compression map generator 120 sets the value of a node counter that will be explained below as the number of nodes in the final layer in the layer information (step S195). The processing then returns to the processing of the calling source.

After that, the compression map generator 120 reads one unprocessed code from the sorting area in ascending order of the code after sorting (step S191). Here, when it is not possible to read an unprocessed code (step S193: NO route), the compression map generator 120 sets the value of a node counter that will be explained below as the number of nodes in the final layer in the layer information (step S195). The processing then returns to the processing of the calling source.

On the other hand, when it is possible to read any unprocessed code (step S193: YES route), the compression map generator 120 references a data block for a node of the read code in the phrase tree (step S197). The compression map generator 120 then performs a third entry addition processing relating to this embodiment (step S199). This third entry addition processing will be explained using FIG. 76. After the third entry addition processing, the compression map generator 120 performs a setting processing (step S201). The setting processing will be explained using FIG. 77. The processing then returns to step S191.

Next, the third entry addition processing will be explained using FIG. 76. FIG. 76 is nearly the same as FIG. 52, however, step S133 has been changed to step S133b, and steps S137 and S139 have been added.

In other words, at the step S133b, the compression map generator 120 adds correlation data that correlates an array index (i.e. the parent node code) to be processed in the sorting area, an array index to be processed (i.e. character code of the child node) in the array for character appearance numbers, and a value of the layer counter (i.e. layer) to the compression map (step S133b).

Moreover, the compression map generator 120 sets the character string of the parent node and the array index in the array for character appearance numbers (i.e. character code of the child node) as the character string corresponding to the child node in the layer corresponding to the value of the layer counter in the decompression map (step S137). The character string of the parent node (i.e. character string of the code being processed) is identified by, for example, tracing the compression map using the code identified at the step S95. Moreover, the character string of the parent node can be obtained by identifying the layer number of the layer to which the current node belongs in the compression map, and referencing the position obtained by ("the offset value of the top decompressed character string" in the layer to which the current node belongs in the layer information+(code of the current node−start code within the layer)*layer number) in the decompression map.

Furthermore, the compression map generator 120 increments the value of the node counter by "1" (step S139). The processing then returns to the step S111.

By performing the processing described above, the compression map, layer information and part of the decompression map can be generated.

Next the setting processing will be explained using FIG. 77.

The compression map generator 120 determines whether the start code within the next layer, which has been set up to this point, is the code of the current node (step S211). The initial value of the start code within the next layer is "0x0100". When the start code within the next layer is not the code of the current node, the processing moves to step S219. However, when the start code within the next layer is the code of the current node, the compression map generator 120 determines whether a child node was identified in the third entry addition processing (step S213). When there is no child node, the compression map generator 120 sets (the code of the current node+1) as the start code within the next layer (step S217). The processing then returns to the processing of the calling source.

On the other hand, when there is a child node, the compression map generator 120 sets the least child node code among codes of child nodes that were identified in the third entry addition processing as the start code within the next layer (step S215). The processing then moves to step S219.

After moving to the processing of the step S219, the compression map generator 120 determines whether (the code of the current node+1) is the start code within the next layer (step S219). In other words, the compression map generator 120 determines whether the node being processed is the last node within the current layer. When (the code of the current node+1) is the start code of the next layer, the compression map generator 120 sets the value of the node counter as the number of nodes within the layer in the layer information (step S221). The compression map generator 120 then sets (the code of the current node+1) as the start code within the layer for the next layer in the layer information (step S223). Furthermore, the compression map generator 120 sets (the offset value of the top decompressed character string within the current layer+ the node counter value*layer number (value of the layer counter)) as the offset value of the top decompressed character string for the next layer in the layer information (step S225).

The compression map generator 120 then initializes the node counter to "0" (step S227), and increments the value of the layer counter by "1" (step S229). The processing then returns to the processing of the calling source.

By performing such a processing, it is possible to generate a compression map, layer information and a decompression map as described above.

Figure 78:
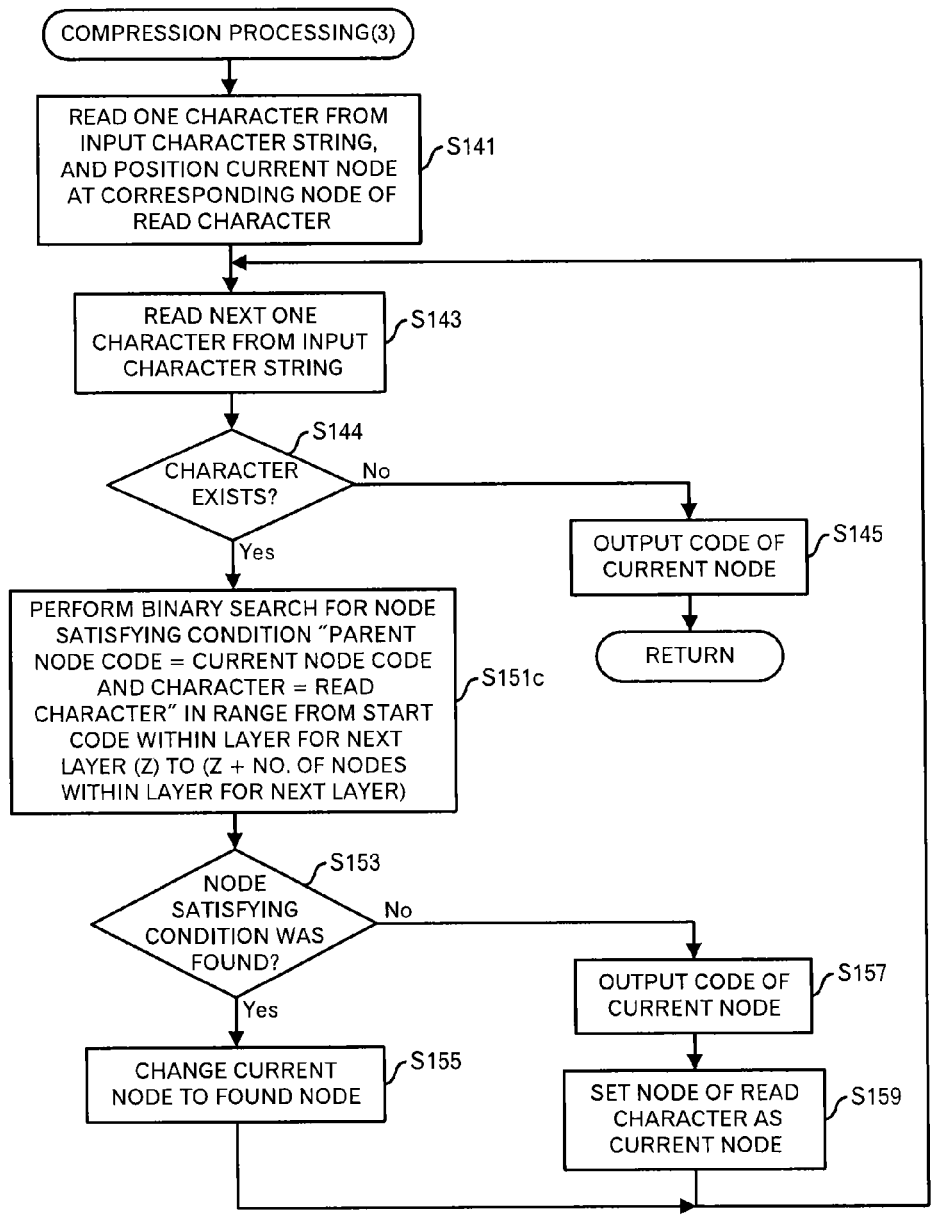
FIG. 78 is a diagram depicting a processing flow of a third compression processing in the third embodiment.

Next, the third compression processing relating to this embodiment will be explained using FIG. 78. The third compression processing relating to this embodiment is nearly the same as the compression processing relating to the first embodiment, and differs in that step S151c is executed instead of the steps S147 to S151.

In other words, the compression processing unit 140 performs a binary search for a node satisfying a condition that "the parent node code=the code of the current node, and the character code=the obtained character" in a range from the start code Z within the layer for the layer next to the layer of the current node (data within the layer information) to (Z+the number of nodes within the layer for the next layer (data in the layer information)) in the compression map (step S151c).

In doing so, the search range is narrowed compared to that in the compression processing relating to the first embodiment.

For example, a detailed example of the processing for the case in which "ABCAA", which is a character string to be compressed, is inputted will be explained.

First, when processing "A" in the inputted character string "'A'BCAA", "0x0041" is set as the current node ("1" in FIG. 55). Next, when processing "B" in "A'B'CAA", the current layer number is "1", so a binary search is performed in a range from codes "0x0100" to "0x0103" within the second layer for a node satisfying a condition that "the parent node code=0x0041, and the character code=0x42". As a result, it is found that the code "0x0101" is the corresponding node, so "0x0101" is set as the current node ("2" in FIG. 55).

Furthermore, when processing "C" in "AB'C'AA", the current layer number is "2", so a binary search is performed in a range from code "0x0104" to "0x0107" within the third layer for a node satisfying a condition that "the parent node code=0x0101, and the character code=0x43". As a result, it is found that the code "0x0104" is the corresponding node, so "0x0104" is set as the current node ("3" in FIG. 55).

Furthermore, when processing second "A" in "ABC'A'A", the current layer number is "3", there is no next layer, so it can be seen that there is no corresponding node without the search for anode satisfying a condition that "the parent node code=0x0104, and the character code=0x41". Therefore, the code "0x0104" of the current node is added to the compression result ("4" in FIG. 55). The node of the code "0x0041" that corresponds to the character code "0x41" is set as the current node.

Moreover, when third "A" in "ABCA'A'" is processed, the current layer number is "1", so a binary search is performed in a range of codes "0x0100" to "0x0103" within the second layer for a node satisfying a condition that "the parent node code=0x0041, and the character code=0x41". As a result, the code "0x0100" is the corresponding node, so "0x0100" is set as the current node ("5" in FIG. 55). Here, all of the characters in the input character string have been processed, so the code "0x0100" of the current node is outputted, and the processing ends ("6" in FIG. 55).

In this way, it is possible to perform the compression processing.

Next, the processing of the second decompression processing relating to this embodiment will be explained using FIG. 79 and FIG. 80.

First, the decompression processing unit 150 obtains one code from the compression data, and positions the current node at the corresponding node in the compression map (step S231). When any code could not be read from the compression data (step S233: NO route), the processing returns to the processing of the calling source. On the other hand, when any code can be read from the compression data (step S233: YES route), the decompression processing unit 150 references a position of ("the offset value of the top decompressed character string"+(the current node code−start code within the layer)*layer number) for the layer to which the current node belongs in the layer information, in the decompression map, and outputs codes by the amount of bytes of the layer number (step S235). The processing then returns to the step S231. The offset value of the top decompressed character string and the start code within the layer are obtained by reading from the layer information.

In this way, by using the layer information and decompression map, the speed of the processing can be enhanced.

For example, processing for the case of decompressing "0x0104" and "0x0100" will be explained using FIG. 80.

First, when the code "0x0104" is read, the layer is identified from the compression map as being the third layer, so the offset value of the top decompressed character string within the third layer "264"+(the code of the current node "0x0104"—the start code within the layer "0x0104")*3 becomes "264", so 3 bytes are read from the 264 bytes from the top of the decompression map. As a result, "ABC" is outputted ("1" in FIG. 80). Furthermore, when the next code "0x0100" is read, the layer is identified from the compression map as being the second layer, so the offset value of the top decompressed character string within the second layer "256"+(the current node code "0x0100"—the start code within the layer "0x0100")*2 becomes "256", so 2 bytes are read from the 256 bytes from the top of the decompression map. As a result, "AA" is further outputted ("2" in FIG. 80).

As described above, decompression is performed by two steps, so the processing becomes faster.

Embodiment 4

This embodiment combines the second and third embodiments. Moreover, in the decompression map and layer information, the amount of memory used is decreased by omitting information that is fixed and that is obtained from the data of the compression map.

FIG. 81 illustrates an example of the compression map relating to this embodiment. In this embodiment, the character code of its own node, the maximum child node code, and the layer number of the layer to which its own node belongs are correlated in order of the code after sorting. As for the parent node code, when there is layer information and a decompression map, that code is not used, so is omitted.

Furthermore, FIG. 82 illustrates layer information relating to this embodiment. The layer information relating to this embodiment differs from the third embodiment in that the data of the first layer is omitted. For the second layer and subsequent layers, the number of nodes within the layer, the start code within the layer, and the offset value of the top decompressed character string are registered. The data for the first layer is omitted, so the offset value of the top decompressed character string is changed.

Moreover, FIG. 83 illustrates a decompression map relating to this embodiment. The decompression map relating to this embodiment differs from that in the third embodiment in that the data of the first layer is omitted. The decompression map is an associative array in which corresponding character strings are stored in ascending order of the code in the second layer and the subsequent layers.

Figure 84:
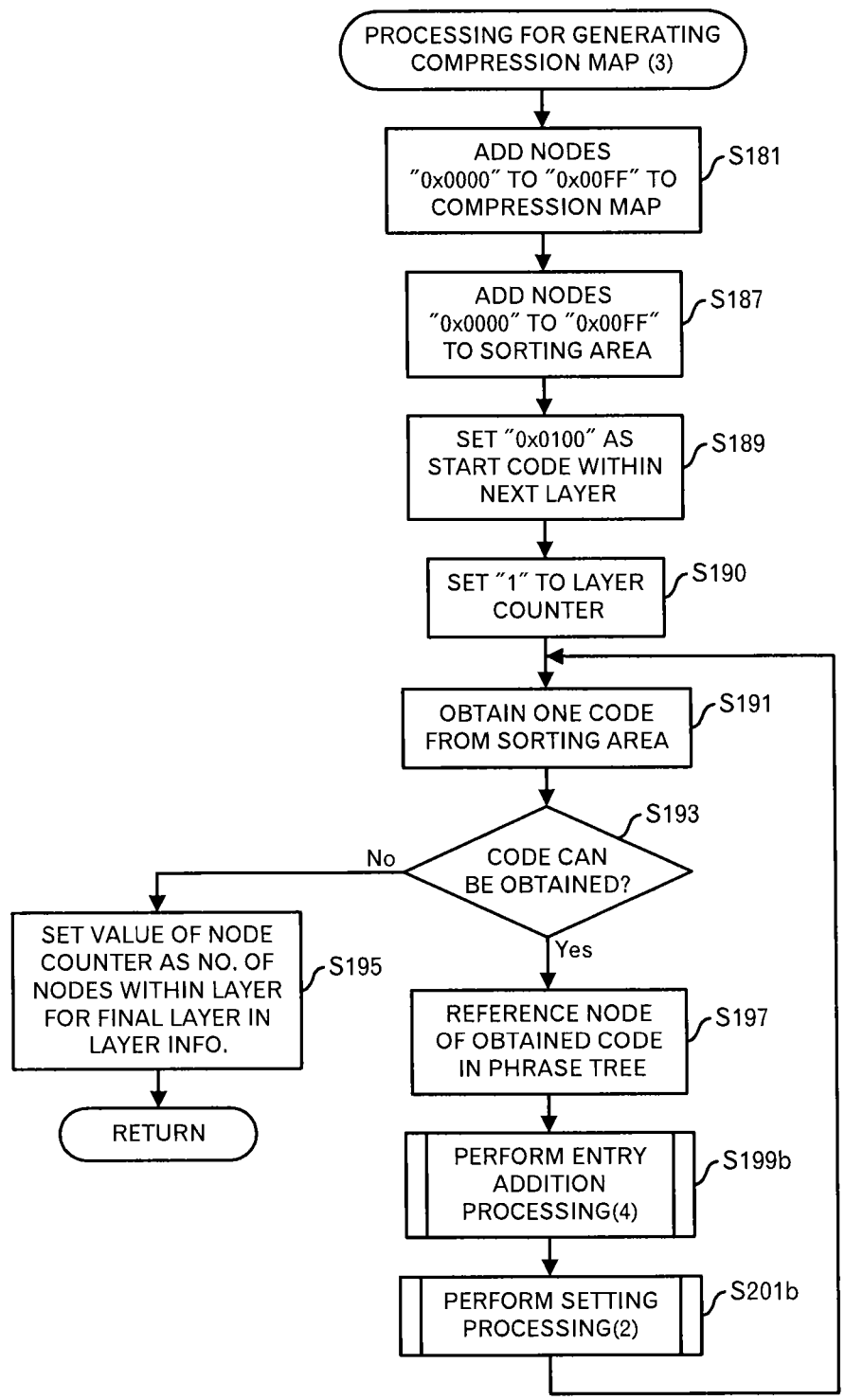
FIG. 84 is a diagram depicting a processing flow of a third compression map generation processing in the fourth embodiment.

FIG. 84 illustrates the processing flow of the third compression map generation processing relating to this embodiment. This processing differs from the second compression map generation processing relating to the third embodiment in that there are no steps S183 and S185, instead of the step S199 for the third entry addition processing, step S199b for a fourth entry addition processing is performed, and instead of the step S201 for the setting processing, step S201b for a second setting processing is performed.

Figure 85:
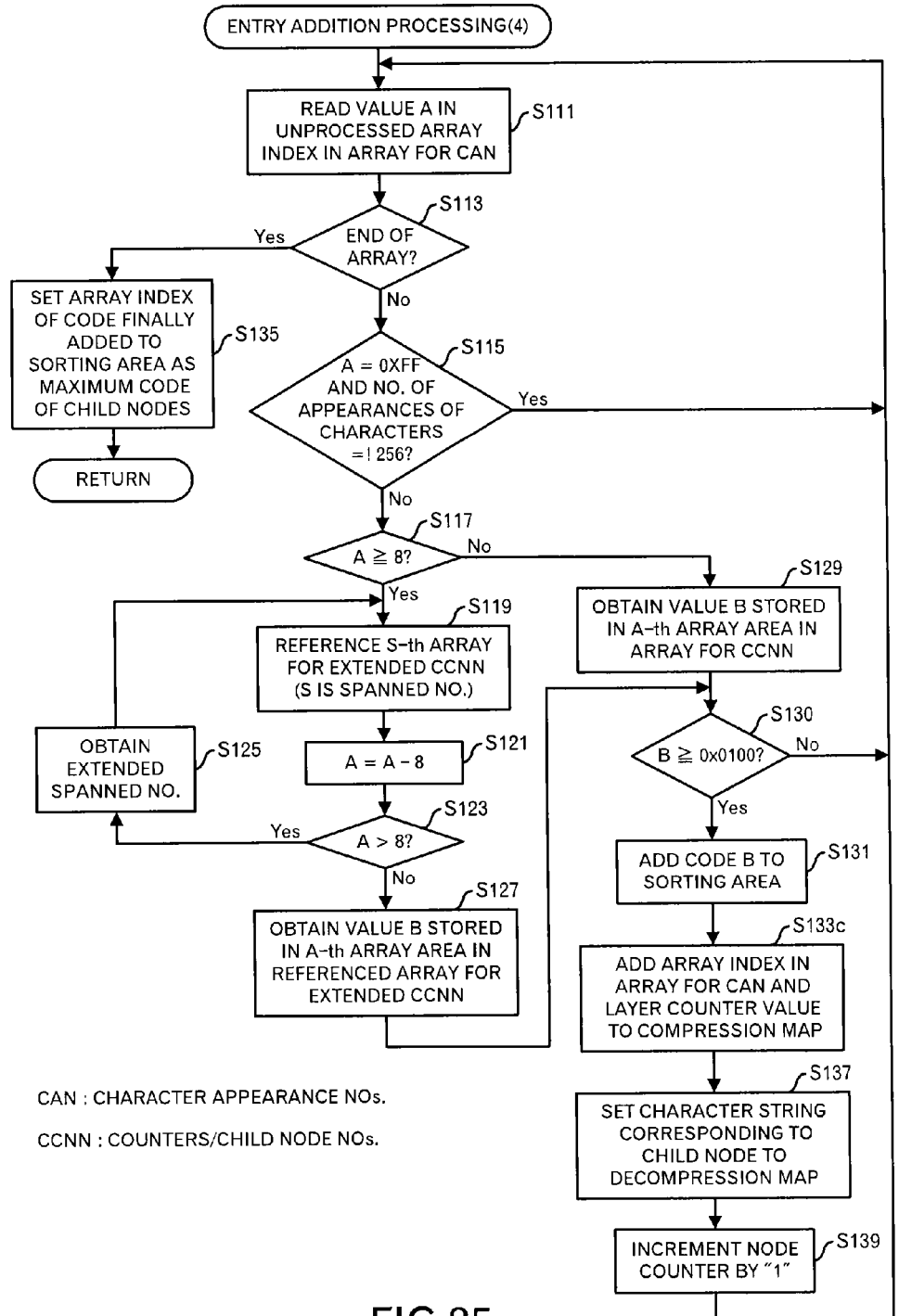
FIG. 85 is a diagram depicting a fourth entry addition processing in the fourth embodiment.

Next, FIG. 85 illustrates the processing flow of the fourth entry addition processing. This processing differs from the third entry addition processing relating to the third embodiment in that step S135 that is executed at the end of the array (the processing explained in the second entry addition processing) is additionally performed, and instead of the step S133b, step S133c is performed.

At step S133c, the compression map generator 120 adds correlation data that correlates the array index being processed in the array for character appearance numbers (i.e. character code of the child node) with the value of the layer counter (i.e. layer number) (step S133c). This differs in that the array index being processed in the sorting area (i.e. the code of the parent node) is not registered.

Figure 77:
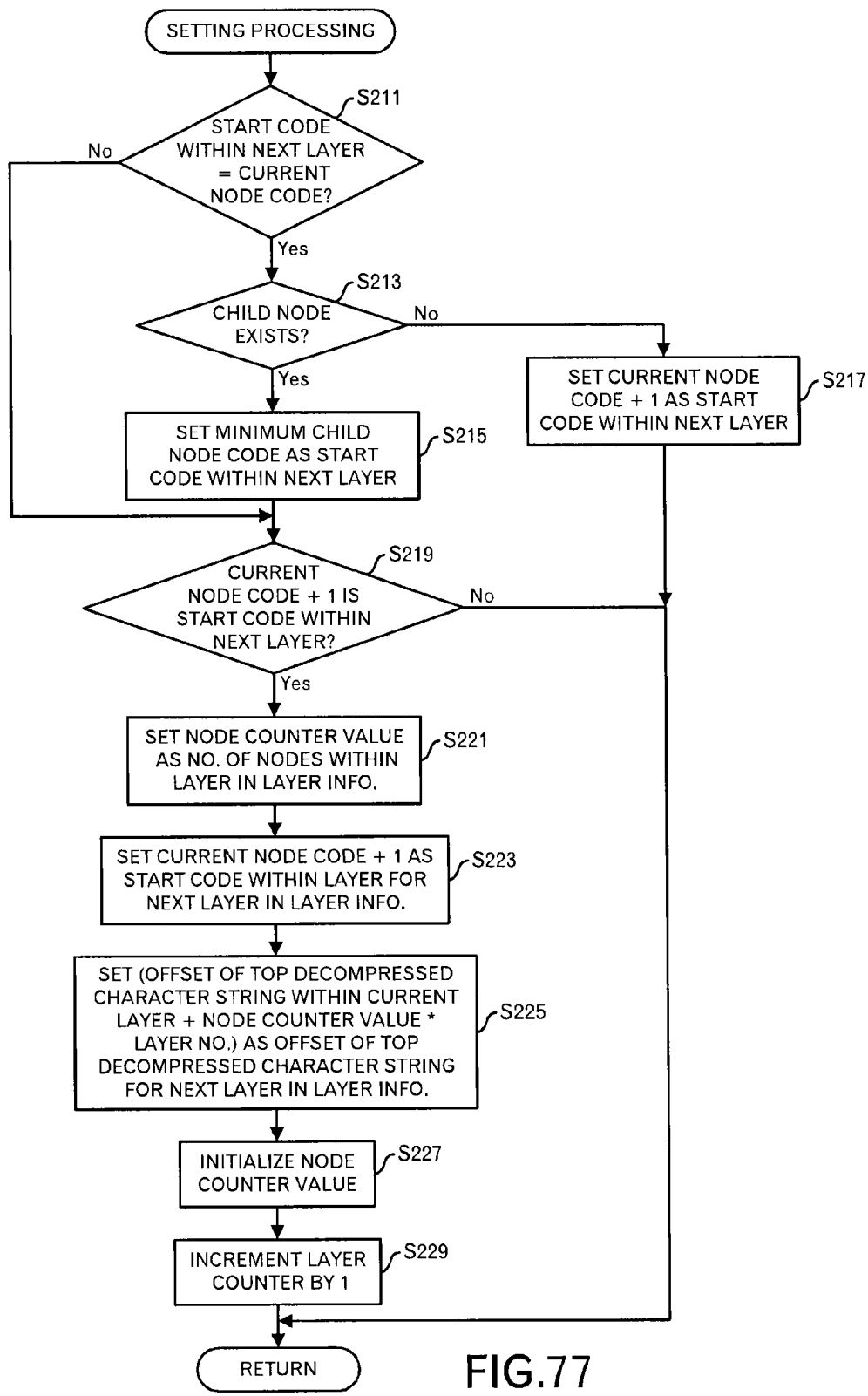
FIG. 77 is a diagram depicting a processing flow of a setting processing in the third embodiment.
Figure 86:
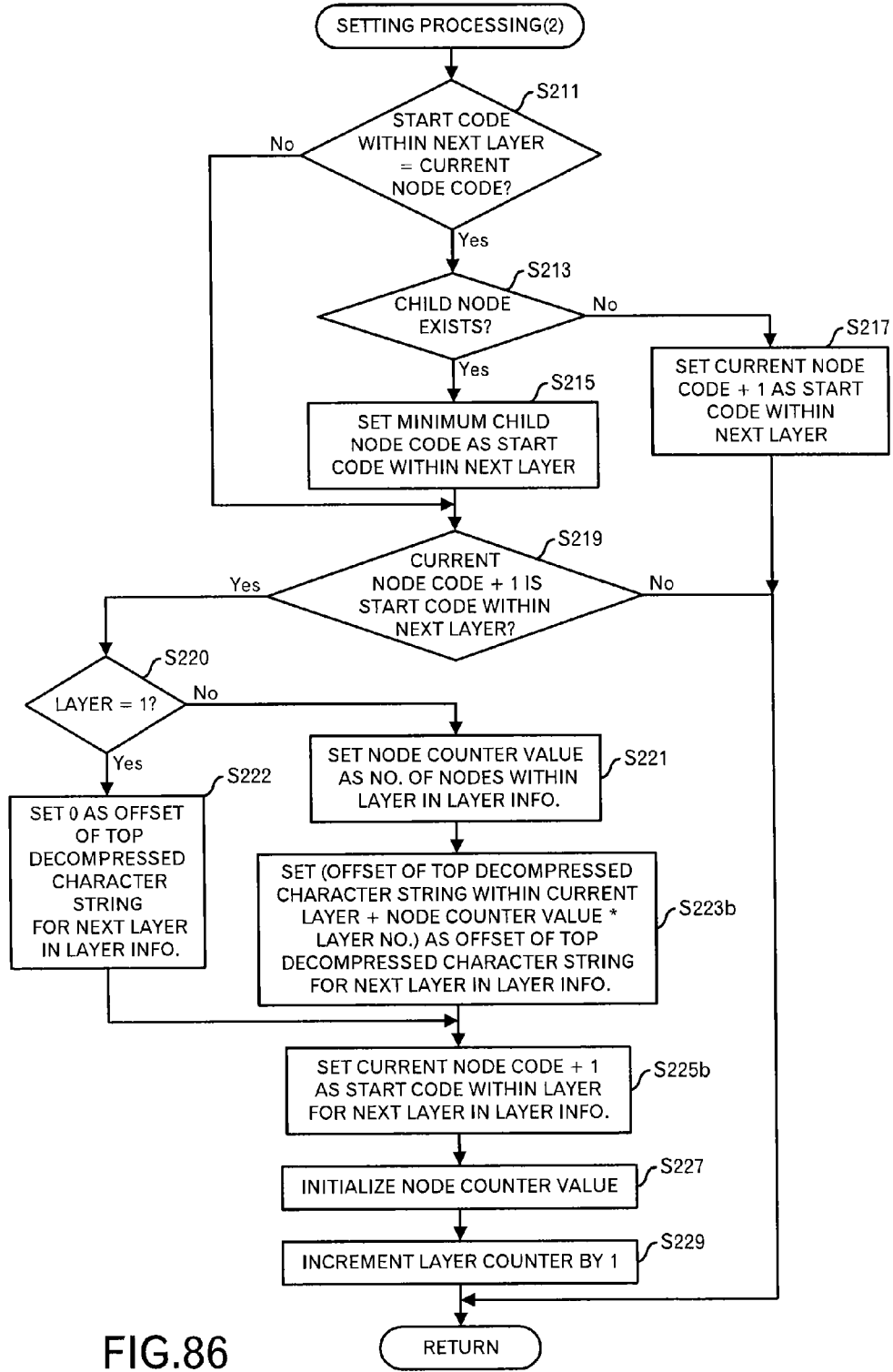
FIG. 86 is a diagram depicting a processing flow of a second setting processing in the fourth embodiment.

The second setting processing that is included in the third compression map generation processing differs from that in FIG. 77, and the processing flow thereof is as illustrated in FIG. 86. However, the difference with that illustrated in FIG. 77 is that steps S220 and S222 are added, and instead of steps S223 and S225, steps S223b and S225b are performed.

In this second setting processing, when it is determined at the step S219 that (the code of the current node+1) is the start code within the next layer, in other words, in case of the last node within the layer, the compression map generator 120 determines whether the current value of the layer counter is "1" (step S220). When the current value of the layer counter is "1", data will not be added to the layer information, so the compression map generator 120 sets the offset value of the top decompressed character string within the next layer in the layer information to "0" (step S222). The processing then moves to step S225b.

On the other hand, when the current value of the layer counter is not "1", the compression map generator 120 sets the value of the node counter as the number of nodes within the layer in the layer information (step S221). The compression map generator 120 also sets {the offset value of the top decompressed character string within the current layer+the node counter*the number of layers (i.e. value of the layer counter)} as the offset value of the top decompressed character string within the next layer in the layer information (step S223*b*). This processing is the same as the step S225. Furthermore, the compression map generator 120 sets (the code of the current node+1) as the start code within the layer for the next layer in the layer information (step S225*b*). This step is the same as the step S223. The processing after this is the same as that illustrated in FIG. 77.

Figure 87:
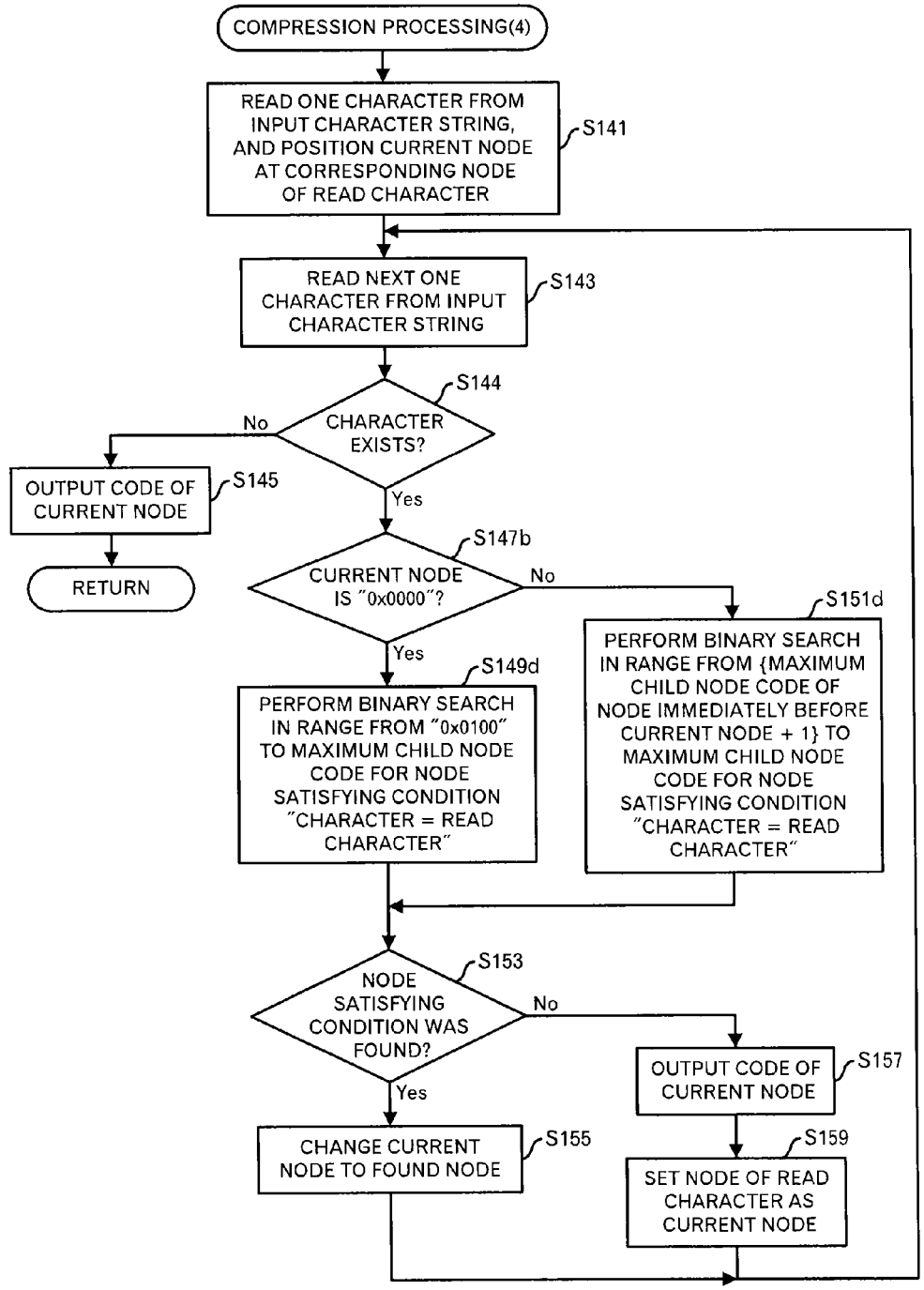
FIG. 87 is a diagram depicting a processing flow of a fourth compression processing in the fourth embodiment.

Next, FIG. 87 illustrates the processing flow of the fourth compression processing relating to this embodiment. This processing differs from the second compression processing relating to the second embodiment in that the step S149*b* and step S151*b* are changed to step S149*d* and step S151*d*.

More specifically, the compression processing unit 140 determines whether or not the code of the current node is "0x0000" (step S147*b*). This is because only the node of "0x0000" is not able to obtain the maximum child node code of the node immediately before the current node. When the code of the current node is "0x0000", the compression processing unit 140 performs a binary search in a range in the compression map from the code "0x0100" to the maximum child node code for a node satisfying a condition that the character code=the read character code (step S149*d*). This processing is performed because the data for the parent node has been deleted from the compression map.

On the other hand, when the current node is not "0x0000", the compression processing unit 140 performs a binary search in a range of the compression map from (the maximum child node code of the node immediately before the current node+1) to the maximum child node code for a node satisfying a condition that the character code=the read character code (step S151*d*). The processing then moves to the step S153.

Figure 79:
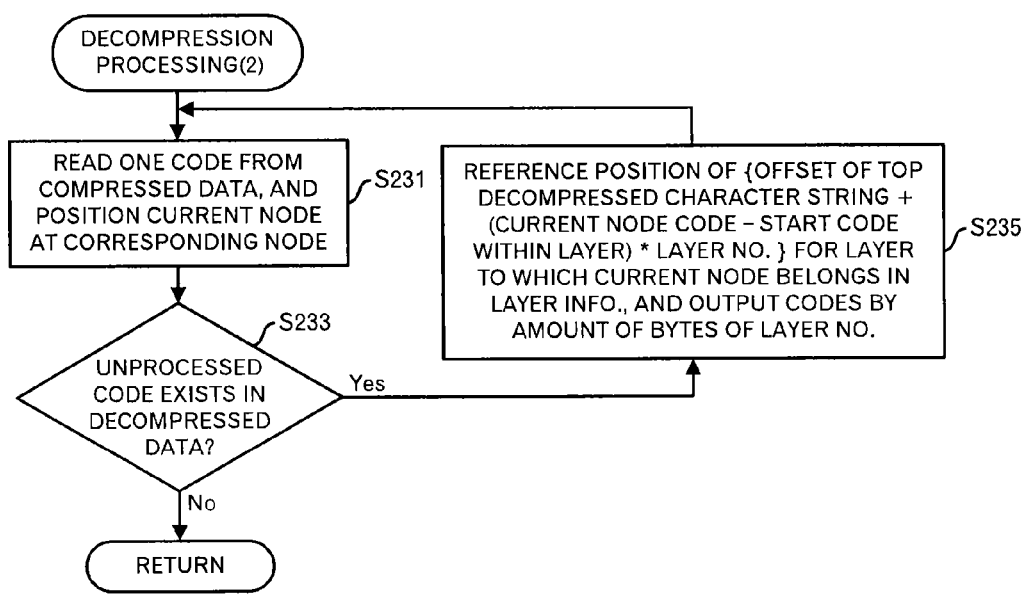
FIG. 79 is a diagram depicting a processing flow of a second decompression processing in the third embodiment.
Figure 88:
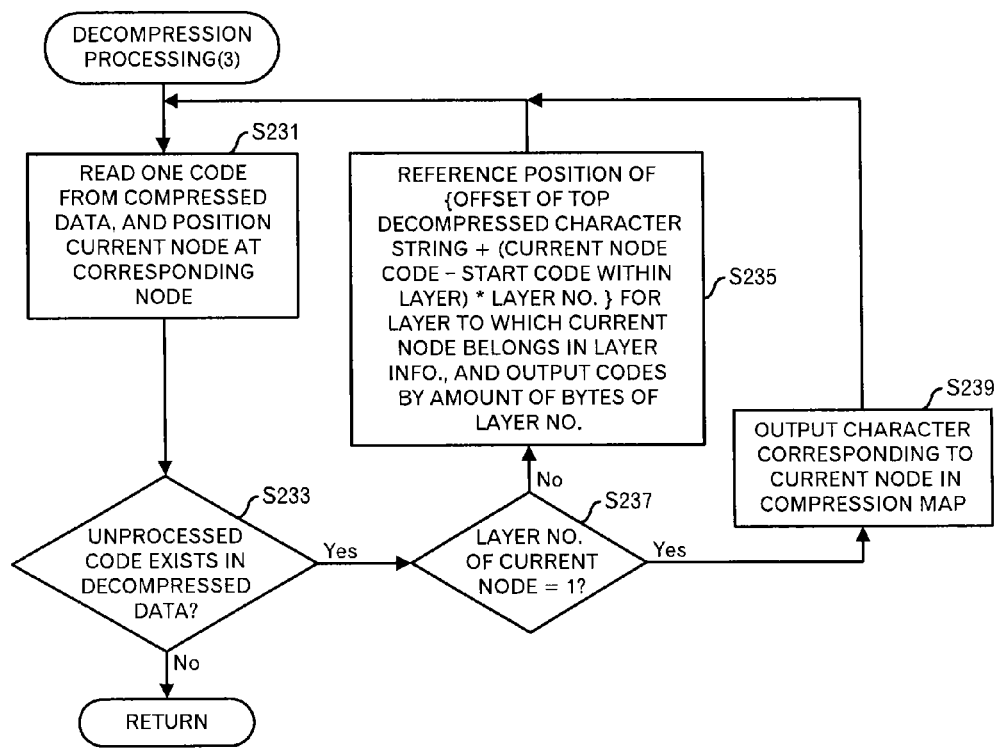
FIG. 88 is a diagram depicting a processing flow of a third decompression processing in the fourth embodiment.

For the decompression processing, the third decompression processing illustrated in FIG. 88 is performed instead of the second decompression processing illustrated in FIG. 79. The difference between FIG. 88 and FIG. 79 is that steps S237 and S239 have been added. More specifically, the decompression processing unit 150 determines whether the value of the layer to which the current node belongs in the compression map is "1" (step S237). When the value of the layer is "1", the decompression processing unit 150 outputs the character code at the current node in the compression map (step S239), and then the processing moves to the step S231. On the other hand, when the value of the layer is "2" or greater, the processing moves to the step S235. By performing such a processing, the decompression processing is speeded up even though the amount of layer information and data of the decompression map are reduced.

Although the embodiments were explained, this technique is not limited to those embodiments.

For example, the aforementioned functional block diagrams do not correspond to program module configurations. Moreover, as long as the processing result does not change, in the processing flows, the order of steps may be changed or plural steps may be executed in parallel.

The aforementioned processing may be executed by plural computers, though an example in which one computer executes the processing was explained.

Figure 89:
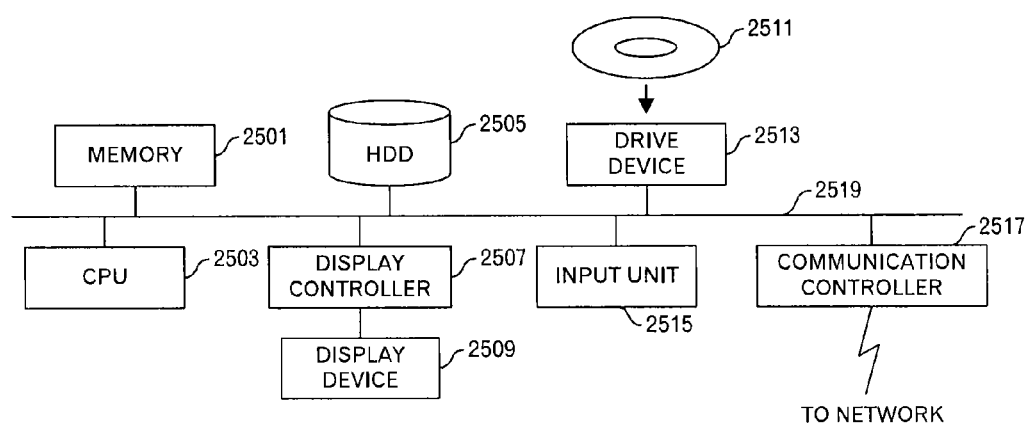
FIG. 89 is a functional block diagram of a computer.

In addition, the aforementioned information processing apparatus 100 is computer device as illustrated in FIG. 89. That is, a memory 2501 (storage device), a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as illustrated in FIG. 89. An operating system (OS) and an application program for carrying out the foregoing processing in the embodiment, are stored in the HDD 2505, and when executed by the CPU 2503, they are read out from the HDD 2505 to the memory 2501. As the need arises, the CPU 2503 controls the display controller 2507, the communication controller 2517, and the drive device 2513, and causes them to perform predetermined operations. Moreover, intermediate processing data is stored in the memory 2501, and if necessary, it is stored in the HDD 2505. In this embodiment of this technique, the application program to realize the aforementioned functions is stored in the computer-readable, non-transitory removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the application programs systematically cooperate with each other, so that various functions as described above in details are realized.

The aforementioned embodiments are outlines as follows:

A data structure generation method includes: (A) first generating, for each character that will be used, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold; (B) upon detecting that, in a second area of a data block for a character or a character string being processed among plural characters included in an input character string, an appearance sequential number for a next character of the character or the character string being processed in the input character string is held, that, in a third area of the data block, a number of appearances is held as data in the appearance sequential number, and that the number of appearances after increment exceeds the threshold, storing a code corresponding to a second character string including the character or the character string being processed and the next character; and (C) generating a data block for the second character string, which has a same structure as the data block generated in the first generating.

By using the plural data blocks obtained by carrying out such a processing, the memory capacity used for this data blocks can be reduced.

The aforementioned data structure generation method may further include: (D) upon detecting that, in the second area of the data block for the character or the character string being processed, the appearance sequential number for the next character of the character or the character string being processed in the input character string is held, that, in the third area of the data block, the number of appearances is held as data in the appearance sequential number, and that the number of appearances after the increment does not exceeds the threshold even, setting the next character as a character being processed.

Furthermore, the aforementioned data structure generation method may further include: (E) upon detecting that, in the second area of the data block for the character being processed, the appearance sequential number for the next character of the character or the character string being processed in the input character string is held, that, in the third area of the data block, the code corresponding to the second character string is held as the data in the appearance sequential number, setting the second character string as a character string being processed.

In addition, the number of third areas may be limited to a predetermined number, and the data block may further include a fourth area for holding data representing an extended area for the third area. Thus, a case where the number of data blocks in a lower level is greater can be handled.

Moreover, the aforementioned data structure generation method may further include: (F) generating, from plural data blocks generated for the input character string, correlation data to correlate, for each data block of data blocks in a second layer and subsequent layers of a tree structure represented by the plural data blocks in a specific state, a code for a parent data block of the data block with a character code corresponding to an added character for the data block, wherein the specific state is a state where first codes held in the first area and the third area of the plural data blocks are reassigned to second codes based on order of characters or character strings that correspond to the first codes.

According to this processing, a data structure that can be stored in a disk unit and is favorable for a compression processing and decompression processing (e.g. compression map in the embodiments) can be obtained.

Moreover, in the first correlation data and the second correlation data, a greatest code among codes of child data blocks of the data block may further be correlated. For example, it is possible to enhance the speed of the search processing included in the compression processing.

The aforementioned data structure generation method may further include: (G) setting, as a processing target, each of the first data blocks for the characters that will be used among the plural data blocks generated for the inputted character string in ascending order of the code of the first data blocks; (H) reading an appearance sequential number in the second area of the first data block of the processing target in order of the code of the character, and when a code is held, as data of the appearance sequential number, in the third area of the first data block of the processing target, adding a data block for a code held as data of the appearance sequential number to second data blocks to be processed after the first data blocks, and first storing correlation data to correlate a second code corresponding to a processing ranking of the first data block of the processing target with the code of the character in sequence; (I) setting each of second data blocks to be processed after the first data block in order of addition of the data blocks; (J) reading the appearance sequential number in the second area of a second data block of a processing target in order of the code of the character, and when a code is held as data of the appearance sequential number in the third area of the second data block of the processing target, adding a data block of a code held as data of the appearance sequential number to the second data block to be processed later, and second storing correlation data to correlate a second code corresponding to a processing ranking of the second data block of the processing target with the code of the character in sequence.

Furthermore, the aforementioned data structure generation method may further include (K) storing, for each of the first data blocks for the characters that will be used among plural data blocks generated for the inputted character string, correlation data to correlate data representing a highest-level data block and a code of a character for the first data block in order of the code of the character. In such a case, in the first storing or the second storing, a second code when finally storing the aforementioned correlation data may be stored so as to correlate a code of a character for the first data block of the processing target or a code of a final character in the character string for the second data block of the processing target.

A data structure generation method relating to a second aspect of the embodiments includes: (A) first generating a data block including a first area for holding a code for a character or a character string, a second area for holding, for each character that will be used, an appearance sequential number of a second character that appears next to the character or the character string, and a third area for holding, according to the appearance sequential number, a number of appearances or a code corresponding to a character string including the character or the character string and the second character when the number of appearances exceeds a threshold, for each character that will be used, and each character that appears a predetermined number of times or more next to a character or a character string in an input character string, for which the data block has already been generated; (B) second generating, from plural data blocks generated for the input character string, first correlation data to correlate data representing a root in a tree structure represented by the plural data blocks in a specific state or a greatest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a greatest code among codes of child data blocks of the data block with a character code corresponding to an added character for the data block and a layer number of the data block, wherein the specific state is a state where first codes held in the first area and the third area of the plural data blocks are reassigned to second codes based on order of characters or character strings that correspond to the first codes; (C) third generating first data including, for each data block in each layer of the second layer and the subsequent layers of the tree structure, a code for a character string corresponding to the second code held in the first area of the data block; and (D) fourth generating layer information to correlate, for each layer of the second layer and the subsequent layers of the tree structure, a number of data blocks in the layer with a least second code of the second codes held in the first areas of the data blocks in the layer and an offset value of a position of a character or a character string corresponding to the least second code in the first data from a beginning of the first data.

By using the data generated by this processing, it is possible to enhance the processing speed of the compression processing and decompression processing.

A data structure of a phrase tree, which relates to a third aspect of the embodiments, includes, as data of each node in the phrase tree, a data block including a first area for holding a code for a character or a character string, a second area for holding, for each character that will be used, an appearance sequential number of a second character that appears next to the character or the character string, and a third area for holding, according to the appearance sequential number, a number of appearances or a code corresponding to a character string including the character or the character string and the second character when the number of appearances exceeds a threshold. Thus, it is possible to largely reduce the memory capacity used for the data structure.

A data structure corresponding to a phrase tree, which relates to a fourth aspect of the embodiments, includes, for each node of the phrase tree, correlation data to correlate a code for a parent node of the node with a code for a character, which is represented by the node, wherein the correlation data is arranged in ascending order of a code assigned to the node. When such data is generated, it is possible to store the data structure in the disk unit as it is and use it later.

In the data structure relating to the fourth aspect of the embodiments, the aforementioned correlation data may further correlate a greatest code among codes of child nodes of the node. Thus, it is possible to enhance the processing efficiency of the compression processing.

Moreover, a data structure relating to the fifth aspect of the embodiments includes: first data corresponding to a phrase tree; second data for a character or a character string, which corresponds to each node in the phrase tree; and third data for layers of the phrase tree. The first data includes, for each node of the phrase tree, correlation data to correlate a code for a parent node of the node or a greatest code among codes of child nodes of the node with a code for a character, which is represented by the node, and a layer identifier of a layer to which the node belongs, wherein the correlation data is arranged in order of a code assigned to the node. Moreover, the second data includes, for each node in each layer of a second layer and subsequent layers in the phrase tree, a code for a character or a character string, which corresponds to the node, in order of the code assigned to the node. Furthermore, the third data includes, for each layer of the second layer and the subsequent layers in the phrase tree, a number of nodes belonging to the layer, a least code among codes of nodes belonging to the layer, and an offset value of a position of a character or a character string corresponding to the least code in the second data from a beginning of the second data.

According to this data structure, it is possible to improve the processing speed of the compression processing and decompression processing.

Furthermore, a compression method relating to a sixth aspect of the embodiments includes: (A) first referencing, in a data structure corresponding to a phrase tree, which includes, for each node in the phrase tree, correlation data to correlate a code for a parent node of the node with a code for a character, which is represented by the node, in order of a code assigned to the node, correlation data of a node corresponding to a code for a first character included in an input character string; (B) searching the data structure for correlation data whose code for a parent node is a code assigned to a node corresponding to the referenced correlation data and whose code for a character is a code for a second character that appears next in the input character string; (C) upon detecting that the correlation data is found in the searching, second referencing the found correlation data; (D) upon detecting that the correlation data is not found in the searching, outputting a code for a node of the referenced correlation data, and third referencing correlation data of a node corresponding to the code for the second character; (E) performing the searching, the second referencing and the outputting and third referencing until a final character in the input character string while shifting the second character in the input character string in appearance order of the character in the input character string; and (F) outputting a code for a node of the referenced correlation data after the final character in the input character string was processed.

Thus, it is possible to carry out the compression processing using the aforementioned data structure.

The aforementioned searching in the sixth aspect of the embodiments may include: searching correlation data for nodes in a second layer and subsequent layers in the phase tree, upon detecting that the correlation data for any node in a first layer is referenced; and searching correlation data for codes after the code for the node of the referenced correlation data, upon detecting that correlation data for any node in the second layer and subsequent layers is referenced.

Moreover, the correlation data may further correlate a greatest code among codes for child nodes of the node. In such a case, the aforementioned searching may include: upon detecting that correlation data for any node in a first layer in the phrase tree is referenced, searching a range from correlation data for a first node belonging to a second layer to correlation data for the greatest code in the referenced correlation data; and upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data. Because the search range is narrowed, the speed-up of the compression processing is enabled.

Moreover, the correlation data may further correlate a layer number of a layer to which the node belongs. In such a case, the searching may include: searching correlation data whose layer number is a layer number next to a layer number in the referenced correlation data. Even when the aforementioned configuration is adopted, the search range is narrowed, so it is possible to enhance the speed of the compression processing.

A compression method relating to a seventh aspect of the embodiments includes: (A) first referencing, in first data included in a data structure having the first data corresponding to a phrase tree and second data concerning layers in the phrase tree, correlation data of a node corresponding to a code for a first character included in an input character string, wherein the first data includes, for each node in the phrase tree, correlation data to correlate a code for a parent node of the node with a code for a character, which is represented by the node, and a layer identifier of a layer to which the node belongs, in order of a code assigned to the node, and the second data includes, for each layer of the phrase tree, correlation data to correlate a number of nodes belonging to the layer with a least code among code for nodes belonging to the layer; (B) searching a range in the first data for correlation data whose code for a parent node is a code assigned to a node corresponding to the referenced correlation data and whose code for a character is a code for a second character that appears next in the input character string, wherein the range is identified in the second data based on the number of nodes in a certain layer immediately lower than a layer to which a node corresponding to the referenced correlation data belongs and the least code in the certain layer; (C) upon detecting that the correlation data is found in the searching, second referencing the found correlation data; (D) upon detecting that the correlation data is not found in the searching, outputting a code for a node of the referenced correlation data, and third referencing correlation data of a node corresponding to the code for the second character; (E) performing the searching, the second referencing and the outputting and third referencing until a final character in the input character string while shifting the second character in the input character string in appearance order of the character in the input character string; and (F) outputting a code for a node of the referenced correlation data after the final character in the input character string was processed. Even by such a processing, it is possible to enhance the speed of the compression processing.

Furthermore, a decompression method relating to an eighth aspect of the embodiment includes (A) identifying, in a data structure corresponding to a phrase tree, which includes, for each node in the phrase tree, correlation data to correlate a code for a parent node of the node with a code for a character, which is represented by the node, in order of a code assigned to the node, correlation data ranked by a first code in inputted codes; (B) storing a code for a character, which is included in the identified correlation data, into a memory; (C) upon detecting that a code for a parent node in the identified correlation data represents a code for a node other than a root node in the phrase tree, referencing correlation data for the code for the parent node; (D) upon detecting that a code for a parent node in the identified correlation data represents a root node in the phrase tree, outputting a code or codes for a character or characters, which are stored in the memory, in reverse order; and (E) performing the storing, the referencing and the outputting in sequence for each code after the first code in the inputted codes.

Thus, it is possible to execute a decompression processing using the aforementioned data structure.

A compression method relating to a ninth aspect of the embodiments includes: (A) first referencing, in a data structure corresponding to a phrase tree, which includes, for each node in the phrase tree, correlation data to correlate a greatest code among codes for child nodes of the node with a code for a character, which is represented by the node, in order of a code assigned to the node, correlation data of a node corresponding to a code for a first character included in an input character string; (B) searching the data structure for correlation data whose code for a character, which is represented by a node, is a code for a second character that appears next in the input character string; (C) upon detecting that the correlation data is found in the searching, second referencing the found correlation data; (D) upon detecting that the correlation data is not found in the searching, outputting a code for a node of the referenced correlation data, and third referencing correlation data of a node corresponding to the code for the second character; (E) performing the searching, the second referencing and the outputting and third referencing until a final character in the input character string while shifting the second character in the input character string in appearance order of the character in the input character string; and (F) outputting a code for a node of the referenced correlation data after the final character in the input character string was processed. Then, the aforementioned searching includes: upon detecting that correlation data for any node in a first layer in the phrase tree is referenced, searching a range from correlation data for a first node belonging to a second layer to correlation data for the greatest code in the referenced correlation data; and upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data. Thus, because the search range is narrowed, it is possible to compress a character string at high-speed.

Moreover, a decompression method relating to a tenth aspect of the embodiments includes: (A) first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer in the phrase tree, a character or a character string, which corresponds to the node, in order of the code for the node, and the third data includes, for each layer in the phrase tree, a least code among codes of nodes belonging to the layer, and a offset value of a position of a character or a character string, which corresponds to the least code, in the second data from a beginning of the second data; (B) second identifying the least code and the off set value in the third data based on the layer number included in the identified entry; (C) reading, from the second data, a character or a character string by an amount of the layer number included in the identified entry, from a position obtained by adding a value calculated by multiplying the layer number and a difference between a code for the identified entry and the identified least code to the identified offset value; and (D) performing, for each code after the second code after the first code in the inputted codes, identifying an entry ranked by the code, the second identifying and the reading.

According to this processing, it is possible to enhance the speed of the decompression processing.

In addition, a decompression method relating to a eleventh aspect of the embodiments includes (A) first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer of a second layer and subsequent layers in the phrase tree, a character string, which corresponds to the node, in order of the code for the node, and the third data includes, for each layer of the second layer and subsequent layers in the phrase tree, a least code among codes of nodes belonging to the layer, and a offset value of a position of a character or a character string, which corresponds to the least code, in the second data from a beginning of the second data; (B) upon detecting that the identified entry is an entry in a first layer in the phrase tree, outputting a character corresponding to a code for the identified entry; (C) upon detecting that the identified entry is an entry in any layer of the second layer and the subsequent layers, second identifying, in the third data, the least code and the offset value based on a layer number included in the identified entry; (D) reading, from the second data, a character or a character string by an amount of the layer number included in the identified entry, from a position obtained by adding a value calculated by multiplying the layer number and a difference between a code for the identified entry and the identified least code to the identified offset value; and (E) performing, for each code after the second code after the first code in the inputted codes, identifying an entry ranked by the code, the outputting, the second identifying and the reading.

Even when the data amount of the data structure is reduced as described above, it is possible to enhance the speed of the decompression processing.

Incidentally, it is possible to create a program causing a computer to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

APPENDIX (1) A computer-readable, non-transitory storage medium storing a program for causing a computer to execute a process, the process including:
first generating, for each character that will be used, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold;
upon detecting that, in a second area of a data block for a character or a character string being processed among plural characters included in an input character string, an appearance sequential number for a next character of the character or the character string being processed in the input character string is held, that, in a third area of the data block, the number of appearances is held as data in the appearance sequential number, and that the number of appearances after increment exceeds the threshold, storing a code corresponding to a second character string including the character or the character string being processed and the next character; and
generating a data block for the second character string, which has a same structure as the data block generated in the first generating.

(2) The computer-readable, non-transitory storage medium as set forth in item (1), wherein the process further includes:
upon detecting that, in the second area of the data block for the character or the character string being processed, the appearance sequential number for the next character of the character or the character string being processed in the input character string is held, that, in the third area of the data block, the number of appearances is held as data in the appearance sequential number, and that the number of appearances after the increment does not exceeds the threshold even, setting the next character as a character being processed.

(3) The computer-readable, non-transitory storage medium as set forth in item (2), wherein the process further includes:
upon detecting that, in the second area of the data block for the character being processed, the appearance sequential number for the next character of the character or the character string being processed in the input character string is held, that, in the third area of the data block, the code corresponding to the second character string is held as the data in the appearance sequential number, setting the second character string as a character string being processed.

(4) The computer-readable, non-transitory storage medium as set forth in item (1), wherein the number of third areas are limited to a predetermined number, and the data block further includes a fourth area for holding data representing an extended area for the third area.

(5) The computer-readable, non-transitory storage medium as set forth in item (1), wherein the process further includes:
generating, from plural data blocks generated for the input character string, correlation data to correlate, for each data block of data blocks in a second layer and subsequent layers of a tree structure represented by the plural data blocks in a specific state, a code for a parent data block of the data block with a character code corresponding to an added character for the data block, wherein the specific state is a state where first codes held in the first area and the third area of the plural data blocks are reassigned to second codes based on order of characters or character strings that correspond to the first codes.

(6) The computer-readable, non-transitory storage medium as set forth in item (5), wherein, in the first correlation data and the second correlation data, a greatest code among codes of child data blocks of the data block is further correlated.

(7) A computer-readable, non-transitory storage medium storing a program for causing a computer to execute a process, the process including:
first generating a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold, for each character that will be used, and each character that appears a predetermined number of times or more next to a character or a character string in an input character string, for which the data block has already been generated;
second generating, from plural data blocks generated for the input character string, first correlation data to correlate data representing a root in a tree structure represented by the plural data blocks in a specific state or a greatest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a greatest code among codes of child data blocks of the data block with a character code corresponding to an added character for the data block and a layer number of the data block, wherein the specific state is a state where first codes held in the first area and the third area of the plural data blocks are reassigned to second codes based on order of characters or character strings that correspond to the first codes;

third generating first data including, for each data block in each layer of the second layer and the subsequent layers of the tree structure, a code for a character string corresponding to the second code held in the first area of the data block; and fourth generating layer information to correlate, for each layer of the second layer and the subsequent layers of the tree structure, the number of data blocks in the layer with a least second code of the second codes held in the first areas of the data blocks in the layer and an offset value of a position of a character or a character string corresponding to the least second code in the first data from a beginning of the first data.

(8) A computer-readable, non-transitory storage medium storing a data structure of a phrase tree, which is used by a computer, the data structure including, as data of each node in the phrase tree, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold.

(9) A computer-readable, non-transitory storage medium storing a data structure corresponding to a phrase tree, which is used by a computer, the data structure including for each node of the phrase tree, correlation data to correlate a code for a parent node of the node with a code for a character, which is represented by the node, wherein the correlation data is arranged in ascending order of a code assigned to the node.

(10) The computer-readable, non-transitory storage medium as set forth in claim 9, wherein the correlation data further correlates a greatest code among codes of child nodes of the node.

(11) A computer-readable, non-transitory storage medium storing a data structure, which is used by a computer, the data structure including:
first data corresponding to a phrase tree;
second data for a character or a character string, which corresponds to each node in the phrase tree; and
third data for layers of the phrase tree,
wherein the first data includes, for each node of the phrase tree, correlation data to correlate a code for a parent node of the node or a greatest code among codes of child nodes of the node with a code for a character, which is represented by the node, and a layer identifier of a layer to which the node belongs, wherein the correlation data is arranged in order of a code assigned to the node,
the second data includes, for each node in each layer of a second layer and subsequent layers in the phrase tree, a code for a character or a character string, which corresponds to the node, in order of the code assigned to the node, and
the third data includes, for each layer of the second layer and the subsequent layers in the phrase tree, the number of nodes belonging to the layer, a least code among codes of nodes belonging to the layer, and an offset value of a position of a character or a character string corresponding to the least code in the second data from a beginning of the second data.

(12) A computer-readable, non-transitory storage medium storing a compression program for causing a computer to execute a process, the process including:

first referencing, in a data structure corresponding to a phrase tree, which includes, for each node in the phrase tree, correlation data to correlate a code for a parent node of the node with a code for a character, which is represented by the node, in order of a code assigned to the node, correlation data of a node corresponding to a code for a first character included in an input character string;

searching the data structure for correlation data whose code for a parent node is a code assigned to anode corresponding to the referenced correlation data and whose code for a character is a code for a second character that appears next in the input character string;

upon detecting that the correlation data is found in the searching, second referencing the found correlation data;

upon detecting that the correlation data is not found in the searching, outputting a code for a node of the referenced correlation data, and third referencing correlation data of a node corresponding to the code for the second character;

performing the searching, the second referencing and the outputting and third referencing until a final character in the input character string while shifting the second character in the input character string in appearance order of the character in the input character string; and outputting a code for a node of the referenced correlation data after the final character in the input character string was processed.

(13) The computer-readable, non-transitory storage medium as set forth in item (12), wherein the searching includes:
searching correlation data for nodes in a second layer and subsequent layers in the phase tree, upon detecting that the correlation data for any node in a first layer is referenced; and
searching correlation data for codes after the code for the node of the referenced correlation data, upon detecting that correlation data for any node in the second layer and subsequent layers is referenced.

(14) The computer-readable, non-transitory storage medium as set forth in item (12), wherein the correlation data further correlates a greatest code among codes for child nodes of the node, and
wherein the searching includes:
upon detecting that correlation data for any node in a first layer in the phrase tree is referenced, searching a range from correlation data for a first node belonging to a second layer to correlation data for the greatest code in the referenced correlation data; and
upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data.

(15) The computer-readable, non-transitory storage medium as set forth in item (12), wherein the correlation data further correlates a layer number of a layer to which the node belongs, and
wherein the searching includes:
searching correlation data whose layer number is a layer number next to a layer number in the referenced correlation data.

(16) A computer-readable, non-transitory storage medium storing a compression program for causing a computer to execute a process, the process including:

first referencing, in first data included in a data structure having the first data corresponding to a phrase tree and second data concerning layers in the phrase tree, correlation data of a node corresponding to a code for a first character included in an input character string, wherein the first data includes, for each node in the phrase tree, correlation data to correlate a code for a parent node of the node with a code for a character, which is represented by the node, and a layer identifier of a layer to which the node belongs, in order of a code assigned to the node, and the second data includes, for each layer of the phrase tree, correlation data to correlate the number of nodes belonging to the layer with a least code among code for nodes belonging to the layer;

searching a range in the first data for correlation data whose code for a parent node is a code assigned to a node corresponding to the referenced correlation data and whose code for a character is a code for a second character that appears next in the input character string, wherein the range is identified in the second data based on the number of nodes in a certain layer immediately lower than a layer to which anode corresponding to the referenced correlation data belongs and the least code in the certain layer;

upon detecting that the correlation data is found in the searching, second referencing the found correlation data;

upon detecting that the correlation data is not found in the searching, outputting a code for a node of the referenced correlation data, and third referencing correlation data of anode corresponding to the code for the second character;

performing the searching, the second referencing and the outputting and third referencing until a final character in the input character string while shifting the second character in the input character string in appearance order of the character in the input character string; and outputting a code for a node of the referenced correlation data after the final character in the input character string was processed.

(17) A computer-readable, non-transitory storage medium storing a compression program for causing a computer to execute a process, the process including:

first referencing, in a data structure corresponding to a phrase tree, which includes, for each node in the phrase tree, correlation data to correlate a greatest code among codes for child nodes of the node with a code for a character, which is represented by the node, in order of a code assigned to the node, correlation data of a node corresponding to a code for a first character included in an input character string;

searching the data structure for correlation data whose code for a character, which is represented by a node, is a code for a second character that appears next in the input character string;

upon detecting that the correlation data is found in the searching, second referencing the found correlation data;

upon detecting that the correlation data is not found in the searching, outputting a code for a node of the referenced correlation data, and third referencing correlation data of a node corresponding to the code for the second character;

performing the searching, the second referencing and the outputting and third referencing until a final character in the input character string while shifting the second character in the input character string in appearance order of the character in the input character string; and outputting a code for a node of the referenced correlation data after the final character in the input character string was processed, wherein the searching includes:

upon detecting that correlation data for any node in a first layer in the phrase tree is referenced, searching a range from correlation data for a first node belonging to a second layer to correlation data for the greatest code in the referenced correlation data; and upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data.

(18) A computer-readable, non-transitory storage medium storing a decompression program for causing a computer to execute a process, the process including:

identifying, in a data structure corresponding to a phrase tree, which includes, for each node in the phrase tree, correlation data to correlate a code for a parent node of the node with a code for a character, which is represented by the node, in order of a code assigned to the node, correlation data ranked by a first code in inputted codes;

storing a code for a character, which is included in the identified correlation data, into a memory;

upon detecting that a code for a parent node in the identified correlation data represents a code for a node other than a root node in the phrase tree, referencing correlation data for the code for the parent node;

upon detecting that a code for a parent node in the identified correlation data represents a root node in the phrase tree, outputting a code or codes for a character or characters, which are stored in the memory, in reverse order; and performing the storing, the referencing and the outputting in sequence for each code after the first code in the inputted codes.

(19) A computer-readable, non-transitory storage medium storing a decompression program for causing a computer to execute a process, the process including:

first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer in the phrase tree, a character or a character string, which corresponds to the node, in order of the code for the node, and the third data includes, for each layer in the phrase tree, a least code among codes of nodes belonging to the layer, and a offset value of a position of a character or a character string, which corresponds to the least code, in the second data from a beginning of the second data;

second identifying the least code and the offset value in the third data based on the layer number included in the identified entry;

reading, from the second data, a character or a character string by an amount of the layer number included in the identified entry, from a position obtained by adding a value calculated by multiplying the layer number and a difference between a code for the identified entry and the identified least code to the identified offset value; and performing, for each code after the second code after the first code in the inputted codes, identifying an entry ranked by the code, the second identifying and the reading.

(20) A computer-readable, non-transitory storage medium storing a decompression program for causing a computer to execute a process, the process including:

first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer of a second layer and subsequent layers in the phrase tree, a character string, which corresponds to the node, in order of the code for the node, and the third data includes, for each layer of the second layer and subsequent layers in the phrase tree, a least code among codes of nodes belonging to the layer, and a offset value of a position of a character or a character string, which corresponds to the least code, in the second data from a beginning of the second data;

upon detecting that the identified entry is an entry in a first layer in the phrase tree, outputting a character corresponding to a code for the identified entry;

upon detecting that the identified entry is an entry in any layer of the second layer and the subsequent layers, second identifying, in the third data, the least code and the offset value based on a layer number included in the identified entry;

reading, from the second data, a character or a character string by an amount of the layer number included in the identified entry, from a position obtained by adding a value calculated by multiplying the layer number and a difference between a code for the identified entry and the identified least code to the identified offset value; and performing, for each code after the second code after the first code in the inputted codes, identifying an entry ranked by the code, the outputting, the second identifying and the reading.

(21) An information processing method, including:

first generating, by using a computer, for each character that will be used, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold;

upon detecting that, in a second area of a data block for a character or a character string being processed among plural characters included in an input character string, an appearance sequential number for a next character of the character or the character string being processed in the input character string is held, that, in a third area of the data block, the number of appearances is held as data in the appearance sequential number, and that the number of appearances after increment exceeds the threshold, storing, by using the computer, a code corresponding to a second character string including the character or the character string being processed and the next character; and generating, by using the computer, a data block for the second character string, which has a same structure as the data block generated in the first generating.

(22) An information processing apparatus, including:

a memory; and a processor configured to use the memory and execute a process, the process including:

first generating, for each character that will be used, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold;

upon detecting that, in a second area of a data block for a character or a character string being processed among plural characters included in an input character string, an appearance sequential number for a next character of the character or the character string being processed in the input character string is held, that, in a third area of the data block, the number of appearances is held as data in the appearance sequential number, and that the number of appearances after increment exceeds the threshold, storing a code corresponding to a second character string including the character or the character string being processed and the next character; and generating a data block for the second character string, which has a same structure as the data block generated in the first generating.

(23) An information processing method, including:

first generating, by using a computer, a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold, for each character that will be used, and each character that appears a predetermined number of times or more next to a character or a character string in an input character string, for which the data block has already been generated;

second generating, by using the computer, from plural data blocks generated for the input character string, first correlation data to correlate data representing a root in a tree structure represented by the plural data blocks in a specific state or a greatest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a greatest code among codes of child data blocks of the data block with a character code corresponding to an added character for the data block and a layer number of the data block, wherein the specific state is a state where first codes held in the first area and the third area of the plural data blocks are reassigned to second codes based on order of characters or character strings that correspond to the first codes;

third generating, by using the computer, first data including, for each data block in each layer of the second layer and the subsequent layers of the tree structure, a code for a character string corresponding to the second code held in the first area of the data block; and fourth generating, by using the computer, layer information to correlate, for each layer of the second layer and the subsequent layers of the tree structure, the number of data blocks in the layer with a least second code of the second codes held in the first areas of the data blocks in the layer and an off set value of a position of a character or a character string corresponding to the least second code in the first data from a beginning of the first data.

(24) An information processing apparatus, including:

a memory; and a processor configured to use the memory and executed a process, the process including:

first generating a data block including a first area for holding a code for a character or a character string, a second area for holding, for each character that will be used, an appearance sequential number of a second character that appears next to the character or the character string, and a third area for holding, according to the appearance sequential number, the number of appearances or a code corresponding to a character string including the character or the character string and the second character when the number of appearances exceeds a threshold, for each character that will be used, and each character that appears a predetermined number of times or more next to a character or a character string in an input character string, for which the data block has already been generated;

second generating, from plural data blocks generated for the input character string, first correlation data to correlate data representing a root in a tree structure represented by the plural data blocks in a specific state or a greatest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a greatest code among codes of child data blocks of the data block with a character code corresponding to an added character for the data block and a layer number of the data block, wherein the specific state is a state where first codes held in the first area and the third area of the plurality of data blocks are reassigned to second codes based on order of characters or character strings that correspond to the first codes;

third generating first data including, for each data block in each layer of the second layer and the subsequent layers of the tree structure, a code for a character string corresponding to the second code held in the first area of the data block; and fourth generating layer information to correlate, for each layer of the second layer and the subsequent layers of the tree structure, the number of data blocks in the layer with a least second code of the second codes held in the first areas of the data blocks in the layer and an offset value of a position of a character or a character string corresponding to the least second code in the first data from a beginning of the first data.

(25) A compression method, including:

first referencing, by using a computer, in a data structure corresponding to a phrase tree, which includes, for each node in the phrase tree, correlation data to correlate a code for a parent node of the node with a code for a character, which is represented by the node, in order of a code assigned to the node, correlation data of a node corresponding to a code for a first character included in an input character string;

searching, by using the computer, the data structure for correlation data whose code for a parent node is a code assigned to a node corresponding to the referenced correlation data and whose code for a character is a code for a second character that appears next in the input character string;

upon detecting that the correlation data is found in the searching, second referencing, by using the computer, the found correlation data;

upon detecting that the correlation data is not found in the searching, outputting, by using the computer, a code for a node of the referenced correlation data, and third referencing correlation data of a node corresponding to the code for the second character;

performing, by using the computer, the searching, the second referencing and the outputting and third referencing until a final character in the input character string while shifting the second character in the input character string in appearance order of the character in the input character string; and outputting, by using the computer, a code for a node of the referenced correlation data after the final character in the input character string was processed.

(26) An information processing apparatus, including:

a memory;

a processor configured to use the memory and execute a process, the process including:

first referencing, in a data structure corresponding to a phrase tree, which includes, for each node in the phrase tree, correlation data to correlate a code for a parent node of the node with a code for a character, which is represented by the node, in order of a code assigned to the node, correlation data of a node corresponding to a code for a first character included in an input character string;

searching the data structure for correlation data whose code for a parent node is a code assigned to a node corresponding to the referenced correlation data and whose code for a character is a code for a second character that appears next in the input character string;

upon detecting that the correlation data is found in the searching, second referencing the found correlation data;

upon detecting that the correlation data is not found in the searching, outputting a code for anode of the referenced correlation data, and third referencing correlation data of a node corresponding to the code for the second character;

performing the searching, the second referencing and the outputting and third referencing until a final character in the input character string while shifting the second character in the input character string in appearance order of the character in the input character string; and outputting a code for a node of the referenced correlation data after the final character in the input character string was processed.

(27) A compression method, including:

first referencing, by using a computer, in first data included in a data structure having the first data corresponding to a phrase tree and second data concerning layers in the phrase tree, correlation data of a node corresponding to a code for a first character included in an input character string, wherein the first data includes, for each node in the phrase tree, correlation data to correlate a code for a parent node of the node with a code for a character, which is represented by the node, and a layer identifier of a layer to which the node belongs, in order of a code assigned to the node, and the second data includes, for each layer of the phrase tree, correlation data to correlate the number of nodes belonging to the layer with a least code among code for nodes belonging to the layer;

searching, by using the computer, a range in the first data for correlation data whose code for a parent node is a code assigned to a node corresponding to the referenced correlation data and whose code for a character is a code for a second character that appears next in the input character string, wherein the range is identified in the second data based on the number of nodes in a certain layer immediately lower than a layer to which a node corresponding to the referenced correlation data belongs and the least code in the certain layer;

upon detecting that the correlation data is found in the searching, second referencing, by using the computer, the found correlation data;

upon detecting that the correlation data is not found in the searching, outputting, by using the computer, a code for a node of the referenced correlation data, and third referencing correlation data of a node corresponding to the code for the second character;

performing, by using the computer, the searching, the second referencing and the outputting and third referencing until a final character in the input character string while shifting the second character in the input character string in appearance order of the character in the input character string; and outputting, by using the computer, a code for a node of the referenced correlation data after the final character in the input character string was processed.

(28) An information processing apparatus, including:

a memory;

a processor configured to use the memory and execute a process, the process including:

first referencing, in first data included in a data structure having the first data corresponding to a phrase tree and second data concerning layers in the phrase tree, correlation data of a node corresponding to a code for a first character included in an input character string, wherein the first data includes, for each node in the phrase tree, correlation data to correlate a code for a parent node of the node with a code for a character, which is represented by the node, and a layer identifier of a layer to which the node belongs, in order of a code assigned to the node, and the second data includes, for each layer of the phrase tree, correlation data to correlate the number of nodes belonging to the layer with a least code among code for nodes belonging to the layer;

searching a range in the first data for correlation data whose code for a parent node is a code assigned to a node corresponding to the referenced correlation data and whose code for a character is a code for a second character that appears next in the input character string, wherein the range is identified in the second data based on the number of nodes in a certain layer immediately lower than a layer to which a node corresponding to the referenced correlation data belongs and the least code in the certain layer;

upon detecting that the correlation data is found in the searching, second referencing the found correlation data;

upon detecting that the correlation data is not found in the searching, outputting a code for a node of the referenced correlation data, and third referencing correlation data of a node corresponding to the code for the second character;

performing the searching, the second referencing and the outputting and third referencing until a final character in the input character string while shifting the second character in the input character string in appearance order of the character in the input character string; and outputting a code for a node of the referenced correlation data after the final character in the input character string was processed.

(29) A compression method, including:

first referencing, by using a computer, in a data structure corresponding to a phrase tree, which includes, for each node in the phrase tree, correlation data to correlate a greatest code among codes for child nodes of the node with a code for a character, which is represented by the node, in order of a code assigned to the node, correlation data of a node corresponding to a code for a first character included in an input character string;

searching the data structure for correlation data whose code for a character, which is represented by a node, is a code for a second character that appears next in the input character string;

upon detecting that the correlation data is found in the searching, second referencing, by using the computer, the found correlation data;

upon detecting that the correlation data is not found in the searching, outputting, by using the computer, a code for a node of the referenced correlation data, and third referencing correlation data of a node corresponding to the code for the second character;

performing, by using the computer, the searching, the second referencing and the outputting and third referencing until a final character in the input character string while shifting the second character in the input character string in appearance order of the character in the input character string; and outputting, by using the computer, a code for a node of the referenced correlation data after the final character in the input character string was processed, wherein the searching comprises:

upon detecting that correlation data for any node in a first layer in the phrase tree is referenced, searching a range from correlation data for a first node belonging to a second layer to correlation data for the greatest code in the referenced correlation data; and upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data.

(30) An information processing apparatus, including:
a memory; and
a processor configured to use the memory and execute a process, the process including:
first referencing, in a data structure corresponding to a phrase tree, which includes, for each node in the phrase tree, correlation data to correlate a greatest code among codes for child nodes of the node with a code for a character, which is represented by the node, in order of a code assigned to the node, correlation data of anode corresponding to a code for a first character included in an input character string;
searching the data structure for correlation data whose code for a character, which is represented by a node, is a code for a second character that appears next in the input character string;
upon detecting that the correlation data is found in the searching, second referencing the found correlation data;
upon detecting that the correlation data is not found in the searching, outputting a code for a node of the referenced correlation data, and third referencing correlation data of anode corresponding to the code for the second character;
performing the searching, the second referencing and the outputting and third referencing until a final character in the input character string while shifting the second character in the input character string in appearance order of the character in the input character string; and
outputting a code for anode of the referenced correlation data after the final character in the input character string was processed,
wherein the searching includes:
upon detecting that correlation data for any node in a first layer in the phrase tree is referenced, searching a range from correlation data for a first node belonging to a second layer to correlation data for the greatest code in the referenced correlation data; and
upon detecting that correlation data for any node in the second layer and subsequent layers is referenced, searching a range from correlation data immediately after correlation data for a greatest code in correlation data immediately before the referenced correlation data to correlation data for a greatest code in the referenced correlation data.

(31) A decompression method, including:
identifying, by using a computer, in a data structure corresponding to a phrase tree, which includes, for each node in the phrase tree, correlation data to correlate a code for a parent node of the node with a code for a character, which is represented by the node, in order of a code assigned to the node, correlation data ranked by a first code in inputted codes;
storing, by using the computer, a code for a character, which is included in the identified correlation data, into a memory;
upon detecting that a code for a parent node in the identified correlation data represents a code for a node other than a root node in the phrase tree, referencing, by using the computer, correlation data for the code for the parent node;
upon detecting that a code for a parent node in the identified correlation data represents a root node in the phrase tree,
outputting, by using the computer, a code or codes for a character or characters, which are stored in the memory, in reverse order; and
performing, by using the computer, the storing, the referencing and the outputting in sequence for each code after the first code in the inputted codes.

(32) An information processing apparatus, including:
a memory;
a processor configured to use the memory and execute a process, the process including:
identifying, in a data structure corresponding to a phrase tree, which includes, for each node in the phrase tree, correlation data to correlate a code for a parent node of the node with a code for a character, which is represented by the node, in order of a code assigned to the node, correlation data ranked by a first code in inputted codes;
storing a code for a character, which is included in the identified correlation data, into the memory;
upon detecting that a code for a parent node in the identified correlation data represents a code for a node other than a root node in the phrase tree, referencing correlation data for the code for the parent node;
upon detecting that a code for a parent node in the identified correlation data represents a root node in the phrase tree, outputting a code or codes for a character or characters, which are stored in the memory, in reverse order; and
performing the storing, the referencing and the outputting in sequence for each code after the first code in the inputted codes.

(33) A decompression method, including:
first identifying, by using a computer, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer in the phrase tree, a character or a character string, which corresponds to the node, in order of the code for the node, and the third data includes, for each layer in the phrase tree, a least code among codes of nodes belonging to the layer, and a offset value of a position of a character or a character string, which corresponds to the least code, in the second data from a beginning of the second data;
second identifying, by using the computer, the least code and the offset value in the third data based on the layer number included in the identified entry;
reading, by using the computer, from the second data, a character or a character string by an amount of the layer number included in the identified entry, from a position obtained by adding a value calculated by multiplying the layer number and a difference between a code for the identified entry and the identified least code to the identified offset value; and
performing, by using the computer, for each code after the second code after the first code in the inputted codes, identifying an entry ranked by the code, the second identifying and the reading.

(34) An information processing apparatus, including:
a memory; and
a processor configured to use the memory and execute a process, the process including:

first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer in the phrase tree, a character or a character string, which corresponds to the node, in order of the code for the node, and the third data includes, for each layer in the phrase tree, a least code among codes of nodes belonging to the layer, and a offset value of a position of a character or a character string, which corresponds to the least code, in the second data from a beginning of the second data;

second identifying the least code and the offset value in the third data based on the layer number included in the identified entry;

reading, from the second data, a character or a character string by an amount of the layer number included in the identified entry, from a position obtained by adding a value calculated by multiplying the layer number and a difference between a code for the identified entry and the identified least code to the identified offset value; and performing, for each code after the second code after the first code in the inputted codes, identifying an entry ranked by the code, the second identifying and the reading.

(35) A decompression method, including:

first identifying, by using a computer, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer of a second layer and subsequent layers in the phrase tree, a character string, which corresponds to the node, in order of the code for the node, and the third data includes, for each layer of the second layer and subsequent layers in the phrase tree, a least code among codes of nodes belonging to the layer, and a offset value of a position of a character or a character string, which corresponds to the least code, in the second data from a beginning of the second data;

upon detecting that the identified entry is an entry in a first layer in the phrase tree, outputting, by using the computer, a character corresponding to a code for the identified entry;

upon detecting that the identified entry is an entry in any layer of the second layer and the subsequent layers, second identifying, by using the computer, in the third data, the least code and the offset value based on a layer number included in the identified entry;

reading, by using the computer, from the second data, a character or a character string by an amount of the layer number included in the identified entry, from a position obtained by adding a value calculated by multiplying the layer number and a difference between a code for the identified entry and the identified least code to the identified offset value; and performing, by using the computer, for each code after the second code after the first code in the inputted codes, identifying an entry ranked by the code, the outputting, the second identifying and the reading.

(36) An information processing apparatus, including:

a memory; and a processor configured to use the memory and execute a process, the process including:

first identifying, in first data included in a data structure including the first data corresponding to a phrase tree, second data for a character or a character string, which corresponds to each node in the phrase tree, and third data concerning layers of the phrase tree, an entry ranked by a first code in inputted codes, wherein an entry for each node in the phrase tree is arranged in order of a code for each node, the entry includes a layer number of a layer to which the node belongs, the second data includes, for each node in each layer of a second layer and subsequent layers in the phrase tree, a character string, which corresponds to the node, in order of the code for the node, and the third data includes, for each layer of the second layer and subsequent layers in the phrase tree, a least code among codes of nodes belonging to the layer, and a offset value of a position of a character or a character string, which corresponds to the least code, in the second data from a beginning of the second data;

upon detecting that the identified entry is an entry in a first layer in the phrase tree, outputting a character corresponding to a code for the identified entry;

upon detecting that the identified entry is an entry in any layer of the second layer and the subsequent layers, second identifying, in the third data, the least code and the offset value based on a layer number included in the identified entry;

reading, from the second data, a character or a character string by an amount of the layer number included in the identified entry, from a position obtained by adding a value calculated by multiplying the layer number and a difference between a code for the identified entry and the identified least code to the identified offset value; and performing, for each code after the second code after the first code in the inputted codes, identifying an entry ranked by the code, the outputting, the second identifying and the reading.

What is claimed is:

1. A computer-readable, non-transitory storage medium storing a program for causing a computer to execute a process, the process comprising:

first generating, for each character, a data block including
a first area for holding a code for a character or a first character string,
a second area for holding, for each character, an appearance sequential number of a second character that appears next to the character or the first character string, and
a third area for holding, according to the appearance sequential number, a number of appearances or a code corresponding to a second character string comprising the character or the first character string and the second character when the number of appearances exceeds a threshold;

upon detecting that,
in a second area of a particular data block for a particular character or a first particular character string being processed among a plurality of characters included in an input character string, an appearance sequential number for a next character of the particular character or the first particular character string being processed in the input character string is held, and
in a third area of the particular data block, a particular number of appearances is held as data in the appearance sequential number, and that the particular number of appearances after increment exceeds the threshold,
storing a code corresponding to a second particular character string comprising the particular character or the first particular character string being processed and the next character; and
generating a data block for the second particular character string, which has a same structure as the data block generated in the first generating.

2. The computer-readable, non-transitory storage medium as set forth in claim 1, wherein the process further comprises:
upon detecting that,
in the second area of the particular data block for the particular character or the first particular character string being processed, the appearance sequential number for the next character of the character or the first character string being processed in the input character string is held, and
in the third area of the particular data block, the particular number of appearances is held as the data in the appearance sequential number, and that the particular number of appearances after the increment does not exceed the threshold, and
setting the next character as a character being processed.

3. The computer-readable, non-transitory storage medium as set forth in claim 2, wherein the process further comprises:
upon detecting that,
in the second area of the particular data block for the particular character or the first particular character string being processed, the appearance sequential number for the next character of the particular character or the first particular character string being processed in the input character string is held, and
in the third area of the particular data block, the code corresponding to the second character string is held as the data in the appearance sequential number, setting the second character string as a character string being processed.

4. The computer-readable, non-transitory storage medium as set forth in claim 1, wherein a number of third areas is limited to a predetermined number, and each data block further includes a fourth area for holding data representing an extended area for the third area.

5. The computer-readable, non-transitory storage medium as set forth in claim 1, wherein the process further comprises:
generating, from a plurality of data blocks generated for the input character string, correlation data to correlate, for each data block of data blocks in a second layer and subsequent layers of a tree structure represented by the plurality of data blocks in a specific state, a code for a parent data block of the data block with a character code corresponding to an added character for the data block, wherein
the specific state is a state where first codes held in the first area and the third area of the plurality of data blocks are reassigned to second codes based on order of characters or character strings that correspond to the first codes.

6. The computer-readable, non-transitory storage medium as set forth in claim 5, wherein, in the correlation data, a largest code among codes of child data blocks is further correlated.

7. A computer-readable, non-transitory storage medium storing a program for causing a computer to execute a process, the process comprising:
first generating a data block including
a first area for holding a code for a character or a first character string,
a second area for holding, for each character, an appearance sequential number of a second character that appears next to the character or the first character string, and
a third area for holding, according to the appearance sequential number, a number of appearances or a code corresponding to a second character string comprising the character or the first character string and the second character when the number of appearances exceeds a threshold, for each character, and each character that appears a predetermined number of times or more next to a character or a character string being processes in an input character string, for which a corresponding data block has already been generated;
second generating, from a plurality of data blocks generated for the input character string,
first correlation data to correlate data representing a root in a tree structure represented by the plurality of data blocks in a specific state or a largest code among codes of child data blocks for each data block of data blocks in a first layer in the tree structure with a character code for each data block of the data blocks in the first layer in the tree structure and a layer number of the data block, and
second correlation data to correlate, for each data block of data blocks in a second layer and subsequent layers of the tree structure, a code for a parent data block of the data block or a largest code among codes of child data blocks of the data block with a character code corresponding to an added character for the data block and a layer number of the data block, wherein the specific state is a state where first codes held in the first area and the third area of the plurality of data blocks are reassigned to second codes based on order of characters or character strings that correspond to the first codes;
third generating first data including, for each data block in each layer of the second layer and the subsequent layers of the tree structure, a code for a character string corresponding to a particular second code held in the first area of the data block; and
fourth generating layer information to correlate, for each layer of the second layer and the subsequent layers of the tree structure, a number of data blocks in the layer with a smallest second code of the second codes held in the first areas of the data blocks in the layer and an offset value of a position of a character or a character string corresponding to the smallest second code in the first data from beginning of the first data.

8. A computer-readable, non-transitory storage medium storing a data structure of a phrase tree, which is used by a computer, the data structure comprising, as data of each node in the phrase tree:

a data block, wherein the data block includes,
  a first area for holding a code for a character or a first character string;
  a second area for holding, for each character, an appearance sequential number of a second character that appears next to the character or the first character string; and
  a third area for holding, according to the appearance sequential number, a number of appearances or a code corresponding to a character string comprising the character or the first character string and the second character when the number of appearances exceeds a threshold.

9. A computer-readable, non-transitory storage medium storing a data structure, which is used by a computer, the data structure comprising:
  first data corresponding to a phrase tree;
  second data for a character or a character string, which corresponds to each node in the phrase tree; and
  third data for layers of the phrase tree, wherein
    the first data comprises, for each node of the phrase tree, correlation data to correlate a code for a parent node of the node or a largest code among codes of child nodes of the node with a code for a character, which is represented by the node, and a layer identifier of a layer to which the node belongs, wherein the correlation data is arranged in order of the code assigned to the node,
    the second data includes, for each node in each layer of a second layer and subsequent layers in the phrase tree, a code for a character or a character string, which corresponds to the node, in order of the code assigned to the node, and
    the third data includes, for each layer of the second layer and the subsequent layers in the phrase tree, a number of nodes belonging to the layer, a smallest code among codes of nodes belonging to the layer, and an offset value of a position of a character or a character string corresponding to the smallest code in the second data from beginning of the second data.

10. An information processing method, comprising:
  first generating, by using a computer, for each character, a data block including
    a first area for holding a code for a character or a first character string,
    a second area for holding, for each character, an appearance sequential number of a second character that appears next to the character or the first character string, and
    a third area for holding, according to the appearance sequential number, a number of appearances or a code corresponding to a second character string comprising the character or the first character string and the second character when the number of appearances exceeds a threshold;
  upon detecting that,
    in a second area of a particular data block for a particular character or a first particular character string being processed among a plurality of characters included in an input character string, an appearance sequential number for a next character of the particular character or the first particular character string being processed in the input character string is held, and
    in a third area of the particular data block, a number of appearances is held as data in the appearance sequential number, and that the number of appearances after increment exceeds the threshold,
  storing, by using the computer, a code corresponding to a second particular character string comprising the particular character or the first particular character string being processed and the next character; and
  generating, by using the computer, a data block for the second particular character string, which has a same structure as the data block generated in the first generating.

11. An information processing apparatus, comprising:
  a memory; and
  a processor configured to use the memory and execute a process, the process comprising:
  first generating, for each character, a data block including
    a first area for holding a code for a character or a first character string,
    a second area for holding, for each character, an appearance sequential number of a second character that appears next to the character or the first character string, and
    a third area for holding, according to the appearance sequential number, a number of appearances or a code corresponding to a second character string comprising the character or the first character string and the second character when the number of appearances exceeds a threshold;
  upon detecting that,
    in a second area of a particular data block for a particular character or a first particular character string being processed among a plurality of characters included in an input character string, an appearance sequential number for a next character of the particular character or the first particular character string being processed in the input character string is held, and
    in a third area of the data block, a number of appearances is held as data in the appearance sequential number, and that the number of appearances after increment exceeds the threshold,
  storing a code corresponding to a second particular character string comprising the particular character or the first particular character string being processed and the next character; and
  generating a data block for the second particular character string, which has a same structure as the data block generated in the first generating.

12. An information processing method, including:
  first generating, by using a computer, a data block including
    a first area for holding a code for a character or a first character string,
    a second area for holding, for each character, an appearance sequential number of a second character that appears next to the character or the first character string, and
    a third area for holding, according to the appearance sequential number, a number of appearances or a code corresponding to a second character string including the character or the first character string and the second character when the number of appearances exceeds a threshold, for each character, and each character that appears a predetermined number of times or more next to a character or a character string being processes in an input character string, for which a corresponding data block has already been generated;
  second generating, by using the computer, from plural data blocks generated for the input character string,
    first correlation data to correlate data representing a root in a tree structure represented by the plural data blocks in a specific state or a largest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a largest code among codes of child data blocks of the data block with a character code corresponding to an added character for the data block and a layer number of the data block, wherein the specific state is a state where first codes held in the first area and the third area of the plural data blocks are reassigned to second codes based on order of characters or character strings that correspond to the first codes;

third generating, by using the computer, first data including, for each data block in each layer of the second layer and the subsequent layers of the tree structure, a code for a character string corresponding to a particular second code held in the first area of the data block; and fourth generating, by using the computer, layer information to correlate, for each layer of the second layer and the subsequent layers of the tree structure, a number of data blocks in the layer with a smallest second code of the second codes held in the first areas of the data blocks in the layer and an offset value of a position of a character or a character string corresponding to the smallest second code in the first data from beginning of the first data.

13. An information processing apparatus, including:

a memory; and a processor configured to use the memory and executed a process, the process including:

first generating a data block including a first area for holding a code for a character or a first character string, a second area for holding, for each character, an appearance sequential number of a second character that appears next to the character or the first character string, and a third area for holding, according to the appearance sequential number, the number of appearances or a code corresponding to a second character string including the character or the first character string and the second character when the number of appearances exceeds a threshold, for each character, and each character that appears a predetermined number of times or more next to a character or a character string being processes in an input character string, for which a corresponding data block has already been generated;

second generating, from plural data blocks generated for the input character string, first correlation data to correlate data representing a root in a tree structure represented by the plural data blocks in a specific state or a largest code among codes of child data blocks for each data block of data blocks in a first layer in the tree structure with a character code for each data block of the data blocks in the first layer in the tree structure and a layer number of the data block, and second correlation data to correlate, for each data block of data blocks in a second layer and subsequent layers of the tree structure, a code for a parent data block of the data block or a largest code among codes of child data blocks of the data block with a character code corresponding to an added character for the data block and a layer number of the data block, wherein the specific state is a state where first codes held in the first area and the third area of the plurality of data blocks are reassigned to second codes based on order of characters or character strings that correspond to the first codes;

third generating first data including, for each data block in each layer of the second layer and the subsequent layers of the tree structure, a code for a character string corresponding to a particular second code held in the first area of the data block; and fourth generating layer information to correlate, for each layer of the second layer and the subsequent layers of the tree structure, a number of the data blocks in the layer with a smallest second code of the second codes held in the first areas of the data blocks in the layer and an offset value of a position of a character or a character string corresponding to the smallest second code in the first data from beginning of the first data.

\* \* \* \* \*